(12) United States Patent
Shimizu et al.

(10) Patent No.: US 11,666,864 B2
(45) Date of Patent: Jun. 6, 2023

(54) FILTERING DEVICE, PURIFICATION DEVICE, AND METHOD FOR MANUFACTURING CHEMICAL LIQUID

(71) Applicant: FUJIFILM Corporation, Tokyo (JP)

(72) Inventors: Tetsuya Shimizu, Haibara-gun (JP); Tetsuya Kamimura, Haibara-gun (JP); Tadashi Omatsu, Haibara-gun (JP); Satomi Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 27 days.

(21) Appl. No.: 16/991,225

(22) Filed: Aug. 12, 2020

(65) Prior Publication Data

US 2020/0368692 A1 Nov. 26, 2020

Related U.S. Application Data

(63) Continuation of application No. PCT/JP2019/009500, filed on Mar. 8, 2019.

(30) Foreign Application Priority Data

Mar. 22, 2018 (JP) .............................. JP2018-054993

(51) Int. Cl.
*B01D 61/58* (2006.01)
*B01D 3/14* (2006.01)
(Continued)

(52) U.S. Cl.
CPC .............. *B01D 61/58* (2013.01); *B01D 3/145* (2013.01); *B01D 61/08* (2013.01); *B01D 61/18* (2013.01);
(Continued)

(58) Field of Classification Search
CPC ........ B01D 61/58; B01D 3/145; B01D 61/08; B01D 61/18; B01D 65/02; B01D 69/02;
(Continued)

(56) References Cited

U.S. PATENT DOCUMENTS

2006/0021944 A1\* 2/2006 Carson ..................... B01J 49/85
 210/673
2017/0028359 A1 2/2017 Singh et al.
(Continued)

FOREIGN PATENT DOCUMENTS

JP 2003-251120 A 9/2003
JP 2013-218308 A 10/2013
(Continued)

OTHER PUBLICATIONS

International Search Report dated May 28, 2019, issued by the International Searching Authority in application No. PCT/JP2019/009500.
(Continued)

*Primary Examiner* — Krishnan S Menon
(74) *Attorney, Agent, or Firm* — Sughrue Mion, PLLC

(57) ABSTRACT

A filtering device is for obtaining a chemical liquid by purifying a liquid to be purified, and has an inlet portion, an outlet portion, a filter A, at least one filter B different from the filter A, and a flow path which includes the filter A and the filter B arranged in series between the inlet portion and the outlet portion and extends from the inlet portion to the outlet portion, in which the filter A includes at least one kind of porous membrane selected from the group consisting of a first porous membrane having a porous base material made of polytetrafluoroethylene and a non-crosslinked coating which is formed to cover the porous base material and contains a perfluorosulfonic acid polymer and a second porous membrane containing polytetrafluoroethylene blended with a perfluorosulfonic acid polymer.

6 Claims, 17 Drawing Sheets

(51) Int. Cl.
*B01D 61/08* (2006.01)
*B01D 61/18* (2006.01)
*B01D 65/02* (2006.01)
*B01D 69/02* (2006.01)
*B01D 69/12* (2006.01)
*B01D 71/26* (2006.01)
*B01D 71/36* (2006.01)
*B01D 71/56* (2006.01)
*H01L 21/67* (2006.01)
*G03F 7/26* (2006.01)

(52) U.S. Cl.
CPC ............ *B01D 65/02* (2013.01); *B01D 69/02* (2013.01); *B01D 69/12* (2013.01); *B01D 71/26* (2013.01); *B01D 71/36* (2013.01); *B01D 71/56* (2013.01); *H01L 21/67017* (2013.01); *B01D 2311/25* (2013.01); *B01D 2311/2669* (2013.01); *B01D 2313/50* (2013.01); *B01D 2317/025* (2013.01); *B01D 2317/08* (2013.01); *B01D 2325/02* (2013.01); *B01D 2325/14* (2013.01); *B01D 2325/16* (2013.01); *G03F 7/26* (2013.01)

(58) Field of Classification Search
CPC ........ B01D 69/12; B01D 71/26; B01D 71/36; B01D 71/56; B01D 2311/25; B01D 2311/2669; B01D 2313/50; B01D 2317/025; B01D 2317/08; B01D 2325/02; B01D 2325/14; B01D 2325/16; B01D 2311/04; B01D 2325/42; B01D 61/022; B01D 61/027; B01D 61/142; B01D 71/82; B01D 61/145; B01D 67/0088; B01D 71/32; B01D 69/10; B01D 71/28; B01D 71/40; B01D 71/68; H01L 21/67017; G03F 7/26; G03F 7/16; G03F 7/30; G03F 7/422
See application file for complete search history.

(56) References Cited

U.S. PATENT DOCUMENTS

2017/0028361 A1 2/2017 Sitterer et al.
2019/0060782 A1 2/2019 Shimizu et al.

FOREIGN PATENT DOCUMENTS

| JP | 2016-073922 A | 5/2016 |
| JP | 2017-029975 A | 2/2017 |
| JP | 2017-039117 A | 2/2017 |
| KR | 10-2017-0015118 A | 2/2017 |
| TW | 201704306 A | 2/2017 |
| TW | 201704326 A | 2/2017 |
| TW | 201739493 A | 11/2017 |
| WO | 2017/188209 A1 | 11/2017 |
| WO | 2018/043697 A1 | 3/2018 |

OTHER PUBLICATIONS

Written Opinion dated May 28, 2019, issued by the International Searching Authority in application No. PCT/JP2019/009500.
International Preliminary Report on Patentability dated Sep. 22, 2020, issued by the International Bureau in application No. PCT/JP2019/009500.
Communication dated Sep. 14, 2021, from Japanese Patent Office in application No. 2020-508204.
Notification of Reason for Refusal dated Nov. 22, 2021 from the Korean Patent Office in Korean Application No. 10-2020-7024464.
Communication dated Jul. 4, 2022 from the Taiwanese Patent Office in Japanese Application No. 108108520.
Notice of Final Rejection dated May 23, 2022 from the Korean Patent Office in Korean Application No. 10-2020-7024464.
Communication dated Mar. 3, 2023 from the Taiwanese Patent Office in Japanese Application No. 108108520.
Communication dated Mar. 3, 2023 from the Taiwanese Patent Office in Taiwanese Application No. 108108520.

\* cited by examiner

FILTERING DEVICE, PURIFICATION DEVICE, AND METHOD FOR MANUFACTURING CHEMICAL LIQUID

CROSS-REFERENCE TO RELATED APPLICATIONS

This application is a Continuation of PCT International Application No. PCT/JP2019/009500 filed on Mar. 8, 2019, which claims priority under 35 U.S.C. § 119(a) to Japanese Patent Application No. 2018-054993 filed on Mar. 22, 2018. Each of the above application(s) is hereby expressly incorporated by reference, in its entirety, into the present application.

BACKGROUND OF THE INVENTION

1. Field of the Invention

The present invention relates to a filtering device, a purification device, and a method for manufacturing a chemical liquid.

2. Description of the Related Art

In a case where semiconductor devices are manufactured by a wiring forming process including photolithography, as a prewet solution, a resist solution (resist composition), a developer, a rinsing solution, a peeling solution, a chemical mechanical polishing (CMP) slurry, a post-CMP washing solution or the like or as a diluted solution of these, a chemical liquid containing water and/or an organic solvent is used.

In recent years, as photolithography techniques have become advanced, patterns have been further miniaturized. The chemical liquid used in such a wiring forming process is required to have further improved defect inhibition performance. Generally, such a chemical liquid is considered to be obtained by purifying a liquid to be purified, which contains requisite components for the chemical liquid as main components, by using a filter or the like so as to remove impurities and the like.

As a filter that can be used for purifying such a chemical liquid, JP2017-029975A describes "a porous PTFE membrane including a porous polytetrafluoroethylene PTFE base material having a non-crosslinked coating including a perfluorosulfonic acid polymer", and JP2017-039117A describes "polytetrafluoroethylene (porous membrane) blended with a perfluorosulfonic acid polymer".

SUMMARY OF THE INVENTION

The inventors of the present invention obtained a chemical liquid by purifying a liquid to be purified by using the aforementioned filter and evaluated the defect inhibition performance of the chemical liquid. As a result, the inventors have found that sometimes a sufficient defect inhibition performance is not obtained. Therefore, an object of the present invention is to provide a filtering device capable of manufacturing a chemical liquid having excellent defect inhibition performance. Another object of the present invention is to provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, among the chemical liquids obtained by purifying an organic solvent-based liquid to be purified that will be described later, for a chemical liquid which substantially does not contain a resin (typically, a chemical liquid used for forming a resist film, such as a prewet solution, a developer, or a rinsing solution), the residue defect inhibition performance described in [Test Example 1] in Examples, which will be described later, is regarded as "defect inhibition performance". Furthermore, for a resist resin composition which contains a resin and is used for forming a resist film, the scum defect inhibition performance described in [Test Example 3] in Examples, which will be described later, is regarded as "defect inhibition performance". Furthermore, for a chemical liquid obtained by purifying an aqueous liquid to be purified that will be described later (typically, a chemical liquid used as an etching solution, a resist peeling solution, a developer, or the like), the ratio of the number of metal residue defects to the number of residue defects (metal defect ratio) described in [Test Example 2] in Examples, which will be described later, is regarded as being in a predetermined range.

Hereinafter, in a case where a characteristic is simply referred to as "defect inhibition performance", this means the defect inhibition performance (residue defect inhibition performance, scum defect inhibition performance, or metal defect ratio) corresponding to the type of the chemical liquid.

In order to achieve the aforementioned objects, the inventors of the present invention carried out intensive examinations. As a result, the inventors have found that the objects are achieved by the following constitution.

[1] A filtering device for obtaining a chemical liquid by purifying a liquid to be purified, the filtering device having an inlet portion, an outlet portion, a filter A, at least one filter B different from the filter A, and a flow path which includes the filter A and the filter B arranged in series between the inlet portion and the outlet portion and extends from the inlet portion to the outlet portion, in which the filter A includes at least one selected from the group consisting of a first porous membrane having a porous base material made of polytetrafluoroethylene and a non-crosslinked coating which is formed to cover the porous base material and contains a perfluorosulfonic acid polymer and a second porous membrane containing polytetrafluoroethylene blended with a perfluorosulfonic acid polymer.

[2] The filtering device described in [1], in which the filter B includes at least one filter BD disposed on a downstream side of the filter A on the flow path.

[3] The filtering device described in [2], in which at least one filter BD has a pore size equal to or smaller than 20 nm.

[4] The filtering device described in [2] or [3], in which at least one filter BD contains at least one selected from the group consisting of polyolefin, polyamide, polyfluorocarbon, polystyrene, polysulfone, and polyethersulfone.

[5] The filtering device described in any one of [2] to [4], in which a filter BD disposed on a downmost stream side on the flow path has a pore size equal to or smaller than 10 nm and contains at least one selected from the group consisting of polytetrafluoroethylene, polyethylene, and nylon.

[6] The filtering device described in any one of [2] to [5], further having a return flow path capable of returning the liquid to be purified to an upstream side of a reference filter from a downstream side of the reference filter, in which the reference filter consists of any of the at least one of the filters BD.

[7] The filtering device described in any one of [1] to [6], in which the filter B includes at least one filter BU disposed on an upstream side of the filter A on the flow path.

[8] The filtering device described in [7], in which at least one filter BU has a pore size equal to or greater than 10 nm.

[9] The filtering device described in [7] or [8], in which at least one filter BU has a pore size equal to or greater than 20 nm.

[10] The filtering device described in any one of [7] to [9], in which the filter BU contains a resin having an ion exchange group.

[11] The filtering device described in [10], in which the ion exchange group includes an anion exchange group.

[12] The filtering device described in any one of [1] to [11], further having a tank arranged in series with the filter A on the flow path.

[13] The filtering device described in [12], further having a filter C having a pore size equal to or greater than 10 nm that is arranged in series with the tank on an upstream side of the tank in the flow path.

[14] The filtering device described in [12], further having a filter C which is arranged in series with the tank on the upstream side of the tank in the flow path and has a pore size equal to or greater than 20 nm.

[15] The filtering device described in any one of [1] to [14], further having a return flow path capable of returning the liquid to be purified to an upstream side of the filter A from a downstream side of the filter A on the flow path.

[16] The filtering device described in any one of [1] to [15], in which a pH of the liquid to be purified is 0 to 9.

[17] The filtering device described in any one of [1] to [16], in which the chemical liquid is at least one selected from the group consisting of a washing solution, an etching solution, a rinsing solution, a pre-treatment solution, and a resist solution.

[18] The filtering device described in any one of [1] to [17], in which a critical wetting surface tension of the filter A is equal to or higher than $27 \times 10^{-5}$ N/cm.

[19] The filtering device described in any one of [1] to [18], in which a critical wetting surface tension of the filter A is equal to or higher than $30 \times 10^{-5}$ N/cm.

[20] A filtering device for manufacturing a chemical liquid for manufacturing a semiconductor substrate by purifying a liquid to be purified, the filtering device having an inlet portion, an outlet portion, a filter A, at least one filter B different from the filter A, and a flow path which includes the filter A and the filter B arranged in series between the inlet portion and the outlet portion and extends from the inlet portion to the outlet portion, in which the filter A includes at least one selected from the group consisting of a first porous membrane having a porous base material made of polytetrafluoroethylene and a non-crosslinked coating which is formed to cover at least a portion of the base material and contains a perfluorosulfonic acid polymer and a second porous membrane containing polytetrafluoroethylene blended with a perfluorosulfonic acid polymer.

[21] A purification device having the filtering device described in any one of [1] to [20] and at least one distiller connected to the inlet portion of the filtering device.

[22] The purification device described in [21], in which at least one distiller includes a plurality of distillers connected in series.

[23] A method for manufacturing a chemical liquid that is for obtaining a chemical liquid by purifying a liquid to be purified, the method having a filtration step of purifying the liquid to be purified by using the filtering device described in any one of [1] to [20] so as to obtain a chemical liquid.

[24] The method for manufacturing a chemical liquid described in [23], further having a filter washing step of washing the filter A and the filter B before the filtration step.

[25] The method for manufacturing a chemical liquid described in [23] or [24], further having a device washing step of washing a liquid contact portion of the filtering device before the filtration step.

[26] A method for manufacturing a chemical liquid that is for obtaining a chemical liquid by purifying a liquid to be purified, the method including a step of filtering the liquid to be purified by using a filter A and a filter B different from the filter A so as to obtain a chemical liquid, in which the filter A includes at least one selected from the group consisting of a first porous membrane having a porous base material made of polytetrafluoroethylene and a non-crosslinked coating which is formed to cover at least a portion of the base material and contains a perfluorosulfonic acid polymer and a second porous membrane containing polytetrafluoroethylene blended with a perfluorosulfonic acid polymer.

According to the present invention, it is possible to provide a filtering device capable of manufacturing a chemical liquid having excellent defect inhibition performance. Furthermore, the present invention can also provide a purification device and a method for manufacturing a chemical liquid.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values described before and after "to" as a lower limit and an upper limit respectively.

[Filtering Device]

The filtering device according to an embodiment of the present invention has an inlet portion, an outlet portion, a filter A, at least one filter B different from the filter A, and a flow path (path through which a liquid to be purified flows) which includes the filter A and the filter B arranged in series between the inlet portion and the outlet portion and extends from the inlet portion to the outlet portion (in other words, the filtering device has a flow path which includes a filter A and at least one filter B different from the filter A arranged in series between an inlet portion and an outlet portion and extends from the inlet portion to the outlet portion), in which the filter A is at least one selected from the group consisting of a first porous membrane and a second porous membrane that will be described later. The filtering device has a flow path extending from the inlet portion to the outlet portion, in which the filter A and at least one filter B different from the filter A are arranged in series between the inlet portion and the outlet portion. In the filtering device according to the embodiment of the present invention, because the filter A and the filter B are arranged in series on the flow path, the liquid to be purified is sequentially filtered through the filter A and the filter B (or the filter B and the filter A). Hereinafter, a filtering device according to an embodiment of the present invention will be described. In the following section, a filtering device for a dead-end filtration method that filters the entirety of a liquid to be purified introduced into a filter by using the filter will be described for example. However, the filtering device according to the embodiment of the present invention is not limited thereto, and may be a filtering device for a cross-flow method that divides the introduced liquid to be purified into a liquid to be purified having undergone purification and a concentrate (sometimes the concentrate is introduced again into a filter as a liquid to be purified) or may be a filtering device for a method as a combination of the dead-end filtration method and the cross-flow method. Hereinafter, embodiments of the filtering device will be described using drawings.

First Embodiment

Figure 1:
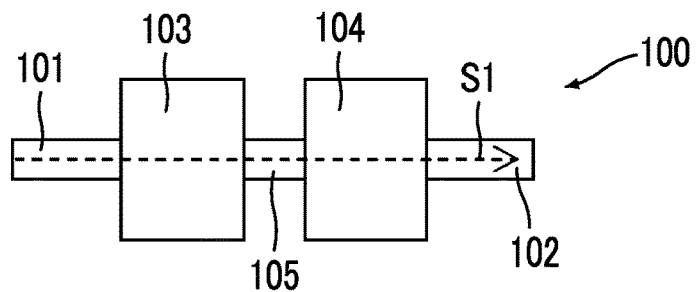
FIG. 1 is a schematic view illustrating a filtering device according to a first embodiment of the present invention.

FIG. 1 is a schematic view illustrating a filtering device according to a first embodiment of the present invention.

A filtering device 100 is a filtering device in which a filter 103 as a filter A and a filter 104 (filter BD) different from the filter 103 are arranged in series through a piping 105 between the inlet portion 101 and the outlet portion 102.

The inlet portion 101, the filter 103, the piping 105, the filter 104, and the outlet portion 102 are constituted such that a liquid to be purified can flow in the interior of each of these members. These members are connected to one another and form a flow path S1 (path through which the liquid to be purified flows).

The shape of the inlet portion 101 and the outlet portion 102 is not particularly limited as long as the liquid to be purified can be introduced into and discharged from the filtering device. Typically, examples thereof include a hollow cylindrical piping (inlet piping and outlet piping) having an inlet port and an outlet port. Hereinafter, an embodiment in which each of the outlet portion and the inlet portion is a piping will be described for example. The shapes of the inlet portion 101, the piping 105, and the outlet portion 102 are not particularly limited. Typically, examples thereof include a hollow cylinder shape in which the liquid to be purified can flow in these members. Although the material component of these is not particularly limited, it is preferable that a liquid contact portion (a portion that is likely to contact the liquid to be purified in a case where the liquid to be purified is filtered) thereof is formed of an anticorrosive material which will be described later.

The liquid to be purified introduced from the inlet portion 101 of the filtering device 100 flows in the filtering device 100 along the flow path S1. In the meantime, the liquid to be purified is sequentially filtered through the filter 103 (filter A) and the filter 104 (filter BD) and then discharged out of the filtering device 100 from the outlet portion 102. The form of the liquid to be purified will be described later.

For the purpose of allowing the liquid to be purified to flow, the filtering device 100 may have a pump, a damper, a valve, and the like, which are not shown in the drawing, on the flow path S1 (for example, in the inlet portion 101, the piping 105, the outlet portion 102, and the like).

The shape of the filter 103 (filter A) and the filter 104 (filter B) is not particularly limited. For example, the filter A and the filter B have a flat shape, a pleated shape, a spiral shape, a hollow cylindrical shape, and the like. Particularly, in view of further improving handleability, typically, the filter A and the filter B are preferably in the form of a cartridge filter having a core, which is formed of a material permeable to the liquid to be purified and/or has a structure permeable to the liquid to be purified, and a filter which is disposed on the core in a state of being wound around the core. In this case, although the material of the core is not particularly limited, it is preferable that the core is formed of the anticorrosive material which will be described later.

The method of arranging the filters is not particularly limited. Typically, it is preferable to arrange the filters in a housing not shown in the drawing that has at least one entrance, at least one exit, and at least one flow path formed between the entrance and the exit. In this case, the filters are arranged to cross the flow path in the housing. The flow path formed in the housing forms a portion of the flow path S1. While flowing through the flow path S1, the liquid to be purified is filtered through the filters that are arranged to cross the flow path S1.

The material of the housing is not particularly limited. Examples thereof include any appropriate hard and impermeable materials including impermeable thermoplastic materials compatible with the liquid to be purified. For example, the housing can be prepared from a metal such as stainless steel or a polymer. In an embodiment, the housing is a polymer such as polyacrylate, polypropylene, polystyrene, or polycarbonate.

Furthermore, in view of obtaining a filtering device having further improved effects of the present invention, at least a portion of a liquid contact portion of the housing, which is preferably 90% and more preferably 99% of the surface area of the liquid contact portion, is preferably formed of the anticorrosive material which will be described later. In the present specification, the liquid contact portion means a portion which is likely to contact the liquid to be purified (here, the filter is not included in the liquid contact portion), and means the inner wall of a unit such as the housing and the like.

<Filter A>

The filter A has at least one kind of membrane selected from the group consisting of a first porous membrane and a second porous membrane that will be described later.

(First Porous Membrane)

The first porous membrane has a porous base material made of polytetrafluoroethylene (PTFE) and a non-crosslinked coating which is formed to cover the porous base material and contains a perfluorosulfonic acid (PFSA) polymer. The porous base material included in the first porous membrane may have a region that is not covered with the non-crosslinked coating. However, it is preferable that the entire surface of the porous base material (including the surface of pores communicating with one another from the outermost surface of the porous membrane) is covered with the non-crosslinked coating.

As the porous base material made of polytetrafluoroethylene, the products commercially available as porous base materials made of PTFE and the like can be appropriately used without particular limitation.

The method for manufacturing the first porous membrane is not particularly limited. Typically, it is preferable to use a method of coating the porous base material made of PTFE with a polymer dispersion containing a perfluorosulfonic acid (PFSA) polymer so as to form a non-crosslinked coating (layer).

The PFSA polymer dispersion for forming the aforementioned coating (layer) is not particularly limited, and may be available from Solvay Specialty Polymers LLC. (Borger, Tex.) as AQUIVION (registered trademark) PFSA (for example, AQUIVION PFSA D83-24B, AQUIVION PFSA D83-06A, and Aquivion PFSA D79-20BS), which is based on a copolymer of tetrafluoroethylene and a short side chain (SSC) of sulfonyl fluoride vinyl ether (SFVE) $F_2C=CF-O-CF_2-CF_2-SO_2F$. The ionomer dispersion contains a sulfonic acid form thereof. As the PFSA polymer dispersion, DuPont (registered trademark) Nafion (registered trademark) PFSA polymer dispersion is also preferable.

In a case where the coating is formed, the content of PFSA in the coating solution can be appropriately adjusted. Generally, the content with respect to the total mass of the coating solution is preferably in a range of 0.1% to 3% by mass, and more preferably in a range of 0.12% to 2.2% by mass.

The method of forming the coating on the base material is not particularly limited, and examples thereof include a method of immersing the base material in the coating solution, a method of spraying the coating solution on the base material, and the like.

The pore size of the first porous membrane is not particularly limited. Generally, the pore size of the first porous membrane is preferably 1 to 200 nm, and more preferably 10 to 20 nm.

In the present specification, "pore size" means a pore size determined by the bubble point of isopropanol (IPA) or HFE-7200 ("NOVEC 7200", manufactured by 3M, hydrofluoroether, $C_4F_9OC_2H_5$).

The thickness of the coating (layer) is not particularly limited. Generally, the thickness of the coating is preferably 5 to 127 μm, and more preferably 13 to 25 μm.

The critical wetting surface tension (for example, critical wetting surface tension (CWST) defined in U.S. Pat. No. 4,925,572A) of the first porous membrane (filter A) is not particularly limited. CWST can be measured using a set of solutions of having a certain composition. Each solution has a specific surface tension. The surface tension of these solutions is in a range of $25 \times 10^{-5}$ to $92 \times 10^{-5}$ N/cm with small unequal increments. In order to measure the surface tension of the first porous membrane, the first porous membrane is placed on a white light table, a drop of solution having a certain surface tension is applied to the surface of the membrane, and the time taken for the solution droplet to penetrate and pass through the first porous membrane and then turns bright white showing that light has passed through the membrane is recorded. In a case where the time taken for the solution droplet to pass through the membrane is equal to or shorter than 10 seconds, it is considered that the solution instantaneously wets the membrane. In a case where the time is longer than 10 seconds, it is considered that the solution partially wets the first porous membrane. CWST can be selected by the methods known in the related art or selected as disclosed in U.S. Pat. Nos. 5,152,905A, 5,443,743A, 5,472,621A, and 6,074,869A.

Generally, the critical wetting surface tension of the first porous membrane is preferably equal to or higher than $27 \times 10^{-5}$ N/cm. As a result of intensive examinations, the inventors of the present invention have found that sometimes the defect inhibition performance of the obtained chemical liquid is affected by the correlation between the physical properties of the liquid to be purified and the critical wetting surface tension of the first porous membrane. In other words, the inventors have found that in a case where the critical wetting surface tension of the first porous membrane (filter A) is controlled according to the type of the liquid to be purified, a chemical liquid having further improved defect inhibition performance is obtained.

Specifically, in a case where the critical wetting surface tension is equal to or higher than $27 \times 10^{-5}$ N/cm, metal impurities and the like contained in the liquid to be purified can be more efficiently removed, and thus a chemical liquid having further improved defect inhibition performance is obtained. In this respect, the critical wetting surface tension is more preferably equal to or higher than $30\times10^{-5}$ N/cm, and even more preferably equal to or higher than $33\times10^{-5}$ N/cm.

Meanwhile, in the relationship with the surface tension of the liquid to be purified, the smaller the absolute value of the difference between the critical wetting surface tension of the first porous membrane and the surface tension of the liquid to be purified, the easier it is for the first porous membrane to be wet with the liquid to be purified, and consequently, a chemical liquid having excellent defect inhibition performance is easily obtained.

For example, in order for the surface tension of isopropyl alcohol to be 20.8 (25° C.)$\times10^{-5}$ N/cm, the surface tension of the organic solvent is generally about $15\times10^{-5}$ to $35\times10^{-5}$ N/cm in many cases. In a case where the liquid to be purified contains an organic solvent (in a case where the liquid to be purified is an organic solvent-based liquid to be purified which will be described later or the like), from the viewpoint of further reducing the difference with the surface tension of the liquid to be purified, the critical wetting surface tension of the first porous membrane is preferably equal to or lower than $40\times10^{-5}$ N/cm in general.

In a case where the surface tension of the liquid to be purified is higher (for example, in a case where the liquid to be purified is "aqueous liquid to be purified", which will be described later, containing water or the like), as another embodiment, an embodiment is also preferable in which the critical wetting surface tension of the first porous membrane is higher than $40\times10^{-5}$ N/cm.

The critical wetting surface tension of the first porous membrane can be adjusted by the content of the perfluorosulfonic acid polymer in the non-crosslinked coating containing the perfluorosulfonic acid polymer. Specifically, in a case where the content of the perfluorosulfonic acid polymer in the non-crosslinked coating is increased, it is easy to obtain the first porous membrane having a higher critical wetting surface tension, and in a case where the content of the perfluorosulfonic acid polymer in the non-crosslinked coating is reduced, it is easy to obtain the first porous membrane having a lower critical wetting surface tension.

(Second Porous Membrane)

The second porous membrane is a porous membrane containing polytetrafluoroethylene blended with a perfluorosulfonic acid polymer.

As PTFE, known PTFE can be used without particular limitation.

PFSA to be blended with PTFE is not particularly limited, and may be available from, for example, Solvay Specialty Polymers LLC. (Borger, Tex.) as AQUIVION (registered trademark) PFSA (for instance, AQUIVION PFSA D83-24B, AQUIVION PFSA D83-06A, and Aquivion PFSA D79-20BS), which is based on a copolymer of tetrafluoroethylene and a short side chain (SSC) of sulfonyl fluoride vinyl ether (SFVE)$F_2C=CF-O-CF_2-CF_2-SO_2F$. The ionomer dispersion contains a sulfonic acid form thereof. As other PFSA additives, for example, DuPont (registered trademark) Nafion (registered trademark) PFSA polymer dispersion is also appropriate.

In a case where the blend is manufactured, the content of PFSA is not particularly limited. Typically, the content of PFSA is preferably 1% to 20% by mass and more preferably 1% to 4% by mass with respect to the total mass of the blend.

As the method for manufacturing the second porous membrane, known methods can be used without particular limitation. In a case where PFSA is blended with PTFE, it is preferable to add a lubricant. As the lubricant, known lubricants can be used without particular limitation. The content of the lubricant is not particularly limited, and the content in a known range can be adopted. Furthermore, in a case where PFSA and PTFE are combined, PFSA can be sprayed on the PTFE resin before these are physically mixed with the lubricant (for better distribution, for example).

As the method of blending PFSA and PTFE together, for example, the required amount of PTFE powder is mixed with a solution of PFSA in an appropriate solvent, for example, an alcohol solvent such as methanol, ethanol, or isopropanol so as to obtain a blend, then the blend is mixed with a lubricant such as odorless mineral spirit, for example, Isopar G, and the obtained paste is subjected to shearing using a twin-roller and molded into billets at least twice under a pressure equal to or higher than 2 MPa for about 55 seconds in each session. The obtained billets are equilibrated for 12 hours or longer at room temperature. Then, the billets are extruded in the desired shape. For example, the billets are extruded through a die having a gap size of 26 mm under the maximum pressure at a constant temperature of 55° C., thereby obtaining a tube-shaped PTFE tape. The tube-shaped tape is then cut along the central axis thereof and rewound around the billets, thereby obtaining new billets (uncompressed). These new billets are extruded again under the same conditions as those used in the first extrusion process. This step is additionally performed such that the PTFE tape obtains mechanical properties in an advantageous cross direction. In order that the tape has a thickness of 200 to 250 μm, calendering is performed at 30° C. The obtained tape is then dried at 125° C. for 1 hour so as to remove the lubricant from the extruded tape.

Thereafter, the tape is stretched, for example, under the conditions of a stretching rate of 300%/sec and a stretching ratio in a machine direction (MD) and a transverse direction (TD) of 3. The temperature in the stretching oven is set to 150° C.

The stretched tape is then annealed. The tape is annealed in an annealing oven and then cooled. The porosity caused by the stretching is retained during cooling.

Although the present invention is not bound by any specific theory, it is considered that in a case where the membrane is immersed in isopropyl alcohol (IPA), a larger surface area may be exposed due to the contact with the fluid treating the membrane, and thus the metal trapping ability may be improved.

The pore size of the second porous membrane is not particularly limited. Generally, the pore size of the second porous membrane is preferably 1 to 200 nm, and more preferably 10 to 20 nm.

The thickness of the second porous membrane is not particularly limited. Generally, the thickness of the second porous membrane is preferably 5 to 127 μm, and more preferably 0.5 to 1.0 μm.

Generally, the critical wetting surface tension of the second porous membrane (filter A) is preferably equal to or higher than $27\times10^{-5}$ N/cm. As a result of intensive examinations, the inventors of the present invention have found that sometimes the defect inhibition performance of the obtained chemical liquid is affected by the correlation between the physical properties of the liquid to be purified and the critical wetting surface tension of the second porous membrane.

In a case where the critical wetting surface tension is equal to or higher than $27\times10^{-5}$ N/cm, metal impurities and the like contained in the liquid to be purified can be more efficiently removed, and thus a chemical liquid having further improved defect inhibition performance is obtained. In this respect, the critical wetting surface tension is more preferably equal to or higher than $30 \times 10^{-5}$ N/cm, and even more preferably equal to or higher than $33 \times 10^{-5}$ N/cm.

Meanwhile, in the relationship with the surface tension of the liquid to be purified, the smaller the absolute value of the difference between the critical wetting surface tension of the second porous membrane and the surface tension of the liquid to be purified, the easier it is for the second porous membrane to be wet with the liquid to be purified, and consequently, a chemical liquid having excellent defect inhibition performance is easily obtained.

In a case where the liquid to be purified contains an organic solvent (in a case where the liquid to be purified is "organic solvent-based liquid to be purified" or the like which will be described later), from the viewpoint of further reducing the difference with the surface tension of the liquid to be purified, the critical wetting surface tension of the second porous membrane is preferably equal to or lower than $40 \times 10^{-5}$ N/cm.

In a case where the surface tension of the liquid to be purified is higher (for example, in a case where the liquid to be purified is "aqueous liquid to be purified", which will be described later, containing water or the like), as another embodiment, an embodiment is also preferable in which the critical wetting surface tension of the second porous membrane is higher than $40 \times 10^{-5}$ N/cm.

The critical wetting surface tension of the second porous membrane can be adjusted by the content of the perfluorosulfonic acid polymer in the polytetrafluoroethylene blended with the perfluorosulfonic acid polymer. Specifically, in a case where the content of the perfluorosulfonic acid polymer is increased, it is easy to obtain the second porous membrane having a higher critical wetting surface tension, and in a case where the content of the perfluorosulfonic acid polymer is reduced, it is easy to obtain the second porous membrane having a lower critical wetting surface tension.

<Filter BD>

The filter BD is a filter different from the filter A, and is arranged in series with the filter A on the downstream side of the filter A on the flow path. In the present specification, "filters different from each other" means that the filters are different from each other in terms of at least one kind of item selected from the group consisting of pore size, material, and pore structure. Particularly, in view of obtaining a filtering device having further improved effects of the present invention, the filter BD is preferably different from the filter A at least in terms of pore size, and more preferably different from the filter A in terms of pore size and material. The term "different materials" typically means a form in which constituent components (material components) are different.

The pore size of the filter BD is not particularly limited, and it is possible to use a filter having a pore size generally used for filtering a liquid to be purified. Particularly, the pore size of the filter is preferably equal to or smaller than 200 nm, more preferably equal to or smaller than 20 nm, still more preferably equal to or smaller than 10 nm, particularly preferably equal to or smaller than 7 nm, and most preferably equal to or smaller than 5 nm. The lower limit thereof is not particularly limited, but is generally preferably equal to or greater than 1 nm from the viewpoint of productivity.

According to the examination of the inventors of the present invention, it has been found that in a case where a liquid to be purified is filtered using the filter A, fine particles are generated due to the filter A and mixed into the liquid to be purified. The filtering device according to the present embodiment has the filter BD on the downstream side of the filter A on the flow path. Therefore, the fine particles resulting from the filter A can be separated from the liquid to be purified by filtration, and a chemical liquid having further improved defect inhibition performance is easily obtained.

Although the filtering device in FIG. 1 has one filter BD, the filtering device according to the present embodiment may have a plurality of filters BD. In this case, the relationship between the pore sizes of the plurality of filters BD is not particularly limited. However, in view of easily obtaining a chemical liquid having further improved defect inhibition performance, it is preferable that a filter BD disposed on the downmost stream side on the flow path has the smallest pore size among the plurality of filters BD. The filter BD disposed on the downmost stream side means a filter BD disposed on the downmost stream side among all the filters arranged in the flow path.

In this case, the filter BD disposed on the downmost stream side preferably contains, as a material component, at least one kind of compound selected from the group consisting of polyethylene (particularly, ultra-high-molecular-weight polyethylene; UPE), polytetrafluoroethylene, and nylon, more preferably contains polyethylene or polytetrafluoroethylene, and even more preferably contains polytetrafluoroethylene.

Typically, the filter BD is disposed to separate impurities, which are likely to be unintentionally mixed into the liquid to be purified in a case where the liquid to be purified is filtered through the filter A or the like disposed on the upstream side, by filtration.

The impurities to be removed vary with the material component contained in the filter BD in many cases. For example, the filter BD containing nylon is assumed to easily adsorb and remove gel-like impurities in the liquid to be purified by a hydrophilic layer assumed to be formed on the membrane, and the filter BD containing ultra-high-molecular-weight polyethylene is assumed to easily remove particle-like impurities by a sieving effect.

The inventors of the present invention have found that in a case where the liquid to be purified is an organic solvent-based liquid to be purified which will be described later, and the liquid to be purified is passed through the filter BD containing nylon or the filter BD containing ultra-high-molecular-weight polyethylene, due to the material of the filter BD, sometimes impurities are unintentionally mixed into the liquid to be purified. In this case, it is preferable to dispose a filter containing polytetrafluoroethylene (preferably consisting of polytetrafluoroethylene) as the filter BD disposed on the downmost stream side on the flow path, because then the impurities thereof and the like can also be removed.

The pore size of the filter BD is not particularly limited. Generally, the pore size of the filter BD is preferably 1 to 20 nm, more preferably 1 to 10 nm, and even more preferably 1 to 7 nm.

The relationship between the pore size of the filter A and the pore size of the filter BD is not particularly limited, but it is preferable that the pore size of the filter BD is smaller than the pore size of the filter A. As described above, according to the examination of the inventors of the present invention, it has been found that in a case where a liquid to be purified is passed through the filter A, sometimes fine particles resulting from the filter A are mixed into the liquid to be purified. In a case where the pore size of the filter BD is smaller than the pore size of the filter A, the fine particles mixed into the liquid to be purified can be more efficiently removed from the liquid.

The material of the filter BD is not particularly limited, and may be the same as or different from the material of the filter A. Particularly, in view of obtaining a filtering device having further improved effects of the present invention, it is preferable that the material of the filter BD is different from that of the filter A.

It is preferable that the filter BD contains, as a material component, polyamide such as 6-nylon and 6,6-nylon; polyolefin such as polyethylene and polypropylene; polystyrene; polyimide; polyamidoimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like. Particularly, in view of obtaining further improved solvent resistance and obtaining a chemical liquid having further improved defect inhibition performance, it is preferable that the filter BD contains at least one kind of resin selected from the group consisting of nylon (particularly preferably 6,6-nylon), polyolefin (particularly preferably polyethylene), poly(meth)acrylate, and polyfluorocarbon (particularly preferably polytetrafluoroethylene (PTFE) and perfluoroalkoxyalkane (PFA)). One kind of each of these polymers can be used singly, or two or more kinds of these polymers can be used in combination.

In addition to the resin, diatomite, glass, and the like may also be used.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter is preferably obtained by using various materials exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Particularly, in view of obtaining a filtering device having further improved effects of the present invention, the filter BD preferably contains at least one kind of resin selected from the group consisting of polyolefin, polyamide, polyfluorocarbon, polystyrene, polysulfone, and polyethersulfone, and more preferably consists of at least one kind of material component selected from the group consisting of polyolefin, polyamide, polyfluorocarbon, polystyrene, polysulfone, and polyethersulfone.

Examples of the polyolefin include polyethylene, polypropylene, and the like. Among these, ultra-high-molecular-weight polyethylene is preferable. Examples of the polyamide include 6-nylon, 6,6-nylon, and the like. Examples of the polyfluorocarbon include polytetrafluoroethylene (PTFE), perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, polyvinyl fluoride, and the like. Among these, PTFE is preferable.

The pore structure of the filter BD is not particularly limited, and may be appropriately selected according to the components of the liquid to be purified. In the present specification, the pore structure of the filter BD means a pore size distribution, a positional distribution of pores in the filter, a pore shape, and the like. Typically, the pore structure can be controlled by the manufacturing method of the filter.

For example, in a case where powder of a resin or the like is sintered to form a membrane, a porous membrane is obtained. Furthermore, in a case where a methods such as electrospinning, electroblowing, and melt blowing are used to form a membrane, a fiber membrane is obtained. These have different pore structures.

"Porous membrane" means a membrane which retains components in a liquid to be purified, such as gel, particles, colloids, cells, and polyoligomers, but allows the components substantially smaller than the pores of the membrane to pass through the membrane. The retention of components in the liquid to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

An ultra-high-molecular-weight polyethylene (UPE) filter is typically a sieving membrane. A sieving membrane means a membrane that traps particles mainly through a sieving retention mechanism or a membrane that is optimized for trapping particles through a sieving retention mechanism.

Typical examples of the sieving membrane include, but are not limited to, a polytetrafluoroethylene (PTFE) membrane and a UPE membrane.

"Sieving retention mechanism" refers to retention caused in a case where the particles to be removed are larger than the size of micropores of the porous membrane. Sieving retentivity can be improved by forming a filter cake (aggregate of particles to be removed on the surface of the membrane). The filter cake effectively functions as a secondary filter.

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pores size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the pores changes in the membrane. Typically, the pore size increases toward the other surface of the membrane from one surface of the membrane. In this case, the surface containing pores having a large pore size is called "open side", and the surface containing pores having a small pore size is also called "tight side".

Examples of the asymmetric porous membrane include a membrane in which the pore size is minimized at a position in the thickness direction of the membrane (this is also called "hourglass shape").

In a case where the asymmetric porous membrane is used such that large pores are on the primary side, in other words, in a case where the primary side is used as the open side, a pre-filtration effect can be exerted.

The porous membrane layer may include a thermoplastic polymer such as polyethersulfone (PESU), perfluoroalkoxyalkane (PFA, a copolymer of tetrafluoroethylene and perfluoroalkoxyalkane), polyamide, or a polyolefin, or may include polytetrafluoroethylene and the like.

Particularly, it is preferable that the porous membrane contains ultra-high-molecular-weight polyethylene as a material component. The ultra-high-molecular-weight polyethylene means thermoplastic polyethylene having a very long chain. The molecular weight thereof is equal to or greater than 1,000,000. Typically, the molecular weight thereof is preferably 2,000,000 to 6,000,000.

For example, in a case where the liquid to be purified contains, as impurities, particles containing an organic compound, such particles are negatively charged in many cases. For removing such particles, a filter made of polyamide functions as a non-sieving membrane. Typical non-sieving membranes include, but are not limited to, nylon membranes such as a nylon-6 membrane and a nylon-6,6 membrane.

"Non-sieving" retention mechanism used in the present specification refers to retention resulting from the mechanism such as blocking, diffusion, and adsorption irrelevant to the pressure reduction of the filter or the pore size of the filter.

The non-sieving retention includes a retention mechanism such as blocking, diffusion, and adsorption for removing particles supposed to be removed from the liquid to be purified irrespective of the pressure reduction of the filter or the pore size of the filter. The adsorption of particles onto the filter surface can be mediated, for example, by the intermolecular van der Waals force and electrostatic force. In a case where the particles moving in the non-sieving membrane layer having a serpiginous path cannot sufficiently rapidly change direction so as not to contact the non-sieving membrane, a blocking effect is exerted. The transport of particles by diffusion is mainly caused by the random motion or the Brownian motion of small particles that results in a certain probability that the particles may collide with the filter medium. In a case where there is no repulsive force between the particles and the filter, the non-sieving retention mechanism can be activated.

The material of the fiber membrane is not particularly limited as long as it is a polymer capable of forming the fiber membrane. Examples of the polymer include polyamide and the like. Examples of the polyamide include nylon 6, nylon 6,6, and the like. The polymer forming the fiber membrane may be poly(ethersulfone). In a case where the fiber membrane is on the primary side of the porous membrane, it is preferable that the surface energy of the fiber membrane is higher than the surface energy of the polymer which is the material of the porous membrane on a secondary side. For example, in some cases, nylon as a material of the fiber membrane and polyethylene (UPE) as the porous membrane are combined.

As the method for manufacturing the fiber membrane, known methods can be used without particular limitation. Examples of the method for manufacturing the fiber membrane include electrospinning, electroblowing, melt blowing, and the like.

Second Embodiment

Figure 2:
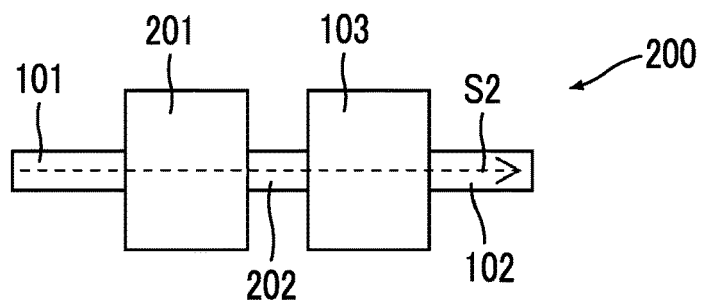
FIG. 2 is a schematic view illustrating a filtering device according to a second embodiment of the present invention.

FIG. 2 is a schematic view illustrating a filtering device according to a second embodiment of the present invention.

A filtering device 200 is a filtering device in which a filter 103 as a filter A and a filter 201 (filter BU) different from the filter 103 are arranged in series through a piping 202 between an inlet portion 101 and an outlet portion 102.

The inlet portion 101, the filter 201, the piping 202, the filter 103, and the outlet portion 102 are constituted such that a liquid to be purified can flow in the interior of each of these members. These members are connected to one another and form a flow path S2 (path through which the liquid to be purified flows).

In the filtering device 200, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

<Filter BU>

The filter BU is a filter different from the filter A, and is arranged in series with the filter A on the upstream side of the filter A on the flow path. On the flow path, the inlet portion is the upstream side, and the outlet portion is the downstream side. In view of obtaining a filtering device having further improved effects of the present invention, the filter BU is preferably different from the filter A at least in terms of material, and more preferably different from the filter A in terms of pore size and material.

The pore size of the filter BU is not particularly limited, and it is possible to use a filter having a pore size generally used for filtering a liquid to be purified. Especially, the pore size of the filter is preferably equal to or greater than 1 nm, more preferably equal to or greater than 3 nm, and even more preferably equal to or greater than 10 nm. The upper limit thereof is not particularly limited, but is preferably equal to or smaller than 1.0 µm. In embodiments other than an embodiment in which the filter is used as a filter C that will be described later, the upper limit of the pore size is more preferably less than 200 nm, even more preferably less than 100 nm, and particularly preferably equal to or smaller than 50 nm. In a case where the filtering device has a plurality of filters BU, it is preferable that at least one filter BU has a pore size in the above range, and it is more preferable that the filter BU disposed on the uppermost stream side on the flow path has a pore size in the above range.

According to the examination of the inventors of the present invention, it has been found that in a case where a filtering device is used in which the filter BU having a pore size equal to or greater than 20 nm is disposed on the upstream side of the filter A on the flow path S2, it is more difficult for the filter A to be clogged, and the pot life of the filter A can be further extended. As a result, a filtering device capable of stably providing a chemical liquid having further improved defect inhibition performance can be obtained.

The relationship between the pore size of the filter A and the pore size of the filter BU is not particularly limited, but it is preferable that the pore size of the filter BU is larger than the pore size of the filter A.

Although the filtering device in FIG. 2 has one filter BU, the filtering device according to the present embodiment may have a plurality of filters BU. In this case, the relationship between the pore sizes of the plurality of filters BU is not particularly limited. However, in view of easily obtaining a chemical liquid having further improved defect inhibition performance, it is preferable that a filter BU disposed in the uppermost stream on the flow path has the largest pore size. In a case where the filter BU having the largest pore size is positioned as described above, the pot life of the filters (including the filter A) disposed in the downstream of the filter BU in the uppermost stream can be further extended, and as a result, a filtering device capable of stably providing a chemical liquid having further improved defect inhibition performance is obtained.

The material of the filter BU is not particularly limited. However, in view of obtaining a filtering device having further improved effects of the present invention, it is preferable that the filter BU contains a resin having an ion exchange group as a material component. The ion exchange group is not particularly limited. However, in view of obtaining a filtering device having further improved effects of the present invention, the ion exchange group is preferably at least one kind of ion exchange group selected from the group consisting of an acid group, a base group, an amide group, and an imide group.

As the filter BU, a material is more preferable which includes a base material such as polyfluorocarbon or polyolefin and an ion exchange group introduced into the base material.

The resin having an ion exchange group is not particularly limited, and it is possible to use a filter, which includes a material component capable of removing ions (for example, metal ions and the like) by the non-sieving effect described in the first embodiment, and the like.

As the ion exchange group, particularly, an anion exchange group is preferable. Examples of the anion exchange group include a quaternary ammonium group and the like. In a case where the filter BU contains a resin having an anion exchange group as a material component, a chemical liquid having further improved defect inhibition performance is easily obtained.

As a material component of the filter BU, a material is more preferable which includes a base material such as polyfluorocarbon or polyolefin and an anion exchange group introduced into the base material.

Modification Example of Filtering Device According to Second Embodiment

Figure 3:
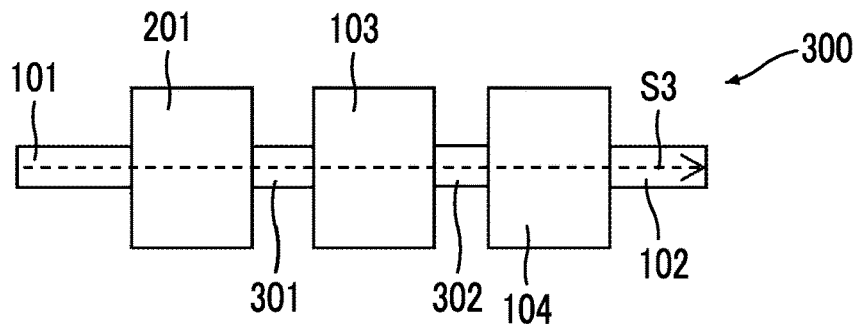
FIG. 3 is a schematic view illustrating a modification example of the filtering device according to the second embodiment of the present invention.

FIG. 3 is a schematic view of a filtering device illustrating a modification example of a filtering device according to a second embodiment of the present invention. A filtering device 300 includes a filter 103 as a filter A, a filter 201 as a filter BU, and a filter 104 as a filter BD between an inlet portion 101 and an outlet portion 102, in which the filter 201, the filter 103, and the filter 104 are arranged in series through a piping 301 and a piping 302.

In the filtering device 300, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The inlet portion 101, the filter 201, the piping 301, the filter 103, the piping 302, and the filter 104 are constituted such that a liquid to be purified can flow in the interior of each of these members. These members are connected to one another and form a flow path S3 (path through which the liquid to be purified flows). The constitutions of the piping and each filter are as described above.

The filtering device 300 has the filter BU on the upstream side of the filter A on the flow path. Therefore, the pot life of the filter A is further extended. Furthermore, the filtering device 300 has the filter BD on the downstream side of the filter A on the flow path. Therefore, the fine particles mixed into the liquid to be purified due to the filter A can be efficiently removed, and as a result, a chemical liquid having further improved defect inhibition performance can be easily obtained.

Third Embodiment

Figure 4:
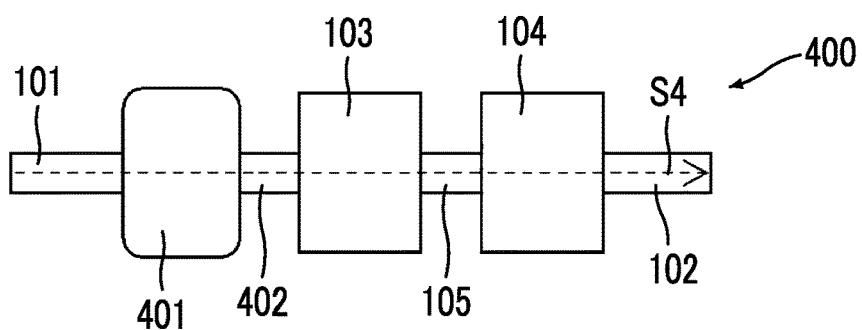
FIG. 4 is a schematic view illustrating a filtering device according to a third embodiment of the present invention.

FIG. 4 is a schematic view illustrating a filtering device according to a third embodiment of the present invention.

A filtering device 400 further includes a tank 401 disposed in series with a filter A on the upstream side of the filter 103 (filter A) on a flow path S4 between the inlet portion 101 and the outlet portion 102. The tank 401, the filter 103 (filter A), and the filter 104 (filter BD) are arranged in series through a piping 402 and the piping 105. The tank 401 constitutes the flow path S4 together with the filters, pipings, and the like described above.

In the filtering device 400, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the upstream side of the filter 103. Therefore, the liquid to be purified that will flow through the filter 103 can be retained in the tank and can be homogenized. As a result, a chemical liquid having further improved defect inhibition performance is obtained. Particularly, in a case where circulation filtration, which will be described later, is performed, and the liquid to be purified is returned to the upstream of the filter 103 in the flow path S4 from the downstream of the filter 103 (filter A) in the flow path S4, the tank 401 can be used to receive the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

The material of the tank 401 is not particularly limited, and the same material as the material of the housing described above can be used. It is preferable that at least a portion of the liquid contact portion of the tank 401 (preferably 90% or more of the surface area of the liquid contact portion, and more preferably 99% or more of the surface area of the liquid contact portion) consists of the anticorrosive material which will be described later.

Modification Example of Filtering Device
According to Third Embodiment

Figure 5:
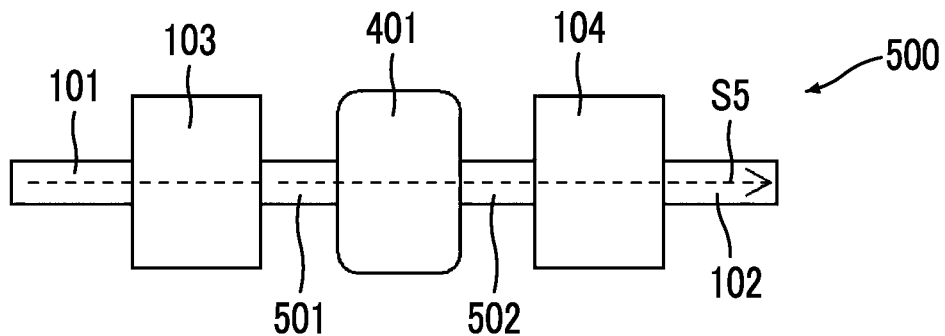
FIG. 5 is a schematic view illustrating a modification example of the filtering device according to the third embodiment of the present invention.

FIG. 5 is a schematic view illustrating a modification example of the filtering device according to the third embodiment of the present invention.

A filtering device 500 further includes a tank 401 arranged in series with a filter A on the downstream side of the filter 103 (filter A) on a flow path S5 between the inlet portion 101 and the outlet portion 102. The filter 103 (filter A), the tank 401, and the filter 104 (filter BD) are arranged in series through a piping 501 and the piping 502. The tank 401 constitutes a flow path S5 together with the filters, pipings, and the like described above.

In the filtering device 500, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the downstream side of the filter A. Therefore, the liquid to be purified filtered through the filter A can be retained in the tank. Particularly, in a case where circulation filtration, which will be described later, is performed, and the liquid to be purified is returned to the upstream side of the filter 103 in the flow path S4 from the downstream side of the filter 103 (filter A) in the flow path S4, the tank 401 can be used to retain the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

In the filtering device 500 according to the present embodiment, the tank 401 is disposed on the upstream side of the filter 104 (filter BD) on the flow path S5. However, in the filtering device according to the present embodiment, the tank 401 may be disposed on the downstream side of the filter 104 on the flow path S5.

As described above, the tank 401 can be used to retain the returned liquid to be purified during circulation filtration. In other words, the tank 401 can be a starting point of the circulation filtration. In this case, either a filter on the upstream side of the tank 401 (filter 103 in the filtering device 500) or a filter on the downstream side of the tank 401 (filter 104 in the filtering device 500) on the flow path S5 is frequently used as a reference filter for circulation filtration. The starting point of the circulation filtration includes a starting point in a case where the tank constitutes a return flow path or a starting point in a case where a piping on the downstream side of the tank constitutes a return flow path.

In the filtering device 500, the tank 401 is disposed on the upstream side of the filter 104 (filter BD). In a case where the tank 401 is disposed on the upstream side of the filter 104 (filter BD), during the circulation filtration, in the flow path S5, the upstream side or downstream side of the tank 401 can be subjected to the circulation filtration. For example, in a case where the upstream side of the tank 401 is subjected to the circulation filtration, it is possible to adopt a flow in which the fine particles and the like, which are unintentionally mixed into the liquid to be purified because the liquid passes through the filter A, can be finally removed using the filter 104 from the liquid to be purified thoroughly filtered through the filter A. As a result, the pot life of the filter BD is further extended, and a chemical liquid having excellent defect inhibition performance can be more stably manufactured for a long period of time.

The filtering device according to the present embodiment may be in the form of a filtering device in which the filter BU and the filter A are arranged in series in this order (for example, the second embodiment), and in the form of a filtering device in which the filter BU, the filter A, and the filter BD are arranged in series in this order (for example, a modification example of the second embodiment), and the tank 401 is further provided on the upstream side of the filter A.

Fourth Embodiment

Figure 6:
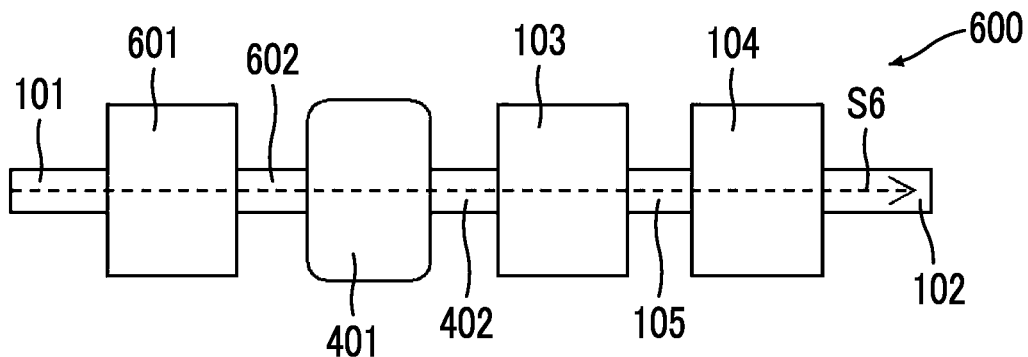
FIG. 6 is a schematic view illustrating a filtering device according to a fourth embodiment of the present invention.

FIG. 6 is a schematic view illustrating a filtering device according to a fourth embodiment of the present invention.

A filtering device 600 includes a filter 601 as a filter C, a tank 401, a filter 103 as a filter A, and a filter 104 as a filter BD that are arranged in series through a piping 602, a piping 402, and a piping 105 between an inlet portion 101 and an outlet portion 102.

In the filtering device 600, the inlet portion 101, the filter 601, the piping 602, the tank 401, the piping 402, the filter 103, the piping 105, the filter 104, and the outlet portion 102 form a flow path S6.

In the filtering device 600, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filter 601 (filter C) is a filter which is disposed on the upstream side of the tank 401 in the flow path S6 and has a pore size equal to or greater than 10 nm. In the filtering device according to the present embodiment, a filter having a predetermined pore size is disposed on the upstream side of the tank 401 in the flow path S6. Therefore, impurities and the like contained in the liquid to be purified flowing into the filtering device from the inlet portion 101 can be removed in advance by using the filter 601. Accordingly, it is possible to further reduce the amount of impurities mixed into the flow path after the piping 602. Therefore, it is possible to further extend the pot life of the subsequent filter A and filter BD (or the filter BU in a case where the filter BU is disposed in the filtering device). Consequently, with the filtering device described above, it is possible to stably manufacture a chemical liquid having further improved defect inhibition performance.

The form of the filter C is not particularly limited, and the filter C may be the same filter as the filter A described above or a different filter (filter B). Particularly, in view of easily obtaining a chemical liquid having further improved defect inhibition performance, the filter C is preferably a filter (filter B) different from the filter A. Especially, as the material and pore structure of the filter C, those described as the material and pore structure of the filter BD are preferable. The pore size is not particularly limited, but is preferably equal to or greater than 10 nm, more preferably equal to or greater than 20 nm, even more preferably greater than 50 nm, and particularly preferably equal to or greater than 100 nm. The upper limit thereof is not particularly limited, but is preferably equal to or smaller than 500 nm, more preferably equal to or smaller than 300 nm, and even more preferably equal to or smaller than 250 nm.

The filtering device according to the present embodiment may be in the form of a filtering device in which the filter A and the filter BD are arranged in series in this order on the flow path (for example, the second embodiment), and in the form of a filtering device in which the filter BU, the filter A, and the filter BD are arranged in series in this order on the flow path (for example, a modification example of the second embodiment), a tank is further provided on the downstream side of the filter A, and the filter C is provided on the upstream side of the tank.

Fifth Embodiment

Figure 7:
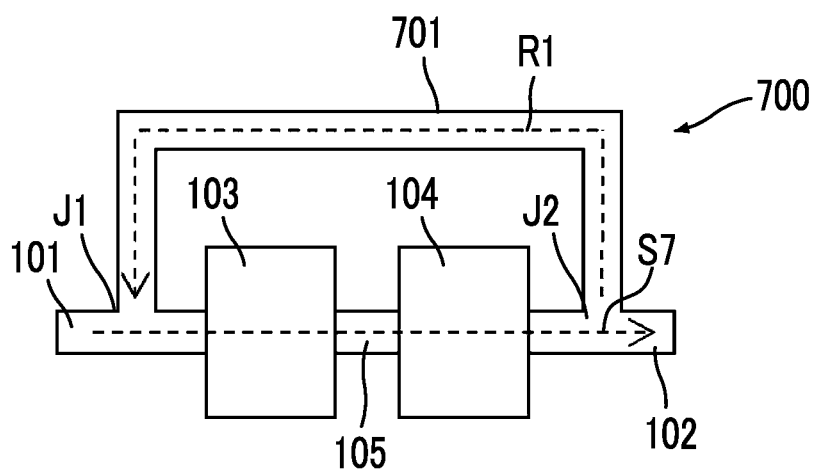
FIG. 7 is a schematic view illustrating a filtering device according to a fifth embodiment of the present invention.

FIG. 7 is a schematic view of a filtering device according to a fifth embodiment of the present invention. A filtering device 700 includes an inlet portion 101, an outlet portion 102, a filter 103 as a filter A, and a filter 104 as a filter BD, in which the filter 103 and the filter 104 are arranged in series between the inlet portion 101 and the outlet portion 102, and a flow path S7 extending from the inlet portion 101 to the outlet portion 102 is formed.

In the filtering device 700, the inlet portion 101, the filter 103, a piping 105, the filter 104, and the outlet portion 102 form the flow path S7.

In the filtering device 700, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 700, a return flow path R1 is formed which is capable of returning the liquid to be purified to the upstream side of the filter 103 in the flow path S7 (and the upstream side of a reference filter) from the downstream side of the filter 104 (reference filter) in the flow path S7. Specifically, the filtering device 700 has a piping 701 for return, and the piping 701 forms the return flow path R1. One end of the piping 701 is connected to the flow path S7 on the downstream side of the filter 104 (and the filter 103) and the other end thereof is connected to the flow path S7 on the upstream side of the filter 103. On the return flow path R1, a pump, a damper, a valve, and the like not shown in the drawing may be arranged. Particularly, it is preferable to dispose a valve in connection portions J1 and J2 shown in FIG. 7 so as to control the liquid to be purified such that the liquid does not unintentionally flow through the return flow path.

The liquid to be purified that has flowed through the return flow path R1 and has been returned to the upstream side of the filter 103 (in the flow path S7) is filtered through the filter 103 and the filter 104 in the process of flowing again through the flow path S7. This process is called circulation filtration. The filtering device 700 can perform the circulation filtration, and as a result, a chemical liquid having further improved defect inhibition performance is easily obtained.

In FIG. 7, the piping 701 is disposed on the flow path S7 such that the liquid to be purified can be returned to the upstream side of the filter A (and the filter BD; upstream side of the reference filter) from the downstream side of the filter 104 (filter BD, reference filter). However, the filtering device according to the present embodiment may be constituted such that the filter A is used as a reference filter and the liquid to be purified can be returned to the upstream side of the filter A from the downstream side of the filter A on the flow path. In this case, the return flow path may be formed of a piping connecting the piping 105 to the inlet portion 101.

Furthermore, in a case where the filter BU is disposed on the upstream side of the filter A on the flow path, the filter A may be used as a reference filter, and a return flow path may be formed which is capable of returning the liquid to be purified to the upstream side of the filter BU (and the upstream side of the reference filter) from the downstream side of the reference filter.

In FIG. 7, the return flow path R1 is formed only of piping. However, the return flow path R1 may be formed of one or plural tanks and pipings described above.

Figure 8:
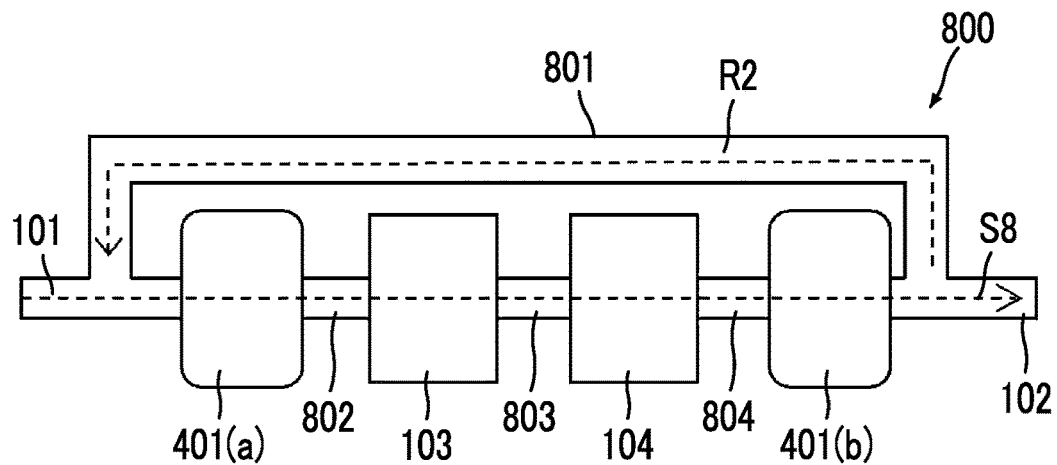
FIG. 8 is a schematic view illustrating a modification example of the filtering device according to the fifth embodiment of the present invention.

FIG. 8 is a schematic view illustrating a modification example of the filtering device according to the fifth embodiment of the present invention.

The filtering device 800 has an inlet portion 101, tanks 401(a) and 401 (b), an outlet portion 102, a filter 103 as a filter A, and a filter 104 as a filter BD. The tank 401(a), filter 103, the filter 104, and the tank 401(b) are arranged in series between the inlet portion 101 and the outlet portion 102, and the inlet portion 101, the tank 401(a), a piping 802, the filter 103, a piping 803, the filter 104, a piping 804, the tank 401(b), and the outlet portion 102 form a flow path S8.

In the filtering device 800, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 800, a return flow path R2 is formed which is capable of returning the liquid to be purified to the upstream side of the tank 401(a) disposed on the upstream side of the filter 103 on the flow path S8 from the downstream side of the tank 401(b) disposed on the downstream side of the filter 104 on the flow path S8. One end of a piping 801 is connected to the flow path S8 on the downstream side of the tank 401(b), and the other end thereof is connected to the flow path S8 on the upstream side of the tank 401(a). On the return flow path R2, a pump, a damper, a valve, and the like not shown in the drawing may be arranged.

In the filtering device according to the present embodiment, the starting point of the return flow path R2 is disposed on the downstream side of the tank 401(b) on the flow path, and the end point of the return flow path R2 is disposed on the upstream side of the tank 401(a) on the flow path. In a case where the return flow path is constituted as described above, during circulation filtration, the liquid to be purified can be returned after being retained or can flow again after being retained. As a result, a chemical liquid having further improved defect inhibition performance can be obtained. The filtering device according to the present embodiment may be in the form of a filtering device in which the tank 401(b) and the piping 801 are directly connected to each other, in the form of a filtering device in which the tank 401(a) and the piping 801 are directly connected to each other, or in the form of a filtering device as a combination of these.

Sixth Embodiment

Figure 9:
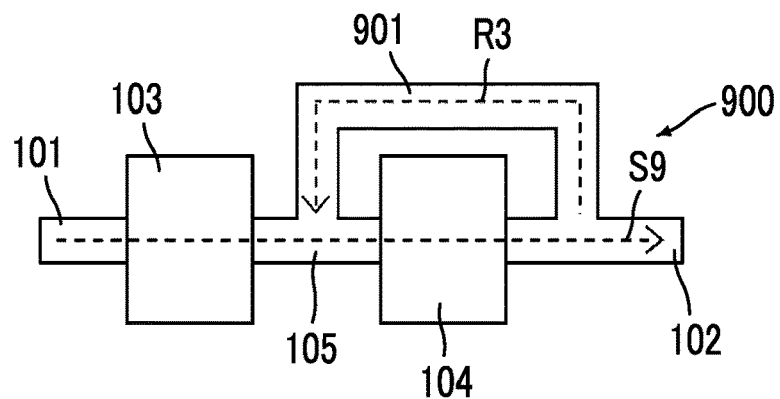
FIG. 9 is a schematic view illustrating a filtering device according to a sixth embodiment of the present invention.

FIG. 9 is a schematic view of a filtering device according to a sixth embodiment of the present invention. A filtering device 900 includes an inlet portion 101, an outlet portion 102, a filter 103 as a filter A, and a filter 104 as a filter BD, in which the filter 103 and the filter 104 are arranged in series between the inlet portion 101 and the outlet portion 102, and a flow path S9 extending from the inlet portion 101 to the outlet portion 102 is formed.

In the filtering device 900, the inlet portion 101, the filter 103, a piping 105, the filter 104, and the outlet portion 102 form the flow path S9.

In the filtering device 900, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 900, a return flow path R3 is formed which is capable of returning the liquid to be purified to a position that is on the downstream side of the filter 103 and on the upstream side of the filter 104 on the flow path S9 from the downstream side of the filter 104 on the flow path S9. Specifically, the filtering device 900 has a piping 901 for return, and the piping 901 forms the return flow path R3. One end of the piping 901 is connected to the flow path S9 on the downstream side of the filter 104, and the other end thereof is connected to the flow path S9 at a position which is on the upstream side of the filter 104 and on the downstream side of the filter 103. On the return flow path R3, a pump, a damper, a valve, and the like not shown in the drawing may be arranged.

The liquid to be purified that has flowed through the return flow path R2 and has been returned to a position, which is on the downstream side of the filter 103 and on the upstream side of the filter 104, is filtered through the filter 104 in the process of flowing again through the flow path S9. The filtering device 900 can perform circulation filtration. As a result, a chemical liquid having further improved defect inhibition performance can be easily obtained.

In FIG. 9, the piping 901 is disposed on the flow path S9 such that the liquid to be purified can be returned to a position, which is on the downstream side of the filter A and on the upstream side of the filter BD on the flow path S9, from the downstream side of the filter 104 (filter BD). However, the filtering device according to the present embodiment may be constituted such that the liquid to be purified can be returned to a position, which is on the downstream side of the filter A and on the upstream side of the filter B, from the downstream side of the filter B on the flow path.

Figure 10:
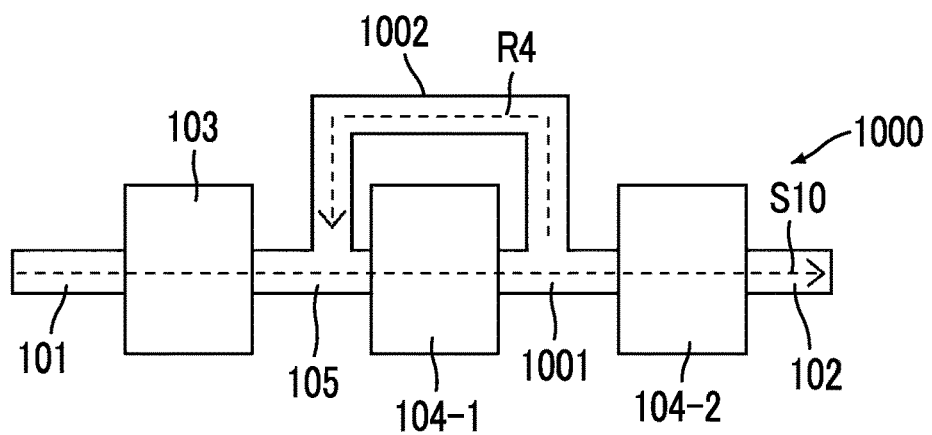
FIG. 10 is a schematic view illustrating a modification example of the filtering device according to the sixth embodiment of the present invention.

FIG. 10 is a schematic view illustrating a modification example of the filtering device according to the present embodiment. A filtering device 1000 includes an inlet portion 101, an outlet portion 102, a filter 103 as a filter A, a filter 104-1 (reference filter) as a filter BD, and a filter 104-2, in which the filter 103, the filter 104-1, and the filter 104-2 are arranged in series between the inlet portion 101 and the outlet portion 102, and a flow path S10 extending from the inlet portion 101 to the outlet portion 102 is formed.

In the filtering device 1000, the inlet portion 101, the filter 103, the piping 105, the filter 104-1, a piping 1001, the filter 104-2, and the outlet portion 102 form the flow path S10.

In the filtering device 1000, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 1000, a return flow path R4 is formed which is capable of returning the liquid to be purified to a position, which is on the downstream side of the filter 103 and on the upstream side of the filter 104-1 (reference filter) on the flow path S10, from the downstream side of the filter 104-1 (reference filter) on the flow path S10. Specifically, the filtering device 1000 has a piping 1002 for return, and the piping 1002 forms the return flow path R4. One end of the piping 1002 is connected to the flow path S10 at a position which is on the downstream side of the filter 103 and on the upstream side of the filter 104-1, and the other end thereof is connected to the flow path S10 at a position which is on the downstream side of the filter 104-1 and on the upstream side of the filter 104-2. On the return flow path R4, a pump, a damper, a valve, and the like not shown in the drawing may be arranged.

The liquid to be purified that has been returned to a position, which is on the downstream side of the filter 103 and on the upstream side of the filter 104-1 on the flow path S10, through the return flow path R4 is filtered through the filter 104-1 in the process of flowing again through the flow path S10. The filtering device 1000 can perform circulation filtration. As a result, a chemical liquid having further improved defect inhibition performance can be easily obtained.

In the filtering device in FIG. 10, the return flow path R4 is formed which is capable of returning the liquid to be purified to the upstream side of the filter 104-1 from the downstream side of the filter 104-1, that is, the upstream side of the filter 104-2 on the flow path S10. However, the filtering device according to the present embodiment is not limited thereto, and may be a filtering device in which a return flow path capable of returning the liquid to be purified to the upstream side of the filter 104-2 from the downstream side of the filter 104-2 is formed, a filtering device in which a return flow path capable of returning the liquid to be purified to a position, which is on the downstream side of the filter A and on the upstream side of the filter 104-1, from the downstream side of the filter 104-2, is formed, or a filtering device in which a return flow path is formed which is capable of returning the liquid to be purified to the upstream side of the filter 103 from the downstream side of the filter 104-1 or filter 104-2.

Method for Manufacturing Chemical Liquid (First Embodiment)

The method for manufacturing a chemical liquid according to an embodiment of the present invention is a chemical liquid manufacturing method for obtaining a chemical liquid by purifying a liquid to be purified. The method has a filtration step of filtering a liquid to be purified by using the filtering device described above so as to obtain a chemical liquid.

[Liquid to be Purified]

The liquid to be purified to which the method for manufacturing a chemical liquid according to the embodiment of the present invention can be applied is not particularly limited. However, it is preferable that the liquid to be purified contains a solvent. Examples of the solvent include an organic solvent, and water, and the like. It is preferable that the liquid to be purified contains an organic solvent. In the following description, the liquid to be purified will be divided into an organic solvent-based liquid to be purified in which the content of an organic solvent (total content in a case where the liquid to be purified contains a plurality of organic solvents) with respect to the total mass of solvents contained in the liquid to be purified is greater than 50% by mass, and an aqueous liquid to be purified in which the content of water with respect to the total mass of solvents contained in the liquid to be purified is greater than 50% by mass.

<Organic Solvent-Based Liquid to be Purified>

(Organic Solvent)

The organic solvent-based liquid to be purified contains a solvent, in which the content of the organic solvent is equal to or greater than 50% by mass with respect to the total mass of solvents contained in the liquid to be purified.

The liquid to be purified contains an organic solvent. The content of the organic solvent in the liquid to be purified is not particularly limited, but is preferably equal to or greater than 99.0% by mass with respect to the total mass of the liquid to be purified in general. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the liquid to be purified in an amount greater than 10,000 ppm by mass with respect to the total mass of the liquid to be purified. That is, in the present specification, a liquid organic compound contained in the liquid to be purified in an amount greater than 10,000 ppm by mass with respect to the total mass of the liquid to be purified corresponds to an organic solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, for example, those described in JP2016-057614A, JP2014-219664A, JP2016-138219A, and JP2015-135379A may also be used.

As the organic solvent, at least one kind of compound is preferable which is selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, and 2-heptanone (MAK).

The type and content of the organic solvent in the liquid to be purified can be measured using a gas chromatography mass spectrometer.

(Other Components)

The liquid to be purified may contain other components in addition to the above components. Examples of those other components include an inorganic substance (such as metal ions, metal particles, and metal oxide particles), a resin, an organic substance other than a resin, water, and the like.

Inorganic Substance

The liquid to be purified may contain an inorganic substance. The inorganic substance is not particularly limited, and examples thereof include metal ions, metal-containing particles, and the like.

The form of the metal-containing particles is not particularly limited as long as the particles contain metal atoms. For example, the metal-containing particles are in the form of simple metal atoms, compounds containing metal atoms (hereinafter, also referred to as "metal compound"), a complex of these, and the like. Furthermore, the metal-containing particles may contain a plurality of metal atoms.

The complex is not particularly limited, and examples thereof include a so-called core-shell type particle having a simple metal atom and a metal compound covering at least a portion of the simple metal atom, a solid solution particle including a metal atom and another atom, a eutectic particle including a metal atom and another atom, an aggregate particle of a simple metal atom and a metal compound, an aggregate particle of different kinds of metal compounds, a metal compound in which the composition thereof continuously or intermittently changes toward the center of the particle from the surface of the particle, and the like.

The atom other than the metal atom contained in the metal compound is not particularly limited, and examples thereof include a carbon atom, an oxygen atom, a nitrogen atom, a hydrogen atom, a sulfur atom, a phosphorus atom, and the like.

The metal atom is not particularly limited, and examples thereof include a Fe atom, an Al atom, a Cr atom, a Ni atom, a Pb atom, a Zn atom, a Ti atom, and the like. The metal-containing particles may contain one kind of each of the aforementioned metal atoms singly or may contain two or more kinds of the aforementioned metal atoms in combination.

The inorganic substance may be added to the liquid to be purified, or may be unintentionally mixed into the liquid to be purified in the manufacturing process. Examples of the case where the inorganic substance is unintentionally mixed into the liquid to be purified in the manufacturing process of the chemical liquid include, but are not limited to, a case where the inorganic substance is contained in a raw material (for example, an organic solvent) used for manufacturing the chemical liquid, a case where the inorganic substance is mixed into the liquid to be purified in the manufacturing process of the chemical liquid (for example, contamination), and the like.

(Resin)

The liquid to be purified may contain a resin.

The chemical liquid may further contain a resin. As the resin, a resin P having a group which is decomposed by the action of an acid and generates a polar group is more preferable. As such a resin, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also referred to as an "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group leaving by an acid (acid leaving group). Examples of the acid leaving group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

(Formula (AI): Repeating Unit Having Acid-Decomposable Group)

It is preferable that the resin P contains a repeating unit represented by Formula (AI).

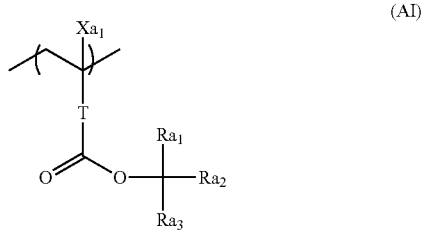

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —($CH_2$)$_2$— group, or a —($CH_2$)$_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group having a hetero atom such as a carbonyl group.

As the repeating unit represented by Formula (AI), for example, an embodiment is preferable in which $Ra_1$ is a methyl group or an ethyl group, and $Ra_2$ and $Ra_3$ are bonded to each other to form the cycloalkyl group described above.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

(Repeating Unit Having Lactone Structure)

Furthermore, it is preferable that the resin P contains a repeating unit Q having a lactone structure.

The repeating unit Q having a lactone structure preferably has a lactone structure on a side chain. The repeating unit Q is more preferably a repeating unit derived from a (meth)acrylic acid derivative monomer.

One kind of repeating unit Q having a lactone structure may be used singly, or two or more kinds of repeating units Q may be used in combination. However, it is preferable to use one kind of repeating unit Q singly.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).
LC1-1
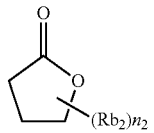
LC1-2
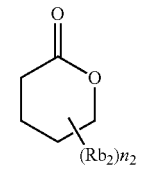
LC1-3
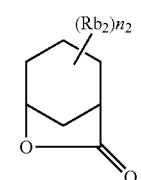
LC1-4
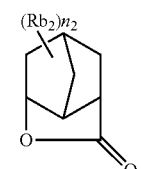
LC1-5
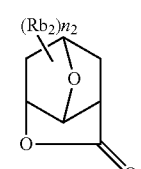
LC1-6
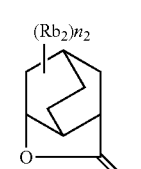
LC1-7
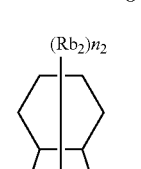
LC1-8
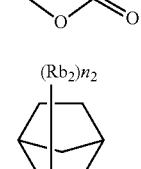
-continued
LC1-9
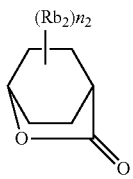
LC1-10
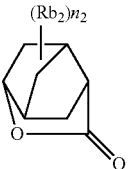
LC1-11
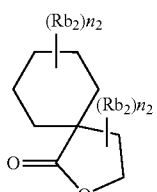
LC1-12
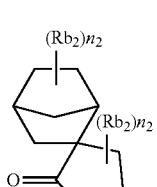
LC1-13
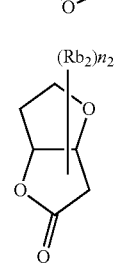
LC1-14
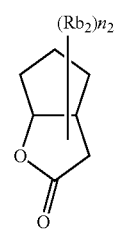
LC1-15
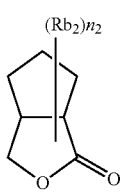
LC1-16
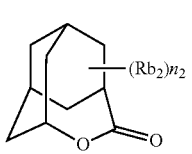

LC1-17

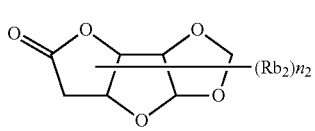

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and the plurality of substituents ($Rb_2$) may be bonded to each other to form a ring.

(Repeating Unit Having Phenolic Hydroxyl Group)

The resin P may also contain a repeating unit having a phenolic hydroxyl group.

Examples of the repeating unit having a phenolic hydroxyl group include a repeating unit represented by General Formula (I).

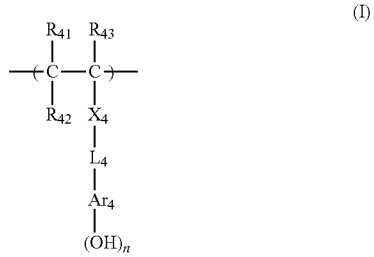

In the formula, $R_{41}$, $R_{42}$ and $R_{43}$ each independently represent a hydrogen atom, an alkyl group, a halogen atom, a cyano group, or an alkoxycarbonyl group. Here, $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group included in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. In a case where n is 1, the divalent aromatic ring group may have a substituent, and examples thereof include arylene groups having 6 to 18 carbon atoms, such as a phenylene group, a tolylene group, a naphthylene group, and an anthracenylene group, and aromatic ring groups having a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further have a substituent.

Examples of the substituent that the aforementioned alkyl group, cycloalkyl group, alkoxycarbonyl group, alkylene group, and (n+1)-valent aromatic ring group can have include the alkyl group exemplified above as $R_{41}$, $R_{42}$, and $R_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by $R_{64}$ in —CONR$_{64}$— ($R_{64}$ represents a hydrogen atom or an alkyl group) represented by $X_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may have a substituent. Among these, an alkyl group having 8 or less carbon atoms is more preferable.

$X_4$ is preferably a single bond, —COO— or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, and an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diamantyl group, or a norbornane group. As the polar group, a hydroxyl group or a cyano group is preferable.

In a case where the resin P contains a repeating unit containing an organic group having a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Represented by General Formula (VI))

The resin P may also contain a repeating unit represented by General Formula (VI).

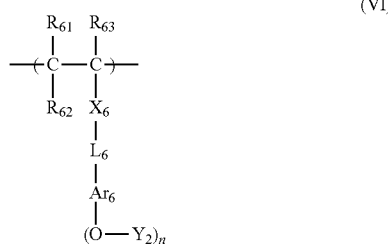

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$'s represents a group which leaves by the action of an acid.

n represents an integer of 1 to 4.

As the group $Y_2$ which leaves by the action of an acid, a structure represented by General Formula (VI-A) is preferable.

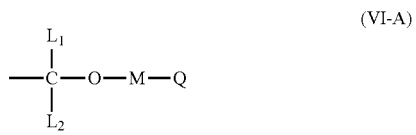

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may have a hetero atom, an aryl group which may have a hetero atom, an amino group, an ammonium group, a mercapto group, a cyano group, or an aldehyde group.

At least two out of Q, M and $L_1$ may be bonded to each other to form a ring (preferably a 5- or 6-membered ring).

The repeating unit represented by General Formula (VI) is preferably a repeating unit represented by General Formula (3).

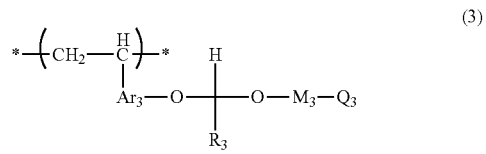

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may be bonded to each other to form a ring.

The aromatic ring group represented by $Ar_3$ is the same as $Ar_6$ in General Formula (VI) in which n is 1. The aromatic ring group is preferably a phenylene group or a naphthylene group, and more preferably a phenylene group.

(Repeating Unit Having Silicon Atom on Side Chain)

The resin P may further contain a repeating unit having a silicon atom on a side chain. Examples of the repeating unit having a silicon atom on a side chain include a (meth)acrylate-based repeating unit having a silicon atom, a vinyl-based repeating unit having a silicon atom, and the like. The repeating unit having a silicon atom on a side chain is typically a repeating unit having a group, which has a silicon atom, on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and $R^1$ each independently represent a monovalent substituent. * represents a bond.

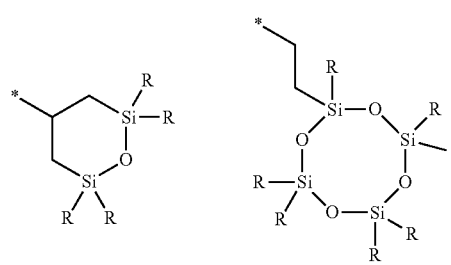

-continued

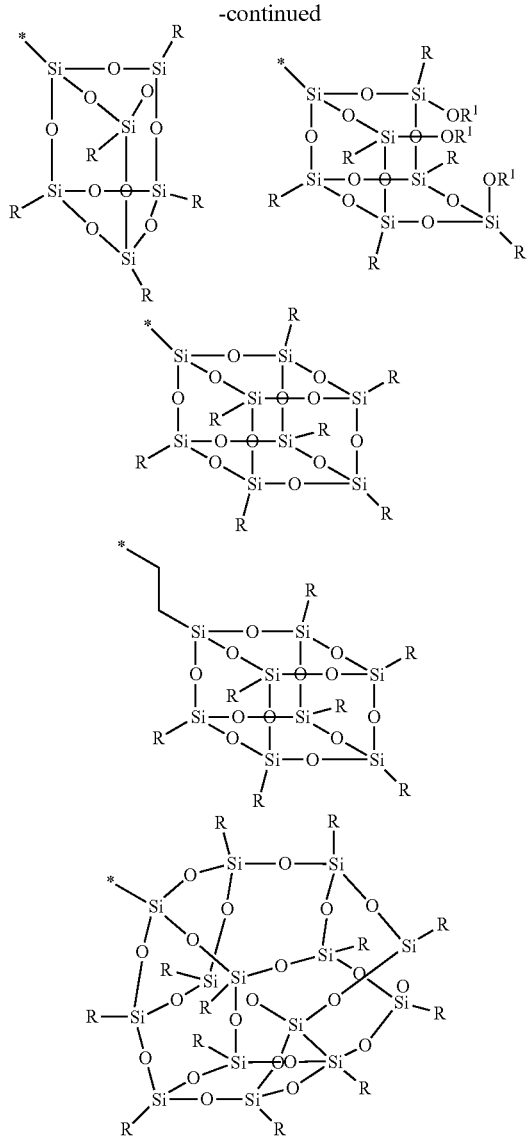

As the repeating unit having the aforementioned group, for example, a repeating unit derived from an acrylate or methacrylate compound having the aforementioned group or a repeating unit derived from a compound having the aforementioned group and a vinyl group is preferable.

In a case where the resin P has the repeating unit having a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be contained in the chemical liquid, any known components can be used.

<Aqueous Liquid to be Purified>

The aqueous liquid to be purified contains water in an amount greater than 50% by mass with respect to the total mass of solvents contained in the liquid to be purified. The content of water is preferably 50% to 95% by mass.

The water is not particularly limited, but it is preferable to use ultrapure water used for manufacturing semiconductors. The ultrapure water is more preferably used after being further purified such that the inorganic anions, metal ions, and the like are reduced. The purification method is not particularly limited, but is preferably purification using a filtration membrane or an ion-exchange membrane and purification by distillation. Furthermore, for example, it is preferable to perform purification by the method described in JP2007-254168A.

(Oxidant)

The aqueous liquid to be purified may contain an oxidant. As the oxidant, known oxidants can be used without particular limitation. Examples of the oxidant include hydrogen peroxide, a peroxide, nitric acid, nitrate, iodate, periodate, hypochlorite, chlorite, chlorate, perchlorate, persulfate, dichromate, permanganate, aqueous ozone, a silver (II) salt, an iron (III) salt, and the like.

The content of the oxidant is not particularly limited, but is preferably equal to or greater than 0.1% by mass and equal to or smaller than 99.0% by mass with respect to the total mass of a polishing liquid. One kind of oxidant may be used singly, or two or more kinds of oxidants may be used in combination. In a case where two or more kinds of oxidants are used in combination, the total content thereof is preferably within the above range.

(Inorganic Acid)

The aqueous liquid to be purified may contain an inorganic acid. As the inorganic acid, known inorganic acids can be used without particular limitation. Examples of the inorganic acid include sulfuric acid, phosphoric acid, hydrochloric acid, and the like. The inorganic acid is not included in the oxidant described above.

The content of the inorganic acid in the liquid to be purified is not particularly limited, but is preferably equal to or greater than 0.1% by mass and equal to or smaller than 99.0% by mass with respect to the total mass of the liquid to be purified.

One kind of inorganic acid may be used singly, or two or more kinds of inorganic acids may be used in combination. In a case where two or more kinds of inorganic acids are used in combination, the total content thereof is preferably within the above range.

(Anticorrosive)

The aqueous liquid to be purified may contain an anticorrosive. As the anticorrosive, known anticorrosives can be used without particular limitation. Examples of the anticorrosive include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyl triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyl tetrazole, bismuthiol I, 1,3-dimethyl-2-imidazolidinone, 1,5-pentamethylene tetrazole, 1-phenyl-5-mercaptotetrazole, diaminomethyltriazine, imidazolinethion, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, thiourea, 1,1,3,3-tetramethylurea, urea, urea derivatives, uric acid, potassium ethylxanthate, glycine, dodecyl phosphate, iminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced), cysteine, cystine, thiophene, mercaptopyridine N-oxide, thiamine HCl, tetraethylthiuram disulfide, 2,5-dimercapto-1,3-thiadiazole ascorbic acid, catechol, t-butyl catechol, phenol, and pyrogallol.

As the anticorrosive, it is also possible to use aliphatic carboxylic acids such as dodecanoic acid, palmitic acid, 2-ethylhexanoic acid, and cyclohexanoic acid; carboxylic acids having a chelating ability such as citric acid, malic acid, oxalic acid, malonic acid, succinic acid, itaconic acid, maleic acid, glycolic acid, mercaptoacetic acid, thioglycolic acid, salicylic acid, sulfosalicylic acid, anthranilic acid, N-methylanthranilic acid, 3-amino-2-naphthoic acid, 1-amino-2-naphthoic acid, 2-amino-1-naphthoic acid, 1-aminoanthraquinone-2-carboxylic acid, tannic acid, and gallic acid; and the like.

Examples of the anticorrosive also include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate salt, a polyoxyethylene alkyl ether phosphate salt, and a polyoxyethylene allyl phenyl ether phosphate salt; cationic surfactants such as oleylamine acetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; nonionic surfactants of a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyalkylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris (polyoxyalkylene) ether.

Examples of commercial products of the above anticorrosives include NEWCALGEN FS-3PG (manufactured by TAKEMOTO OIL & FAT Co., Ltd.), PHOSTEN HLP-1 (manufactured by Nikko Chemicals Co., Ltd.), and the like.

As the anticorrosive, a hydrophilic polymer can also be used.

Examples of the hydrophilic polymer include polyglycols such as polyethylene glycol, an alkyl ether of polyglycols, polyvinyl alcohol, polyvinyl pyrrolidone, polysaccharides such as alginic acid, carboxylic acid-containing polymers such as polymethacrylic acid and polyacrylic acid, polyacrylamide, polymethacrylamide, polyethyleneimine, and the like. Specific examples of these hydrophilic polymers include the water-soluble polymers described in paragraphs "0042" to "0044" in JP2009-088243A and paragraph "0026" in JP2007-194261A.

As the anticorrosive, a cerium salt can also be used.

As the cerium salt, known cerium salts can be used without particular limitation.

Examples of the cerium salt include trivalent cerium salts such as cerium acetate, cerium nitrate, cerium chloride, cerium carbonate, cerium oxalate, and cerium sulfate and tetravalent cerium salts such as cerium sulfate, cerium ammonium sulfate, cerium ammonium nitrate, diammonium cerium nitrate, cerium hydroxide, and the like.

The anticorrosive may include substituted or unsubstituted benzotriazole. Suitable substituted benzotriazole includes, but is not limited to, benzotriazole substituted with an alkyl group, an aryl group, a halogen group, an amino group, a nitro group, an alkoxy group, or a hydroxyl group. The substituted benzotriazole also includes compounds fused by one or more aryl (for example, phenyl) or heteroaryl groups.

The content of the anticorrosive in the liquid to be purified with respect to the total mass of the chemical liquid is preferably adjusted to 0.01% to 5% by mass, more preferably adjusted to 0.05% to 5% by mass, and even more preferably adjusted to 0.1% to 3% by mass.

One kind of anticorrosive may be used singly, or two or more kinds of anticorrosives may be used in combination. In a case where two or more kinds of anticorrosives are used in combination, the total content thereof is preferably within the above range.

(Organic Solvent)

The aqueous liquid to be purified may contain an organic solvent. The organic solvent is not particularly limited, and is the same as the aforementioned liquid to be purified contained in the organic solvent-based liquid to be purified. In a case where the aqueous liquid to be purified contains an organic solvent, the content of the organic solvent is preferably 5% to 35% by mass with respect to the total mass of solvents contained in the liquid to be purified.

[Physical Properties of Liquid to be Purified: pH]

The pH of the liquid to be purified is not particularly limited. However, in view of obtaining a chemical liquid having further improved defect inhibition performance, the pH is preferably 0 to 9, and more preferably 0 to 7. In the present specification, the pH of the liquid to be purified means a value measured by the glass electrode method using the liquid to be purified adjusted to 25° C.

[Filtration Step]

The method for manufacturing a chemical liquid according to the present embodiment includes a filtration step of filtering the liquid to be purified by using the filtering device described above so as to obtain a chemical liquid.

The filtering device has a flow path formed by arranging the filter A and the filter B in series. The feed pressure of the liquid to be purified supplied to each filter is not particularly limited, but is preferably 0.00010 to 1.0 MPa in general.

Particularly, in view of obtaining a chemical liquid having further improved defect inhibition performance, a feed pressure $P_2$ is preferably 0.00050 to 0.090 MPa, more preferably 0.0010 to 0.050 MPa, and even more preferably 0.0050 to 0.040 MPa.

The filtration pressure affects the filtration accuracy. Therefore, it is preferable that the pulsation of pressure during filtration is as low as possible.

The filtration speed is not particularly limited. However, in view of easily obtaining a chemical liquid having further improved defect inhibition performance, the filtration speed is preferably equal to or higher than 1.0 L/min/m², more preferably equal to or higher than 0.75 L/min/m², and even more preferably equal to or higher than 0.6 L/min/m².

For the filter, an endurable differential pressure for assuring the filter performance (assuring that the filter will not be broken) is set. In a case where the endurable differential pressure is high, by increasing the filtration pressure, the filtration speed can be increased. That is, it is preferable that the upper limit of the filtration speed is generally equal to or lower than 10.0 L/min/m² although the upper limit usually depends on the endurable differential pressure of the filter.

The temperature at which the liquid to be purified passes through the filter is not particularly limited, but is preferably less than room temperature in general.

The filtration step is preferably performed in a clean environment. Specifically, the filtration step is preferably performed in a clean room that satisfies Class 1000 (Class 6 in ISO14644-1:2015) of Federal Standard (Fed. Std. 209E), more preferably performed in a clean room that satisfies Class 100 (Class 5 in ISO14644-1:2015), even more preferably performed in a clean room that satisfies Class 10 (Class 4 in ISO14644-1: 2015), and particularly preferably performed in a clean room that has a cleanliness (Class 2 or Class 1) equal to or higher than Class 1 (Class 3 in ISO14644-1: 2015).

It is preferable that each step which will be described later is also performed in the clean environment described above.

In a case where the filtering device has a return flow path, the filtration step may be a circulation filtration step. The circulation filtration step is a step of filtering the liquid to be purified by at least the filter A, returning the liquid to be purified having been filtered through the filter A to the upstream of the filter A in the flow path, and filtering again the liquid to be purified through the filter A.

The number of times of the circulation filtration is not particularly limited, but is preferably 1 to 10 in general. During the circulation filtration, the liquid to be purified may be returned to the upstream of the filter A such that the filtration by the filter A is repeated. At this time, the return flow path may be adjusted such that the filtration by at least one filter B is also repeated in addition to the filtration by the filter A.

[Other Steps]

The method for manufacturing a chemical liquid according to the present embodiment may include steps other than the above step. Examples of the steps other than the above step include a filter washing step, a device washing step, an electricity removing step, a step of preparing a liquid to be purified, and the like. Hereinafter, each of the steps will be specifically described.

<Filter Washing Step>

The filter washing step is a step of washing the filter A and the filter B before the filtration step. The method of washing the filter is not particularly limited, and examples thereof include a method of immersing the filter in an immersion solution, a method of washing the filter by passing a washing solution through the filter, a combination of these, and the like.

(Method of Immersing Filter in Immersion Solution)

Examples of the method of immersing the filter in the immersion solution include a method of filling a container for immersion with the immersion solution and immersing the filter in the immersion solution.

Immersion Solution

As the immersion solution, known immersion solutions can be used without particular limitation. Particularly, in view of obtaining further improved effects of the present invention, the immersion solution preferably contains water or an organic solvent as a main component, and more preferably contains an organic solvent as a main component. In the present specification, the main component means a component of which the content is equal to or greater than 99.9% by mass with respect to the total mass of the immersion solution. The content of the main component is more preferably equal to or greater than 99.99% by mass.

The organic solvent is not particularly limited, and it is possible to use the organic solvent described above as the organic solvent contained in the liquid to be purified. Particularly, in view of obtaining further improved effects of the present invention, it is preferable that the immersion solution contains at least one kind of organic solvent selected from the group consisting of an ester-based solvent and a ketone-based solvent. Furthermore, these may be used in combination.

Examples of the ester-based solvent include, but are not limited to, ethyl acetate, methyl acetate, butyl acetate, sec-butyl acetate, methoxybutyl acetate, amyl acetate, normal propyl acetate, isopropyl acetate, ethyl lactate, methyl lactate, butyl lactate, and the like.

Examples of the ketone-based solvent include, but are not limited to, acetone, 2-heptanone (MAK), methyl ethyl ketone (MEK), methyl isobutyl ketone, diisobutyl ketone, cyclohexanone, diacetone alcohol, and the like.

The time for which the filter is immersed in the immersion solution is not particularly limited. However, in view of obtaining further improved effects of the present invention, it is preferable that the filter is immersed in the immersion solution for 7 days to 1 year.

The temperature of the immersion solution is not particularly limited. However, in view of obtaining further improved effects of the present invention, the temperature of the immersion solution is preferably equal to or higher than 20° C.

Examples of the method of immersing the filter in the immersion solution include a method of filling a container for immersion with the immersion solution and immersing the filter in the immersion solution.

As the container for immersion, it is possible to use the housing that the filter unit in the aforementioned filtering device has. That is, for example, it is possible to use a method of filling the housing with the immersion solution in a state where the filter (typically, a filter cartridge) is stored in the housing that the filtering device has and leaving the filter to stand still as it is.

In addition to the above method, for example, it is possible to use a method of preparing a container for immersion in addition to the housing that the filtering device has (that is, preparing a container for immersion on the outside of the filtering device), filling the additionally prepared container for immersion with the immersion solution, and immersing the filter in the immersion solution.

Particularly, it is preferable to use a method of filling the container for immersion prepared on the outside of the filtering device with the immersion solution and immersing the filter in the immersion solution, because then the impurities eluted from the filter are not mixed into the filtering device.

The shape and size of the container for immersion are not particularly limited and can be appropriately selected according to the number and size of the filters to be immersed, and the like.

The material of the container for immersion is not particularly limited, and it is preferable that at least a liquid contact portion of the container is formed of the anticorrosive material described above.

The material of the container for immersion preferably contains at least one kind of material selected from the group consisting of polyfluorocarbon (such as PTFE, PFA: perfluoroalkoxyalkane and PCTFE: polychlorotrifluoroethylene), PPS (polyphenylene sulfide), POM (polyoxymethylene), and polyolefin (PP and PE, etc.), more preferably contains at least one kind of material selected from the group consisting of polyfluorocarbon, PPS, and POM, even more preferably contains polyfluorocarbon, particularly preferably contains at least one kind of material selected from the group consisting of PTFE, PFA, and PCTFE, and most preferably contains PTFE.

Furthermore, it is preferable that the container for immersion is washed before use. During washing, it is preferable to perform washing (so-called pre-washing) by using the immersion solution.

(Method of Washing by Passing Washing Solution Through Filter)

The method of washing the filter by passing the washing solution through the filter is not particularly limited. For example, by storing the filter (typically, a filter cartridge) in the filter housing of the filter unit of the filtering device described above and introducing the washing solution into the filter housing, the washing solution is passed through the filter.

During washing, the impurities having adhered to the filter migrate to (typically, dissolve in) the washing solution, and thus the content of impurities in the washing solution increases. Therefore, it is preferable that the washing solution once passed through the filter is discharged out of the filtering device without being reused for washing. In other words, it is preferable not to perform circulation washing.

As another form of the method of washing the filter by passing the washing solution through the filter, for example, there is a method of washing the filter by using a washing device. In the present specification, the washing device means a device different from the filtering device that is provided on the outside of the filtering device. Although the form of the washing device is not particularly limited, it is possible to use a device having the same constitution as that of the filtering device.

Washing Solution

As the washing solution which is used in a case where the filter is washed by passing the washing solution through the filter, known washing solutions can be used without particular limitation. Particularly, in view of obtaining further improved effects of the present invention, the form of the washing solution is preferably the same as that of the immersion solution described above.

<Device Washing Step>

The device washing step is a step of washing the liquid contact portion of the filtering device before the filtration step. The method of washing the liquid contact portion of the filtering device before the filtration step is not particularly limited. Hereinafter, the method will be described by taking a filtering device, in which the filter is a cartridge filter that is stored in a housing disposed on a flow path, as an example.

It is preferable that the device washing step includes a step A of washing the liquid contact portion of the filtering device by using a washing solution in a state where the cartridge filter is detached from the housing, and a step B of storing the cartridge filter in the housing after the step A and washing the liquid contact portion of the filtering device by using a washing solution.

Step A

The step A is a step of washing the liquid contact portion of the filtering device by using a washing solution in a state where the cartridge filter is detached from the housing. "In a state where the filter is detached from the housing" means that the liquid contact portion of the filtering device is washed using a washing solution after the filter cartridge is detached from the housing or before the filter cartridge is stored in the housing.

There is no particular limitation on the method of washing the liquid contact portion of the filtering device by using a washing solution in a state where the filter is detached from the housing (hereinafter, also described as "filtering device not storing the filter"). Examples thereof include a method of introducing the washing solution from the inlet portion and collecting the washing solution from the outlet portion.

Particularly, in view of obtaining further improved effects of the present invention, examples of the method of washing the liquid contact portion of the filtering device not storing the filter by using a washing solution include a method of filling the filtering device not storing the filter with a washing solution. In a case where the filtering device not storing the filter is filled with a washing solution, the liquid contact portion of the filtering device not storing a filter contacts the washing solution. As a result, impurities having adhered to the liquid contact portion of the filtering device migrate to (typically, eluted in) the washing solution. After washing, the washing solution may be discharged out of the filtering device (typically, the washing solution may be discharged from the outlet portion).

Washing Solution

As the washing solution, known washing solutions can be used without particular limitation. Particularly, in view of obtaining further improved effects of the present invention, the washing solution preferably contains water or an organic solvent as a main component, and more preferably contains an organic solvent as a main component. In the present specification, the main component means a component of which the content is equal to or greater than 99.9% by mass with respect to the total mass of the washing solution. The content of the main component is more preferably equal to or greater than 99.99% by mass.

The organic solvent is not particularly limited, and it is possible to use water and the organic solvent described above as the organic solvent that the chemical liquid contains. As the organic solvent, in view of obtaining further improved effects of the present invention, at least one kind of compound is preferable which is selected from the group consisting of PGMEA, cyclohexanone, ethyl lactate, butyl acetate, MIBC, MMP (3-methylmethoxypropionate), MAK, n-pentyl acetate, ethylene glycol, isopentyl acetate, PGME, methyl ethyl ketone (MEK), 1-hexanol, and decane.

Step B

The step B is a method of washing the filtering device by using a washing solution in a state where a filter is stored in the housing.

As the method of washing the filtering device by using a washing solution, in addition to the washing method in the step A described above, a method of passing a washing solution through the filtering device can also be used. The method of passing the washing solution through the filtering device is not particularly limited. The washing solution may be introduced from the inlet portion and discharged from the outlet portion. As the washing solution usable in this step, the washing solution described in the step A can be used without particular limitation.

<Electricity Removing Step>

The electricity removing step is a step of removing electricity from the liquid to be purified such that the charge potential of the liquid to be purified is reduced. As the electricity removing method, known electricity removing methods can be used without particular limitation. Examples of the electricity removing method include a method of bringing the liquid to be purified into contact with a conductive material.

The contact time for which the liquid to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the liquid to be purified into contact with a conductive material include a method of disposing a grounded mesh consisting of a conductive material such that the mesh crosses the flow path and passing the liquid to be purified through the mesh.

<Step of Preparing Liquid to be Purified>

The step of preparing a liquid to be purified is a step of preparing a liquid to be purified that will be caused to flow into the filtering device from the inlet portion of the filtering device. The method of preparing the liquid to be purified is not particularly limited. Typically, examples thereof include a method of purchasing commercial products (for example, those called "high-purity grade products"), a method of reacting one kind or two or more kinds of raw materials so as to obtain a liquid to be purified, a method of dissolving components in a solvent, and the like.

As the method of obtaining a liquid to be purified (typically, a liquid to be purified containing an organic solvent) by reacting the raw materials, known methods can be used without particular limitation. For example, it is possible to use a method of reacting one or two or more raw materials in the presence of a catalyst so as to obtain a liquid to be purified containing an organic solvent.

More specifically, examples thereof include a method of obtaining butyl acetate by reacting acetic acid and n-butanol in the presence of sulfuric acid; a method of obtaining 1-hexanol by reacting ethylene, oxygen, and water in the presence of $Al(C_2H_5)_3$; a method of obtaining 4-methyl-2-pentanol by reacting cis-4-methyl-2-pentene in the presence of Diisopinocamphenyl borane ($Ipc_2BH$); a method for obtaining propylene glycol 1-monomethyl ether 2-acetate (PGMEA) by reacting propylene oxide, methanol and acetic acid in the presence of sulfuric acid; a method of obtaining isopropyl alcohol (IPA) by reacting acetone and hydrogen in the presence of copper oxide-zinc oxide-aluminum oxide; a method of obtaining ethyl lactate by reacting lactic acid and ethanol; and the like.

In addition, this step may have a pre-purification step of purifying the liquid to be purified in advance before the liquid is caused to flow into the filtering device. The pre-purification step is not particularly limited, and examples thereof include a method of purifying the liquid to be purified by using a distillation device.

In the pre-purification step, the method of purifying the liquid to be purified by using a distillation device is not particularly limited. Examples thereof include a method of purifying the liquid to be purified in advance by using a distillation device prepared separately from the filtering device so as to obtain a distilled liquid to be purified, storing the liquid in a portable tank, and transporting the tank to the filtering device so as to introduce the liquid into the filtering device, and a method of using a purification device which will be described later.

First, by using FIG. 11, a method (pre-purification step) of purifying the liquid to be purified in advance by using a distillation device prepared separately from the filtering device will be described.

Figure 11:
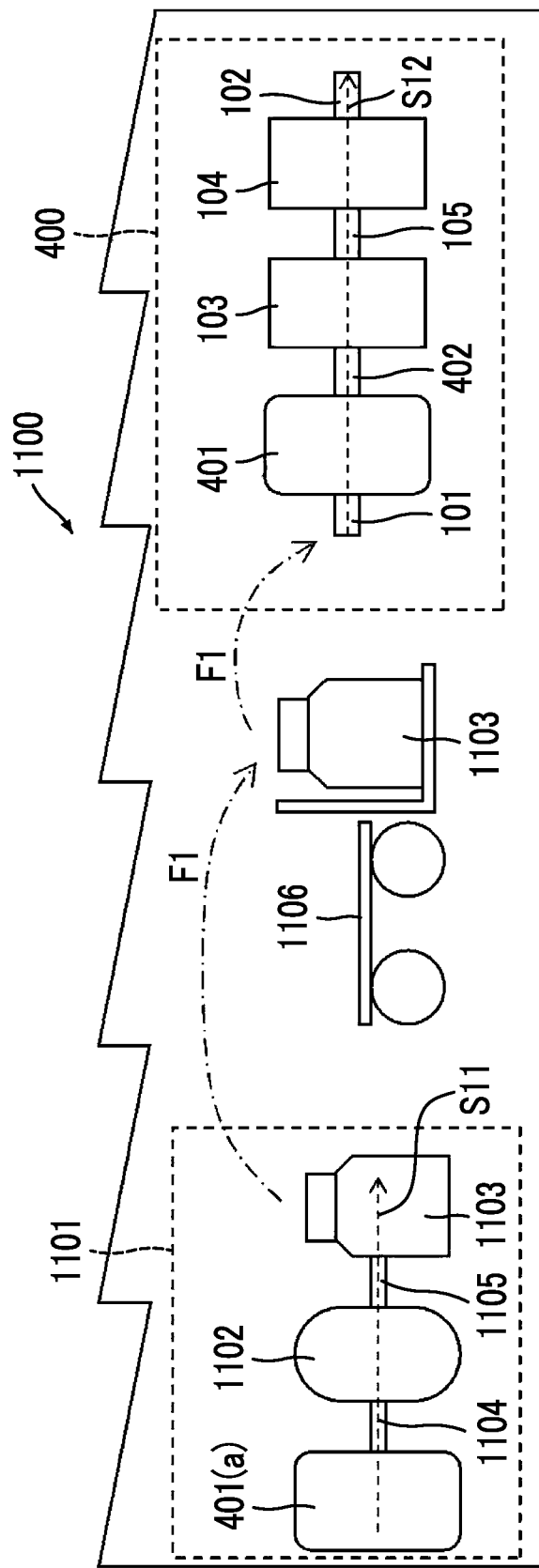
FIG. 11 is a schematic view showing a procedure of a pre-purification step performed in a case where a distillation device and a filtering device are arranged in the same manufacturing plant.

FIG. 11 is a schematic view showing the relationship between the devices in a case where a chemical liquid is manufactured using a distilled liquid to be purified that is purified in advance by a distiller.

In FIG. 11, the form of a filtering device 400 is the same as that of the filtering device according to the third embodiment of the present invention described above. Therefore, the filtering device 400 will not be described.

In a chemical liquid manufacturing plant 1100, a filtering device 400 and a distillation device 1101 are arranged. The distillation device 1101 has a tank 401(*a*), a distiller 1102, and a portable tank 1103, which are connected to one another through a piping 1104 and a piping 1105. The tank 401(*a*), the piping 1104, the distiller 1102, the piping 1105, and the portable tank 1103 form a flow path S11.

The form of the tank 401(*a*) and each piping is not particularly limited, and it is possible to use the tank and piping of the same form as described above as the tank and the piping included in the filtering device according to an embodiment of the present invention. As the distiller 1102, it is possible to use the same distiller as the distiller included in the purification device according to an embodiment of the present invention. The form of the distiller 1102 will be described later.

In the distillation device 1101, a liquid to be purified introduced into the tank 401(*a*) is distilled by the distiller 1102, and the obtained distilled liquid to be purified is stored in the portable tank 1103. Although the form of the portable tank is not particularly limited, it is preferable that at least a portion of the liquid contact portion of the tank (preferably 90% or more of the surface area of the liquid contact portion and more preferably 99% or more of the surface area of the liquid contact portion) consists of the anticorrosive material which will be described later.

The distilled liquid to be purified temporarily stored in the portable tank 1103 is transported by a transporting unit 1106 (the flow of F1 in FIG. 11). Then, the distilled liquid to be purified is introduced into the filtering device 400 from the inlet portion 101 of the filtering device.

In FIG. 11, an embodiment is described in which a distillation device and a filtering device are arranged in the same manufacturing plant. However, the distillation device and the filtering device may be arranged in different manufacturing plants.

Next, a pre-purification step using a purification device having a distiller and a filtering device will be described. First, the purification device used in this step will be described.

(Purification Device)

The purification device used in this step has the filtering device described above. The purification device according to an embodiment of the present invention has the filtering device described above, a second inlet portion, a second outlet portion, and at least one distiller disposed between the second inlet portion and the second outlet portion, in which the second outlet portion is connected to an inlet portion of the filtering device described above, and a flow path extending from the second inlet portion to the outlet portion of the filtering device is formed. Hereinafter, the purification device will be described with reference to drawings.

In the following section, the details relating to the constitution of the filtering device will not be described because they are the same as those described above.

First Embodiment of Purification Device

Figure 12:
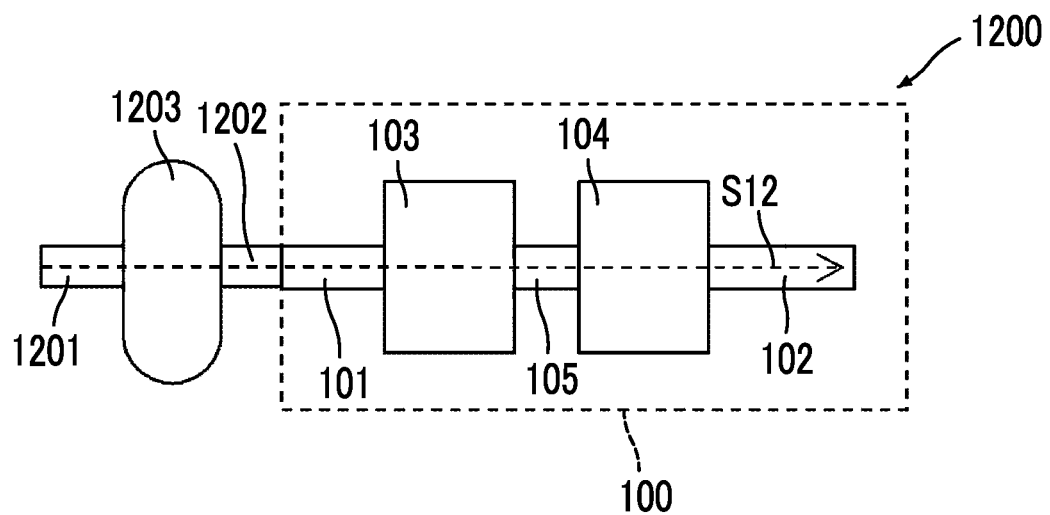
FIG. 12 is a schematic view illustrating a purification device according to the first embodiment of the present invention.

FIG. 12 is a schematic view illustrating a first embodiment of the purification device of the present invention. A purification device 1200 has a second inlet portion 1201, a second outlet portion 1202, and a distiller 1203 disposed between the second inlet portion 1201 and the second outlet portion 1202, in which the second outlet portion 1202 is connected to an inlet portion 101 of the filtering device. Therefore, in the purification device 1200, by the second inlet portion 1201, the distiller 1203, the second outlet portion 1202, the inlet portion 101, the filter 103 (filter A), a piping 105, the filter 104 (filter BD), and the outlet portion 102, a flow path S12 is formed.

That is, the distiller 1203 is connected to the inlet portion 101 of the filtering device 100.

The liquid to be purified having flowed into the purification device 1200 from the second inlet portion 1201 is distilled in the distiller 1203, and then is introduced into the filtering device 100 from the inlet portion 101 through the second outlet portion 1202. In a case where the pre-purification step is performed using the present purification device, the next step (filtration step) can be performed without discharging the distilled liquid to be purified outside the device. Therefore, a chemical liquid having further improved defect inhibition performance can be obtained.

The form of the distiller 1203 is not particularly limited, and known distillers (for example, a distillation column) can be used. As the material of the distiller 1203, it is possible to use the same material as that of the housing described above. Particularly, it is preferable that at least a portion of the liquid contact portion of the distiller 1203 consists of the anticorrosive material which will be described later. It is preferable that 90% or more of the area of the liquid contact portion consists of the anticorrosive material. It is more preferable that 99% of the area of the liquid contact portion consists of the anticorrosive material.

As the distiller, known distillers can be used without particular limitation. The distiller may be a batch type or a continuous type, but is preferably a continuous type. Furthermore, the distiller may be filled with a filler. Although the form of the filler is not particularly limited, it is preferable that at least a part of the liquid contact portion of the distiller consists of the anticorrosive material which will be described later. It is preferable that 90% or more of the area of the liquid contact portion consists of the anticorrosive material. It is more preferable that 99% of the area of the liquid contact portion consists of the anticorrosive material.

In FIG. 12, the purification device 1200 has a filtering device of an embodiment (for example, the first embodiment of the filtering device) in which the filter A and the filter BD are arranged in series in this order between the inlet portion and the outlet portion. However, instead of this, the purification device may have a filtering device of an embodiment (for example, the second embodiment) in which the filter BU and the filter A are arranged in series in this order between the inlet portion and the outlet portion, and a filtering device of an embodiment (for example, a modification example of the second embodiment) in which the filter BU, the filter A, and the filter BD are arranged in series in this order between the inlet portion and the outlet portion.

Furthermore, in the purification device, on the flow path S12 formed of the second inlet portion 1201, the distiller 1203, the second outlet portion 1202, the inlet portion 101, the filter 103, the piping 105, the filter 104, and the outlet portion 102, a return flow path may be formed which is capable of returning the liquid to be purified to the upstream of the filter 103 (filter A) on the flow path S12 from the downstream side of the filter 103 (filter A). The form of the return flow path is not particularly limited, but is the same as that described in the fifth embodiment of the filtering device. In addition, the form of the return flow path may be the same as that described in the sixth embodiment of the filtering device.

Furthermore, the purification device according to the present embodiment may have a tank on the upstream side and/or the downstream side of the filter 103 on the flow path S12. The form of the tank is not particularly limited, and the same tank as that described above can be used.

Second Embodiment of Purification Device

Figure 13:
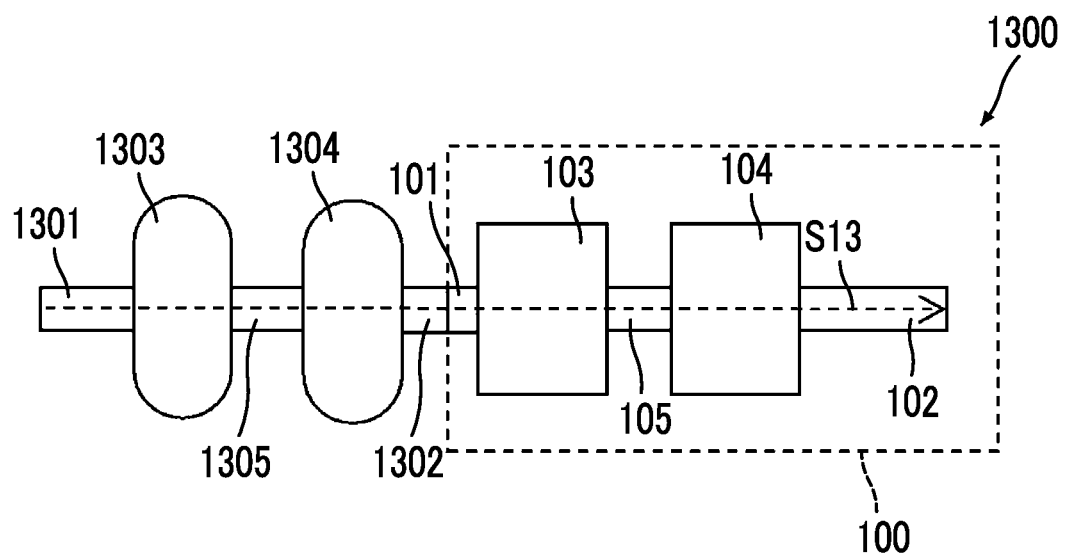
FIG. 13 is a schematic view illustrating a purification device according to the second embodiment of the present invention.

FIG. 13 is a schematic view illustrating a second embodiment of the purification device. A purification device 1300 has a second inlet portion 1301, a second outlet portion 1302, and a distiller 1303 and a distiller 1304 arranged in series between the second inlet portion 1301 and the second outlet portion 1302, in which the second outlet portion 1302 is connected to an inlet portion 101 of the filtering device. Therefore, in the purification device 1300, by the second inlet portion 1301, the distiller 1303, a piping 1305, the distiller 1304, the second outlet portion 1302, the inlet portion 101, the filter 103 (filter A), the piping 105, the filter 104 (filter BD), and the outlet portion 102, a flow path S13 is formed.

That is, the purification device according to the present embodiment includes a plurality of distillers connected in series. In a case where the purification device includes three or more distillers connected in series, the last distiller is connected to the filtering device.

In the purification device 1300, the liquid to be purified flowing from the second inlet portion 1301 is distilled by the distiller 1303, flows through the piping 1305, and is introduced into the distiller 1304. FIG. 13 shows an embodiment in which the distiller 1303 and the distiller 1304 are connected to each other through the piping 1305. However, the purification device according to the present embodiment is not limited thereto, and may additionally have a piping capable of returning the condensate of the distiller 1304 to the distiller 1303.

The purification device according to the present embodiment has two distillers. Therefore, in a case where the operating conditions of the two distillers and the like are appropriately controlled, even though the liquid to be purified contains two or more kinds of compounds having different boiling points, the target compound (chemical liquid) can be purified to higher purity.

[Anticorrosive Material]

Next, an anticorrosive material will be described. In the filtering device and the purification device according to the embodiment of the present invention described so far, it is preferable that at least a portion of the liquid contact portion of the devices is formed of an anticorrosive material. It is preferable that 90% or more of the liquid contact portion is formed of an anticorrosive material. It is more preferable that 99% or more of the liquid contact portion is formed of an anticorrosive material.

The state where the liquid contact portion is formed of an anticorrosive material is not particularly limited. Typically, for example, each member (for example, the tank described so far or the like) is formed of an anticorrosive material, or each member has a base material and a coating layer which is disposed on the base material and formed of an anticorrosive material.

The anticorrosive material is a nonmetallic material or an elecltropolished metallic material. Examples of the nonmetallic material include, but are not particularly limited to, a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, a vinyl fluoride resin, and the like.

The metallic material is not particularly limited, and examples thereof include a metallic material in which the total content of Cr and Ni is greater than 25% by mass with respect to the total mass of the metallic material. The total content of Cr and Ni is particularly preferably equal to or greater than 30% by mass. The upper limit of the total content of Cr and Ni in the metallic material is not particularly limited, but is preferably equal to or smaller than 90% by mass in general.

Examples of the metallic material include stainless steel, a Ni—Cr alloy, and the like.

As the stainless steel, known stainless steel can be used without particular limitation. Particularly, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the Ni—Cr alloy, known Ni—Cr alloys can be used without particular limitation. Particularly, a Ni—Cr alloy with a Ni content of 40% to 75% by mass and a Cr content of 1% to 30% by mass is preferable.

Examples of the Ni—Cr alloy include HASTELLOY (trade name, the same will be applied hereinafter), MONEL (trade name, the same will be applied hereinafter), INCONEL (trade name, the same will be applied hereinafter), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, optionally, the Ni—Cr alloy may further contain B, Si, W, Mo, Cu, Co, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the Cr content in a passive layer on the surface thereof may become higher than the Cr content in the parent phase. Therefore, presumably, in a case where a purification device having a liquid contact portion formed of the elecltropolished metallic material is used, metal impurities containing metal atoms may be hardly eluted into the liquid to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

Method for Manufacturing Chemical Liquid (Second Embodiment)

A method for manufacturing a chemical liquid according to a second embodiment of the present invention is a method for manufacturing a chemical liquid that is for obtaining a chemical liquid by purifying a liquid to be purified. The method includes a step of filtering a liquid to be purified by using a filter A and a filter B different from the filter A, in which the filter A includes at least one kind of porous membrane selected from the group consisting of a first porous membrane having a porous base material made of polytetrafluoroethylene and a non-crosslinked coating which is formed to cover at least a portion of the base material and contains a perfluorosulfonic acid polymer and a second porous membrane containing polytetrafluoroethylene blended with a perfluorosulfonic acid polymer.

Hereinafter, the method for manufacturing a chemical liquid according to the second embodiment will be described. In the following section, the materials, methods, conditions, and the like which are not described are the same as those in the method for manufacturing a chemical liquid according to the first embodiment.

In the method for manufacturing a chemical liquid according to the present embodiment, the liquid to be purified is filtered using the filter A and the filter B different from the filter A. In a case where the liquid to be purified is filtered, the liquid may be passed through the filter A and the filter B in this order, or may be passed through the filter B and the filter A in this order.

The method for manufacturing a chemical liquid according to the present embodiment is not particularly limited as long as the filter A and the filter B are used. In this method, the liquid to be purified may be filtered by sequentially using a plurality of filters A and/or a plurality of filters B.

In a case where the filter B and the filter A are used in this order, the form of the filter B is not particularly limited, but it is preferable to use the filter described above as the filter BU. In a case where filter A and the filter B are used in this order, the form of the filter B is not particularly limited, but it is preferable to use the filter described above as the filter BD.

[Chemical Liquid]

It is preferable that the chemical liquid manufactured using the aforementioned filtering device is used for manufacturing a semiconductor substrate. Particularly, it is more preferable to use the chemical liquid for forming a fine pattern at a node equal to or smaller than 10 nm (for example, a step including pattern formation using EUV).

In other words, the filtration device is preferably used for manufacturing a chemical liquid for manufacturing a semiconductor substrate. Specifically, the filtering device is used for treating an inorganic substance and/or an organic substance after each step is finished or before the next step is started in a semiconductor device manufacturing process including a lithography step, an etching step, an ion implantation step, a peeling step, and the like. To be concrete, the filtering device is more preferably used for manufacturing a washing solution, an etching solution, a rinsing solution, a pre-treatment solution, a resist solution, a prewet solution, a developer, and the like, and even more preferably used for manufacturing at least one kind of solution selected from the group consisting of a washing solution, an etching solution, a rinsing solution, a pre-treatment solution, and a resist solution.

In addition, the aforementioned filtering device can also be used for manufacturing a chemical liquid used for rinsing the edge line of a semiconductor substrate before and after the coating with resist.

Furthermore, the aforementioned filtering device can also be used for manufacturing a diluted solution of a resin contained in a resist solution and for manufacturing a solvent contained in a resist solution.

In addition, the aforementioned filtering device can be used for manufacturing a chemical liquid used for purposes other than the manufacturing of a semiconductor substrate. The filtering device can also be used for manufacturing a developer for polyimide, a resist for sensor, and a resist for lens, a rinsing solution, and the like.

Moreover, the filtering device can be used for manufacturing a solvent for medical uses or for washing. Particularly, the filtering device can be used for manufacturing a chemical liquid used for washing containers, piping, base substrates (for example, a wafer and glass), and the like.

Especially, the filtering device is preferably used for manufacturing at least one kind of chemical liquid selected from the group consisting of a prewet solution, a developer, and a rinsing solution for forming a pattern by using extreme ultraviolet (EUV).

[Chemical Liquid Storage Body]

The chemical liquid manufactured by the filtering device may be stored in a container and preserved until the chemical liquid is used. The container and the chemical liquid stored in the container are collectively referred to as chemical liquid storage body. The preserved chemical liquid is used after being taken out of the chemical liquid storage body.

As a container for preserving the chemical liquid, it is preferable to use a container for semiconductor substrate manufacturing, which has a high internal cleanliness and hardly causes the eluate of impurities into the chemical liquid during the preservation of the chemical liquid.

Examples of usable containers include, but are not limited to, a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that at least a portion of the liquid contact portion of the container consists of the anticorrosive material described above. In view of obtaining further improved effects of the present invention, it is preferable that 90% or more of the area of the liquid contact portion consists of the material described above.

EXAMPLES

Hereinafter, the present invention will be more specifically described based on examples. The material components, the amount and proportion thereof used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation of chemical liquids, filling, preservation, and analytical measurement were all performed in a clean room of a level satisfying ISO class 2 or 1. In order to improve the measurement accuracy, in the process of measuring the content of the organic impurities and the content of metal atoms, in a case where the content of the organic impurities or metal atoms was found to be equal to or smaller than a detection limit by general measurement, the chemical liquid was concentrated by $1/100$ in terms of volume for performing the measurement, and the content was calculated by converting the concentration into the concentration of the chemical liquid not yet being concentrated. The tools such as a device or a filter used for purification and a container were used after the surface contacting the chemical liquid was thoroughly washed with a chemical liquid purified in advance by the same method.

Test Example 1: Purification of Organic Solvent-Based Liquid to be Purified and Performance Evaluation of Chemical Liquid

[Manufacturing of Chemical Liquid 1]

Figure 14:
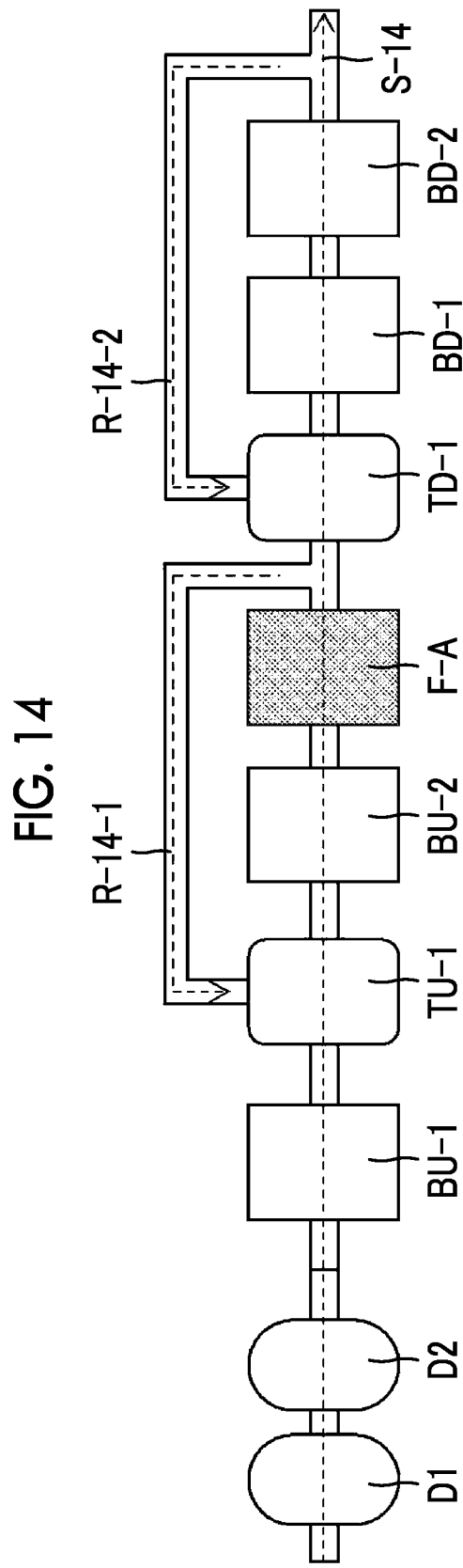
FIG. 14 is a schematic view illustrating a purification device according to an embodiment of the present invention.

A chemical liquid 1 was manufactured using the purification device shown in FIG. 14. The purification device in FIG. 14 has, between an inlet portion and an outlet portion, a filtering device including a filter BU-1, a tank T-1, a filter BU-2, a filter F-A, a tank T-2, a filter BD-1, and a filter BD-2 that are connected in series and a distiller connected to the front portion of the filtering device (duplex distiller consisting of D1 and D2, described as "duplex" in Table 1). Each unit forms a flow path S-14 together with piping. In the filtering device, a return flow path R-14-1 is formed which is capable of returning the liquid to be purified to the tank T-1 from the downstream side of the filter F-A (filter F-A corresponds to the filter A described above) in the flow path S-14, and a return flow path R-14-2 is formed which is capable of returning the liquid to be purified to the tank T-2 from the downstream side of the filter BD-2 in the flow path S-14.

Table 1 shows the material components contained in the filters used for manufacturing the chemical liquid 1 and the pore size of the filters.

Abbreviations for the material components of the filters in Table 1 are as follows.

PFSA/PTFE:

A material obtained by immersing a commercially available product Fluorogard AT (pore size: 20 nm or 200 nm) manufactured by Entegris. in a polymer solution prepared by dissolving a 0.25% PFSA solution (AQUIVION PFSA 24: D83-24B Solvay Plastics) in an aqueous methanol solvent until the filter was thoroughly wetted, then draining the filter and drying the filter, and washing the filter for 24 hours with ultrapure water. The critical wetting surface tension of the filter was adjusted by controlling the content of PFSA in the PFSA solution.

PP: polypropylene

IEX: a filter obtained by introducing a cation exchange group into a base material made of polyethylene.

Nylon: nylon

UPE: ultra-high-molecular-weight polyethylene

PTFE: polytetrafluoroethylene

PFSA/PTFE blend

A material obtained by mixing a PFSA additive (Aquivion PFSA 24: D83-24B Solvay Specialty Polymers LLC.) with an appropriate amount of PTFE resin, equilibrating the mixture, then preparing billets under pressure, preparing sheet-like PTFE by extrusion molding, and stretching the sheet-like PTFE so as to obtain a predetermined pore size. The critical wetting surface tension of the filter was adjusted by controlling the amount of the PFSA additive.

Abbreviations relating to the liquid to be purified in Table 1 are as follows.

CHN: cyclohexanone

PGMEA/PGME (7:3): a mixture of PGMEA and PGME at a ratio of 7:3 (based on volume)

nBA: butyl acetate

PC/PGMEA (1:9): a mixture of PC and PGMEA at a ratio of 1:9 (based on volume)

EL: ethyl lactate

MIBC: 4-methyl-2-pentanol

IPA: isopropanol

A commercial high-purity grade "cyclohexanone" was purchased as the liquid to be purified, and purified using the purification device described above. During the purification, circulation filtration was performed three times through each of the return flow paths R-14-1 and R-14-2, thereby obtaining the chemical liquid 1.

[Manufacturing of Chemical Liquids 2 to 48]

Each of the liquid to be purified described in Table 1 was purified using a purification device (or a filtering device) described in Table 1, thereby obtaining chemical liquids. The purification devices (or filtering devices) are shown in FIGS. 15 to 27. The material components contained in the filter F-A, the filters BU-1 to BU-3, and the filters BD-1 and BD-2, and the pore sizes of the filters are as shown in Table 1. During the purification of the liquid to be purified, a liquid that was filtered using a filtering device, in which a return flow path represented by R-(number) was formed, was subjected to circulation filtration three times through each return flow path.

In addition, the critical wetting surface tension (CWST) of the filter F-A is also described in Table 1. In the table, "-" means that the filter was not used. The same is true of other tables in the specification of the present application.

[Evaluation 1: Evaluation of Residue Defect Inhibition Performance and Stain-Like Defect Inhibition Performance of Chemical Liquid]

A silicon wafer (Bare-Si) having a diameter of about 300 mm was coated with the chemical liquid 1, thereby obtaining a wafer coated with a chemical liquid. The used device was Lithius ProZ, and the coating conditions were as follows.

Amount of chemical liquid used for coating: 2 ml

Rotation speed of silicon wafer during coating: 2,200 rpm, 60 sec

Then, by using a wafer inspection device "SP-5" manufactured by KLA-Tencor Corporation. and a fully automatic defect review/classification device "SEMVision G6" manufactured by Applied Materials, Inc, the number of defects increased before and after the coating with the chemical liquid among defects having a size equal to or greater than 19 nm existing on the entire surface of the wafer, and the composition of the defects were investigated.

The number of increased defects measured using SP-5 was counted as the number of residue defects, and the shape of the defects was observed using G6. The (stain-like) defects that were not in the form of particles were counted as stain-like defects. The results were evaluated based on the following standard. The evaluation results are shown in Table 1.

The smaller the number of defects present on the wafer, the better the defect inhibition performance of the chemical liquid. In the following evaluation, "number of defects" means the total number of residue defects and stain-like defects. The chemical liquids 2 to 48 were evaluated by the same method as the above method. The results are shown in Table 1.

AA The number of defects was equal to or smaller than 30/wafer.

A The number of defects was greater than 30/wafer and equal to or smaller than 50/wafer.

B The number of defects was greater than 50/wafer and equal to or smaller than 100/wafer.

C The number of defects was greater than 100/wafer and equal to or smaller than 200/wafer.

D The number of defects was greater than 200/wafer and equal to or smaller than 500/wafer.

E The number of defects was greater than 500/wafer.

[Evaluation 2: Bridge Defect Inhibition Performance]

By using the chemical liquid 1 as a prewet solution, the bridge defect inhibition performance of the chemical liquid was evaluated. First, the used resist composition will be described.

Resist Resin Composition

The resist resin composition was obtained by mixing together the following components.

Acid-decomposable resin (resin represented by the following formula (weight-average molecular weight (Mw) 7500): the numerical value described in each repeating unit means mol %): 100 parts by mass

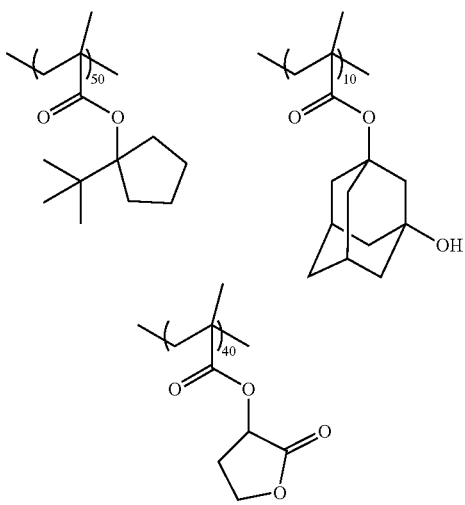

The following photoacid generator: 8 parts by mass

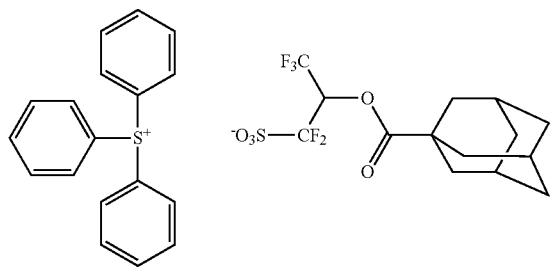

The following quencher: 5 parts by mass (the mass ratio was 0.1:0.3:0.3:0.2 in this order from the left). Among the following quenchers, a polymer-type quencher has a weight-average molecular weight (Mw) of 5,000. The numerical value described in each repeating unit means molar ratio.

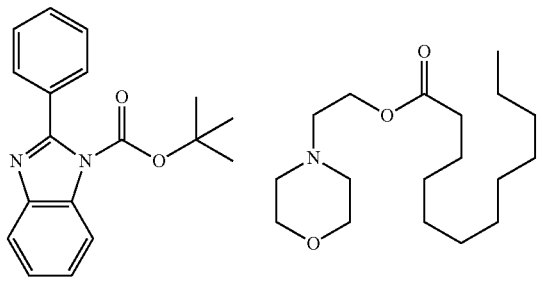

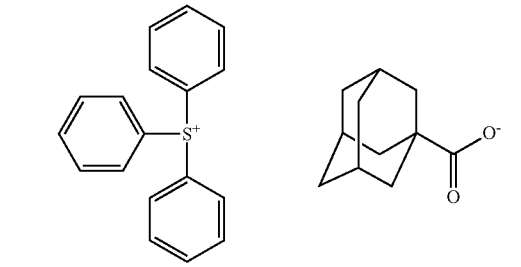

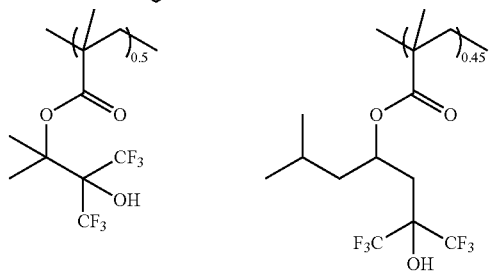

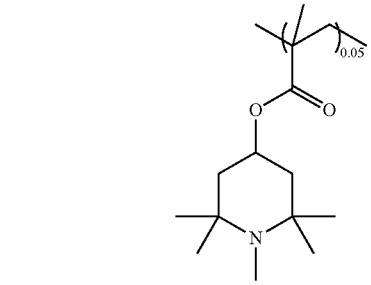

Hydrophobic resins shown below: 4 parts by mass (mass ratio: (1):(2)=0.5:0.5) Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

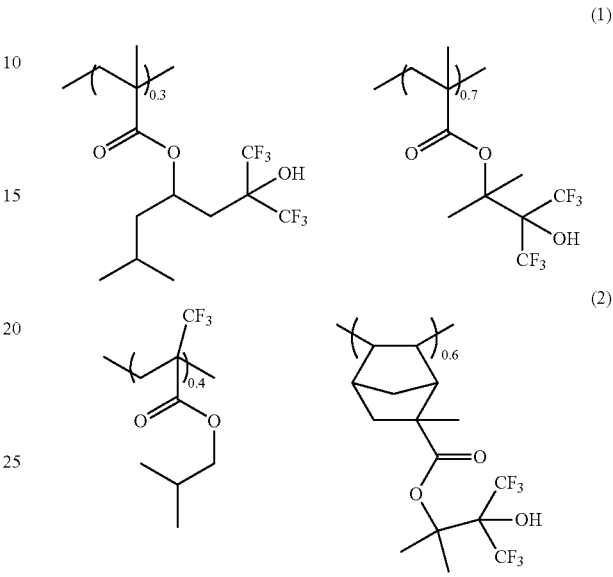

Solvent:
PGMEA (propylene glycol monomethyl ether acetate): 3 parts by mass
Cyclohexanone: 600 parts by mass
γ-BL (γ-butyrolactone): 100 parts by mass
Test Method Next, the test method will be described. First, a silicon wafer having a diameter of about 300 mm was pre-wet with the chemical liquid 1, and then the pre-wet silicon wafer was spin-coated with the resist resin composition described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern. After being irradiated, the resist film was baked for 60 seconds at 120° C. Subsequently, the resist film was developed, rinsed, and then baked for 60 seconds at 110° C., thereby forming a resist pattern having a line width of 30 nm and a space width of 30 nm.

By using a critical dimension SEM (CG4600, manufactured by Hitachi High-Technologies Corporation), 100 shots of the resist pattern were captured. The number of defects in the form of a crosslink between patterns (bridge defects) was counted, and the number of defects per unit area was determined. The results were evaluated based on the following standard. The evaluation results are shown in Table 1. Note that the smaller the number of defects in the form of a crosslink between patterns, the better the bridge defect inhibition performance of the chemical liquid. By the same method as that described above, the bridge defect inhibition performance of the chemical liquids 2 to 48 were evaluated. The results are shown in Table 1.

AA The number of bridge defects was less than $1/cm^2$.
A The number of bridge defects was equal to or greater than $1/cm^2$ and less than $2/cm^2$.
B The number of bridge defects was equal to or greater than $2/cm^2$ and less than $5/cm^2$.
C The number of bridge defects was equal to or greater than $5/cm^2$ and less than $10/cm^2$.
D The number of bridge defects was equal to or greater than $10/cm^2$ and less than $15/cm^2$.
E The number of bridge defects was equal to or greater than $15/cm^2$.

[Evaluation 3: Pattern Width Uniformity]

By using a critical dimension SEM (CG4600, manufactured by Hitachi High-Technologies Corporation), 100 shots of the resist pattern were captured, and a difference between an average Line Width Roughness (LWR) and a maximum (or minimum) line width was determined. The results were evaluated based on the following standard. The evaluation results are shown in Table 1. Note that the smaller the difference, the better the uniformity of the pattern width formed using the chemical liquid. "Difference between the average LWR and the maximum (or minimum) line width" means that between the difference between the average LWR and the maximum line width and the difference between the average LWR and the minimum line width, the larger one in terms of absolute value was adopted.

AA The difference between the average line width and the maximum (minimum) line width was less than ±2% with respect to the average.
A The difference between the average line width and the maximum (minimum) line width was less than ±5% with respect to the average.
B The difference between the average line width and the maximum (minimum) line width was less than ±10% with respect to the average.
C The difference between the average line width and the maximum (minimum) line width was less than ±20% with respect to the average.
D The difference between the average line width and the maximum (minimum) line width was equal to or greater than ±20% with respect to the average.
E The line width could not be measured in some of the shots.

[Evaluation 4: Evaluation of Pot Life of Filter]

Figure 26:
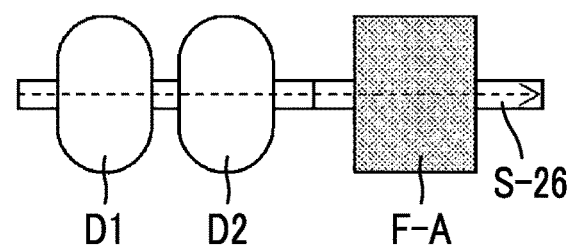
FIG. 26 is a schematic view illustrating a purification device according to a conventional technique.

The liquid to be purified was continuously purified using each of the purification devices (or filtering devices) described in Table 1. After the liquid to be purified was passed and the purification device (or filtering device) was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the residue defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the filtering device described in FIG. 26 was used was regarded as 1, and the pot life of the filter of each device was evaluated based on a ratio to 1. The results were evaluated based on the following standard. The evaluation results are shown in Table 1. The evaluation result obtained using the device in FIG. 26 is described as "Standard".

AA The pot life was equal to or longer than 10.
A The pot life was equal to or longer than 5 and less than 10.
B The pot life was equal to or longer than 2 and less than 5.
C The pot life was equal to or longer than 1 and less than 2.
D The pot life was less than 1.

[Evaluation 5: Evaluation of Production Cost]

The liquid to be purified was continuously purified using each of the purification devices (or filtering devices) described in Table 1. The liquid to be purified was passed through the purification device (or filtering device), the device was left to be stable, and then the flow rate of the liquid to be purified per unit time was kept constant. Under this condition, the point in time when the differential pressure applied to at least one of the filters included in each purification device (or filtering device) was higher than 110% of the initial different pressure was regarded as the time to replace the filter.

The number of times of replacing all filters required for manufacturing a total of 5,000 tons of chemical liquid was evaluated according to the following standard. The results are described in the column of "Production cost" in Table 1. The smaller the number of times of replacement, the more preferable because the production cost is further reduced. In other words, the smaller the number of times of replacement, the better the productivity of the filtering device.

A: The number of times of replacement was equal to or smaller than 2.
B: The number of times of replacement was equal to or greater than 3 and equal to or smaller than 6.
C: The number of times of replacement was equal to or greater than 7.

Test Example 2: Purification of Aqueous Liquid to be Purified and Evaluation of Performance of Chemical Liquid

[Manufacturing of Chemical Liquids 50, 51, and 54]

As liquids to be purified, a Sulfuric acid-Hydrogen Peroxide Mixture (SPM), an aqueous phosphoric acid solution (phosphoric acid content: 85% by mass), and 2.38% aqueous tetramethylammonium hydroxide solution (described as "TMAH" in Table 2) were prepared by purchase.

Figure 28:
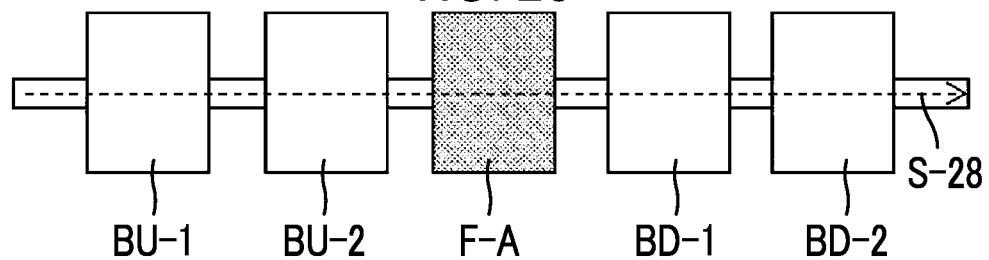
FIG. 28 is a schematic view illustrating a filtering device according to an embodiment of the present invention.

Then, chemical liquids 50 and 51 were manufactured using the filtering device described in FIG. 28. In the filtering device shown In FIG. 28, a filter BU-1, a filter BU-2, a filter F-A, a filter BD-1, and a filter BD-2 are connected in series between an inlet portion and an outlet portion so as to form a flow path S-28. Table 2 shows the material components contained in each of the filters in the filtering device shown in FIG. 28 and the pore size of the filters.

The abbreviations relating to the material components of the filters in Table 2 will not be described because they are the same as those in Table 1.

[Manufacturing of Chemical Liquids 52 and 53]

Figure 29:
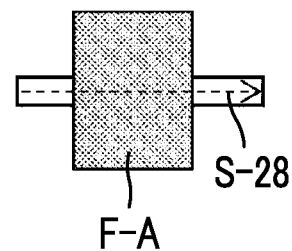
FIG. 29 is a schematic view illustrating a filtering device according to a conventional technique.

A chemical liquid 52 and a chemical liquid 53 were manufactured by the same method as that used for manufacturing the chemical liquid 50 and the chemical liquid 51, except that a filtering device (with a filter F-A and a flow path S-29) illustrated in FIG. 29 was used instead of the filtering device in FIG. 28. Table 2 shows the material components of the filter F-A and the like.

[Evaluation 1: Evaluation of Defect Inhibition Performance Chemical Liquid]

A bare silicon wafer having a diameter of about 300 mm was prepared and treated with each chemical liquid for 3 minutes, thereby obtaining a treated wafer. Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 30 nm existing on the entire surface of the wafer coated with the chemical liquid and the composition of the defects were investigated.

Among the measured defects, defects from which metal atoms were detected were counted as metal residue defects, and the ratio of the number of metal defects to the total number of the residue defects was calculated. The results were evaluated according to the following standard. The evaluation results are shown in Table 2 together with the number of defects.

A The number of metal defects/number of residue defects was equal to or lower than 1.5%.

B The number of metal defects/number of residue defects was higher than 1.5% and equal to or lower than 2.0%.

C The number of metal defects/number of residue defects was higher than 2.0% and equal to or lower than 3.0%.

D The number of metal defects/number of residue defects was higher than 3.0% and equal to or lower than 4.0%.

E The number of metal defects/number of residue defects was higher than 4.0%

Test Example 3: Manufacturing of Chemical Liquid as Resist Resin Composition and Evaluation of Performance of Chemical Liquid

[Manufacturing of Chemical Liquid 60]

A resist resin composition 2 containing the following components was prepared as a liquid to be purified.

<Resist Resin Composition 2>

A resist resin composition 2 was obtained by mixing together the following components.

Resin synthesized by the following method: 0.77 g

As shown in the following synthesis scheme, 11.9 g of a monomer (1), 8.0 g of a monomer (1-2), 15.1 g of a monomer (1-3), and 1.12 g of a polymerization initiator V-601 (manufactured by Wako Pure Chemical Industries, Ltd.) were dissolved in 129.0 g of cyclohexanone, thereby obtaining a mixed solution.

Then, 69.5 g of cyclohexanone was put into a reaction container, and the mixed solution was added dropwise for 4 hours to the cyclohexanone in the reaction container kept at 85° C. in a nitrogen gas atmosphere, thereby obtaining a reaction solution. The reaction solution was stirred while being heating for 2 hours and then left to cool to room temperature. Thereafter, 49.6 g of methanol and 4.9 g of triethylamine were added to the reaction solution, the mixture was heated and stirred at 50° C. for 18 hours, and then the reaction solution was left to cool to room temperature. Subsequently, 200 g of ethyl acetate and 200 g of water were added to the reaction solution, a liquid separation operation was performed, and the organic layer was collected. The organic layer was washed 3 times with water, and the solvent was evaporated under reduced pressure. The residual solids were dissolved in 200 g of propylene glycol monomethyl ether acetate (PGMEA), the solvent was evaporated under reduced pressure such that azeotropic dehydration occurred, and then 198.5 g of cyclohexanone was added thereto, thereby obtaining a solution. The solution was then added dropwise to 2,336 g of a mixed solution of n-heptane and ethyl acetate (n-heptane/ethyl acetate=9/1 (mass ratio)) such that solids were precipitated, and the solids were filtered. Thereafter, the filtered solids were washed with 701 g of a mixed solution of n-heptane and ethyl acetate (n-heptane/ethyl acetate=9/1 (mass ratio)). Subsequently, the washed solids were dried under reduced pressure, thereby obtaining 23.8 g of a resin (A-1). The compositional ratio in the resin calculated by $^1$H-NMR and $^{13}$C-NMR was repeating unit (a)/repeating unit (c)/repeating unit (b)=30/20/50 (molar ratio). In the scheme, the synthesis method of the resin is simplified.

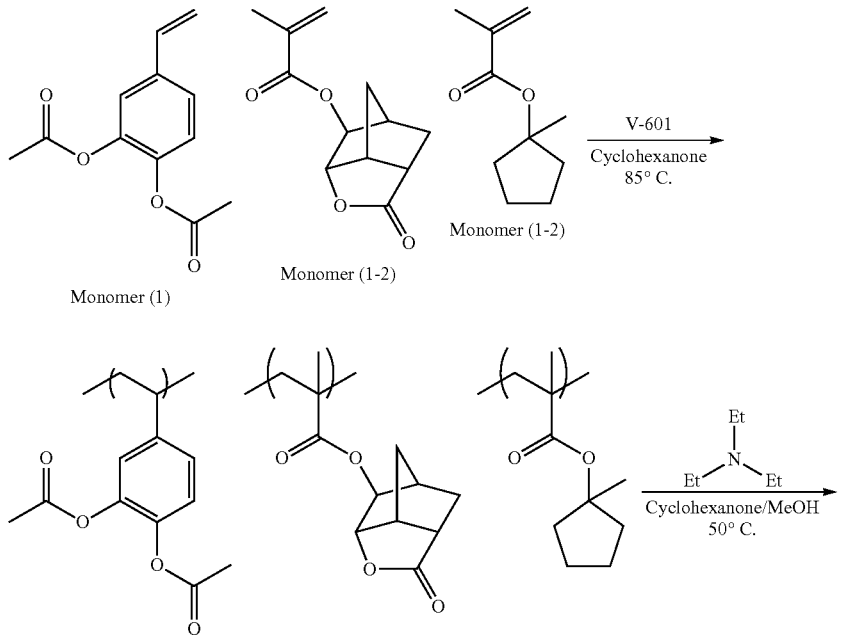

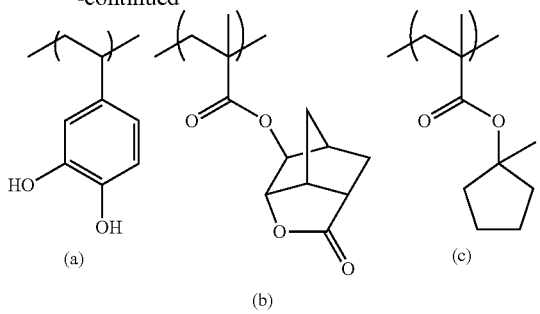

The following acid generator: 0.23 g

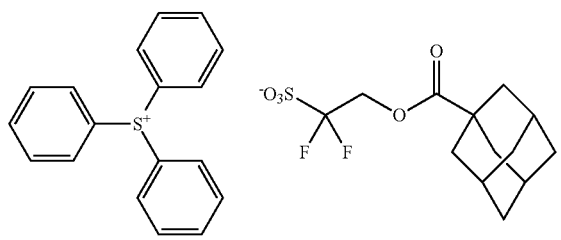

The following acid diffusion control agent: 0.03 g

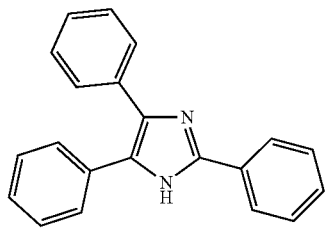 [SMILES: c1ccc(-c2nc(-c3ccccc3)c(-c3ccccc3)[nH]2)cc1]

Solvent:

PGMEA (propylene glycol monomethyl ether acetate): 60 g

PGME (propylene glycol monomethyl ether): 15 g

Figure 30:
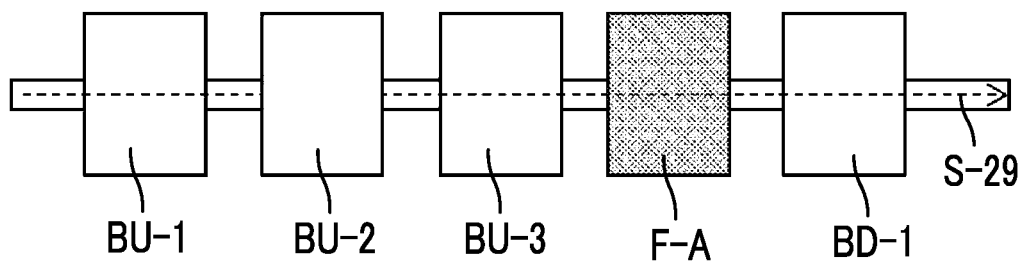
FIG. 30 is a schematic view illustrating a filtering device according to an embodiment of the present invention.

A chemical liquid 60 was manufactured using the filtering device illustrated in FIG. 30. In the filtering device in FIG. 30, a filter BU-1, a filter BU-2, a filter BU-3, a filter F-A, and a filter BD-2 are connected in series between an inlet portion and an outlet portion. The units form a flow path S-30 together with piping. Table 3 shows the material components contained in the filters used for purifying the chemical liquid 60 and the pore size of the filters.

[Manufacturing of Chemical Liquids 61 and 62]

A chemical liquid 61 and a chemical liquid 62 were manufactured by the same method as that used for manufacturing the chemical liquid 60, except that the filters described in Table 3 were used.

[Manufacturing of Chemical Liquid 63]

A chemical liquid 63 was manufactured by the same method as that used for manufacturing the chemical liquid 60, except that the filtering device described in FIG. 29 was used instead of the filtering device described in FIG. 30. The filters used for filtration are as described in Table 3.

[Evaluation 1 of Defect Inhibition Performance of Chemical Liquid: Evaluation of Scum Defect Inhibition Performance]

For the obtained chemical liquids, the content of metal components was measured using ICP-MS 8900 manufactured by Agilent Technologies, Inc. The results are shown in Table 3. The content (ppb by mass) of a specific metal component with respect to the total mass of the chemical liquid and the total amount (ppb by mass) of the metal component are also described in Table 3. In Table 3, "<0.01" means that the result was less than the detection limit.

Then, the scum defect inhibition performance was evaluated by the following method. First, a silicon wafer having a diameter of about 300 mm was spin-coated with the aforementioned resist resin composition. Thereafter, the wafer was heated and dried at 120° C. for 60 seconds on a hot plate, thereby forming a resist film having a thickness of 40 nm.

Thereafter, by using an EUV exposure device (manufactured by Exitech Corporation, Micro Exposure Tool, NA0.3, Quadrupole, outer σ: 0.68, inner σ: 0.36, manufactured by Axis) and an exposure mask (mask with a line/space ratio of 1/1 having a space width (width of light transmission part) of 10 nm), the silicon wafer comprising a resist film was pattern-wise exposed. After the pattern-wise exposure, the silicon wafer comprising a resist film having undergone exposure was placed on a heated hot plate with the silicon wafer surface facing down, and baked at 90° C. for 60 seconds. The baked resist film was subjected to puddle development using a developer for 30 seconds, and then rinsed. Then, the wafer was rotated at a rotation speed of 2,000 rpm for 30 seconds, thereby obtaining a 1:1 line and space pattern.

Thereafter, by using a critical dimension SEM (CG4600, manufactured by Hitachi High-Technologies Corporation), 100 shots of the resist pattern were captured. The number of scum-like defects was measured, and the number of defects per unit area was determined. The results were evaluated based on the following standard. The evaluation results are shown in Table 3. Note that the smaller the number of scum-like defects, the better the scum defect inhibition performance of the chemical liquid.

AA The number of scum defects was less than $1/cm^2$.

A The number of scum defects was equal to or greater than $1/cm^2$ and less than $2/cm^2$.

B The number of scum defects was equal to or greater than $2/cm^2$ and less than $5/cm^2$.

C The number of scum defects was equal to or greater than $5/cm^2$ and less than $10/cm^2$.

D The number of scum defects was equal to or greater than $10/cm^2$ and less than $20/cm^2$.

E The number of scum defects was equal to or greater than $20/cm^2$.

TABLE 1 (1-1)

Figure 15:
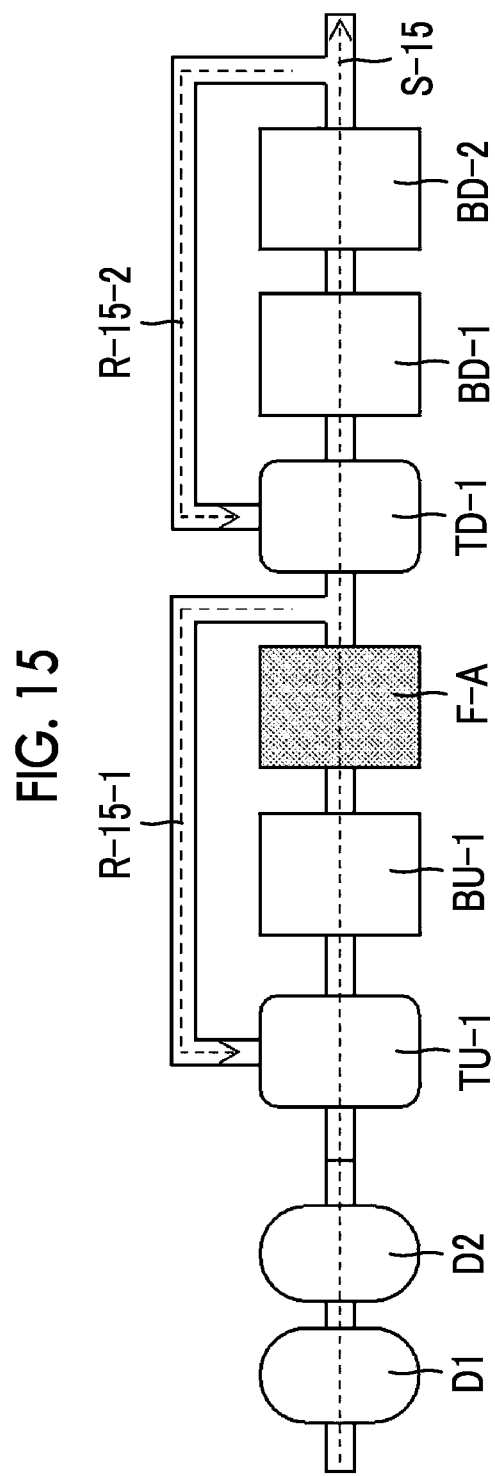
FIG. 15 is a schematic view illustrating a purification device according to an embodiment of the present invention.
Figure 16:
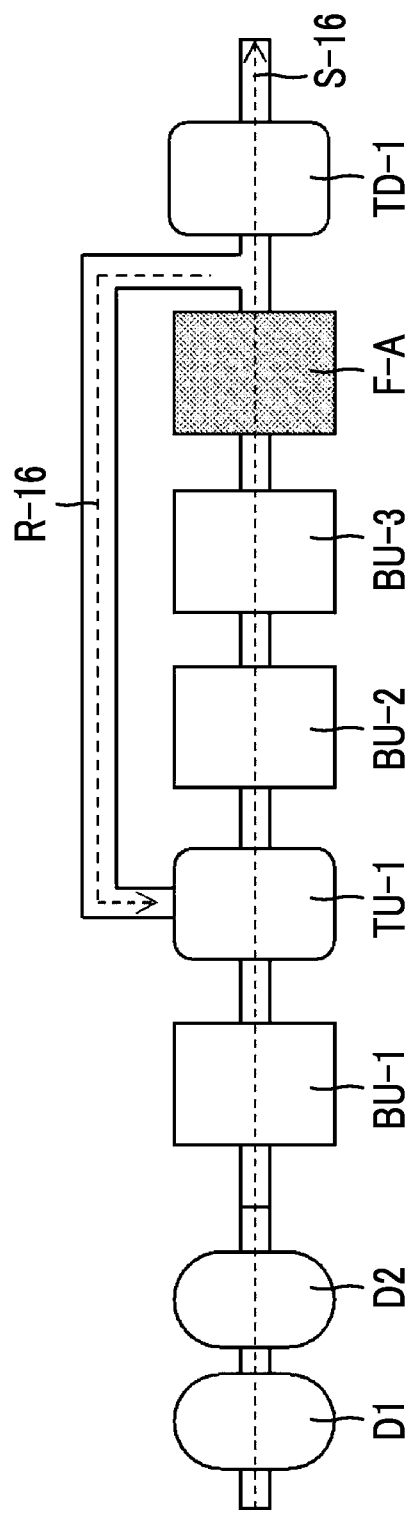
FIG. 16 is a schematic view illustrating a purification device according to an embodiment of the present invention.
Figure 17:
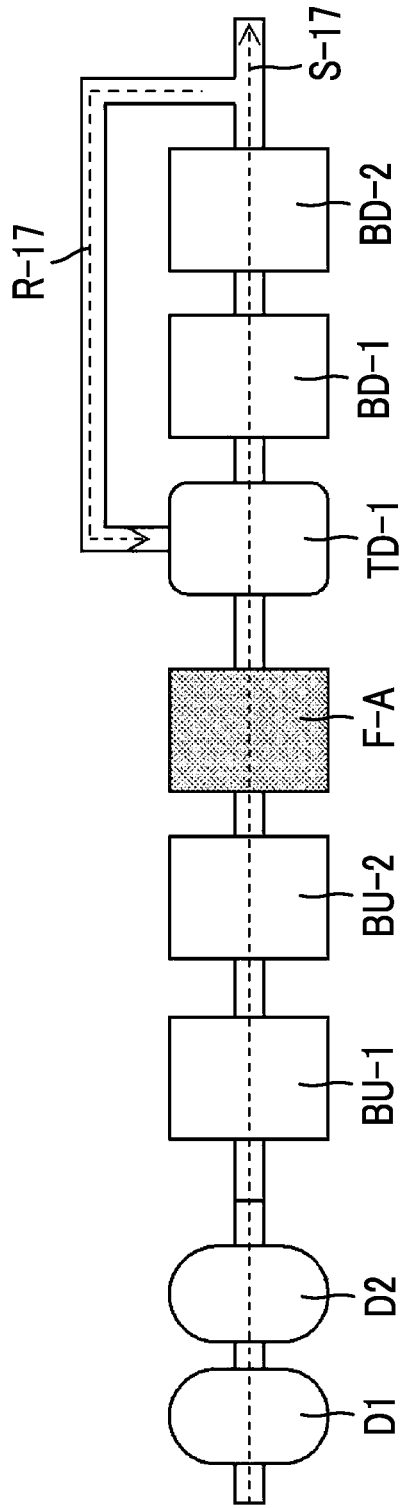
FIG. 17 is a schematic view illustrating a purification device according to an embodiment of the present invention.
Figure 18:
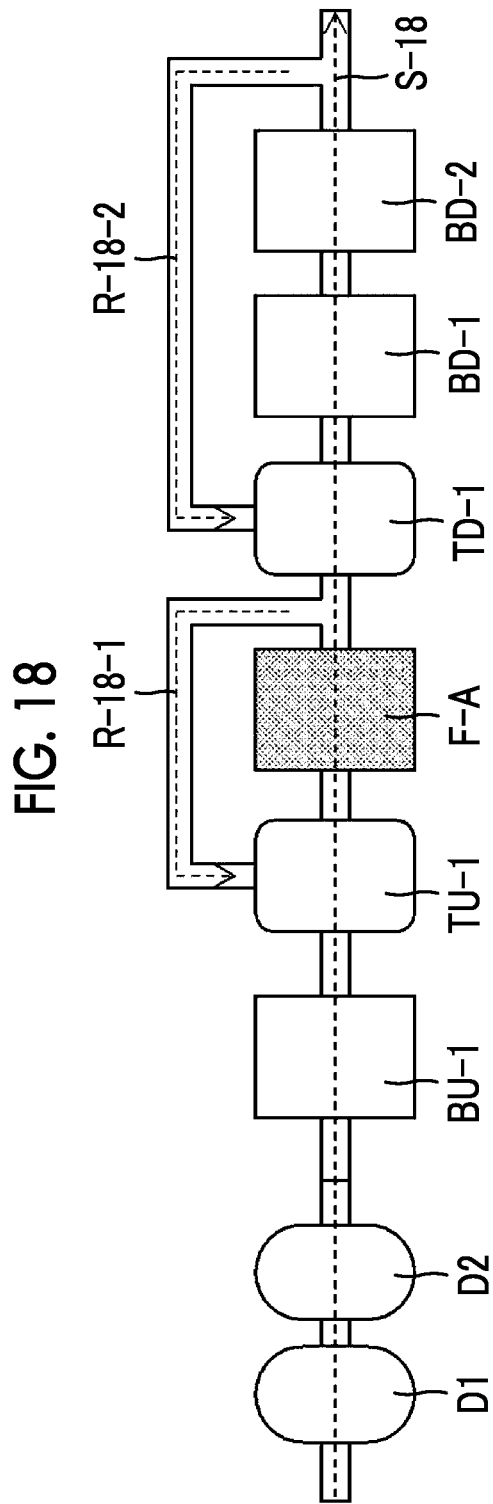
FIG. 18 is a schematic view illustrating a purification device according to an embodiment of the present invention.
Figure 19:
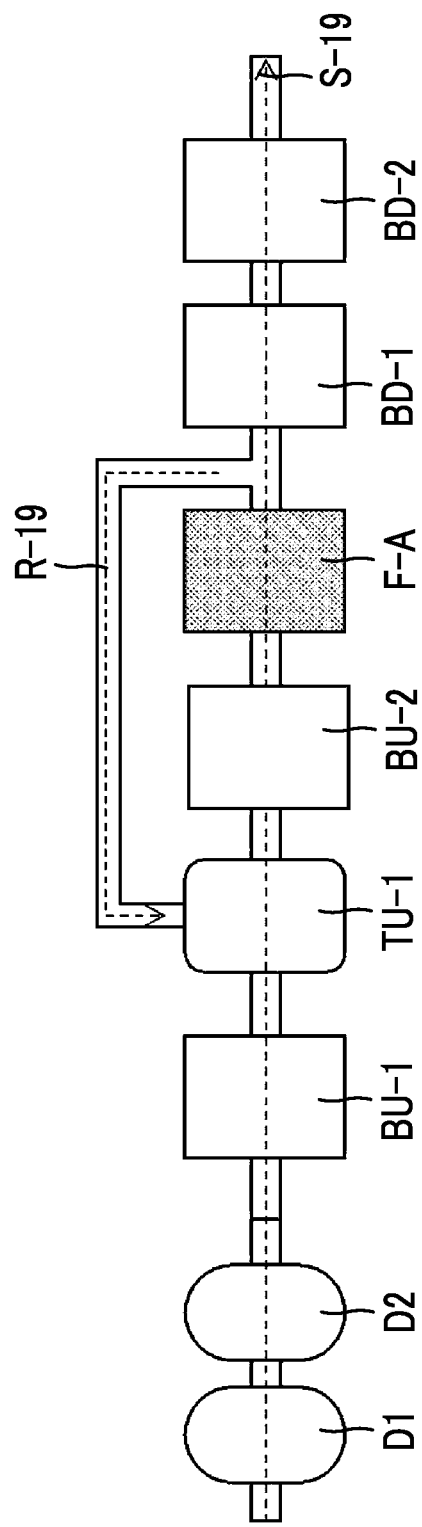
FIG. 19 is a schematic view illustrating a purification device according to an embodiment of the present invention.
Figure 20:
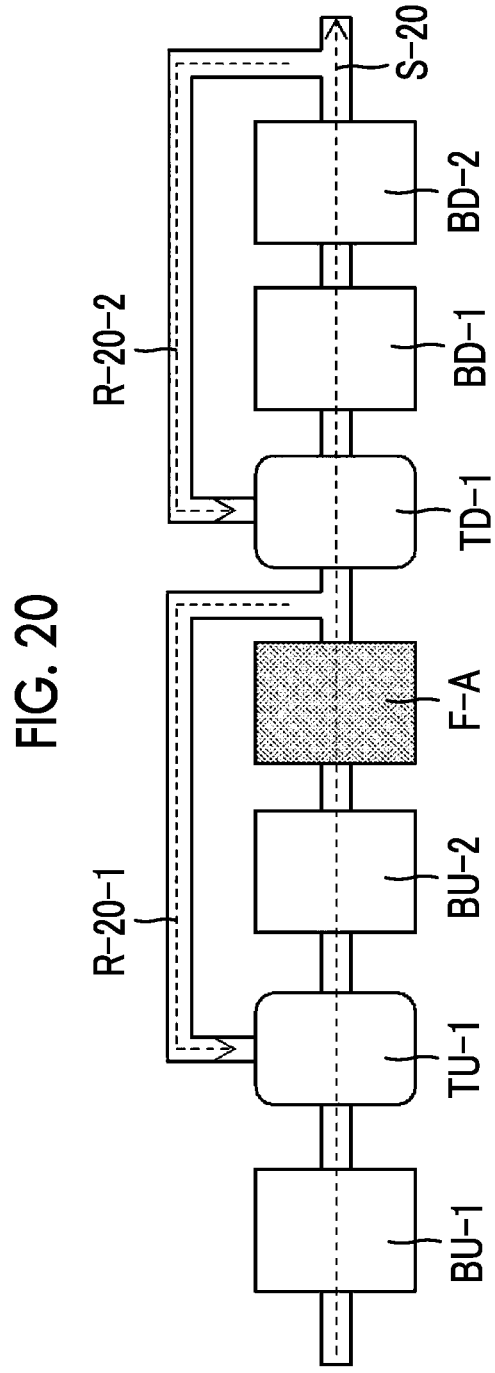
FIG. 20 is a schematic view illustrating a filtering device according to an embodiment of the present invention.
Figure 21:
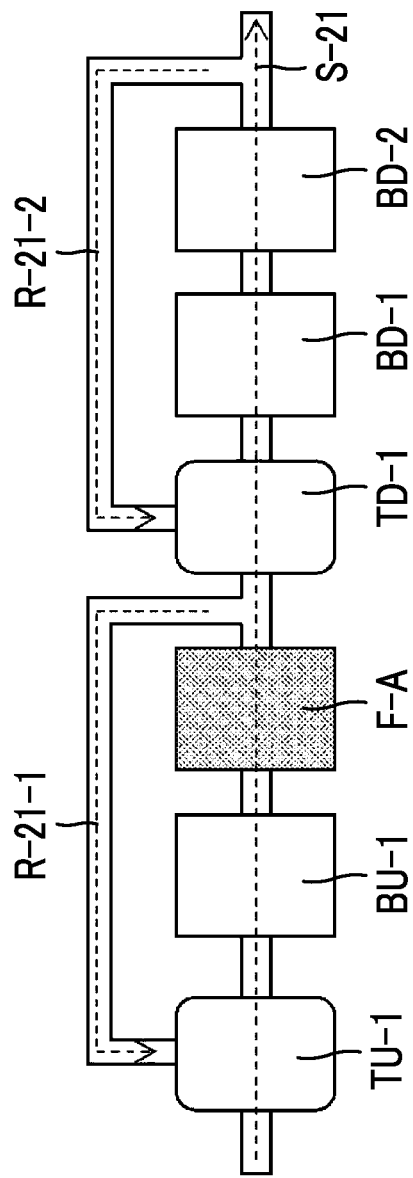
FIG. 21 is a schematic view illustrating a filtering device according to an embodiment of the present invention.
Figure 22:
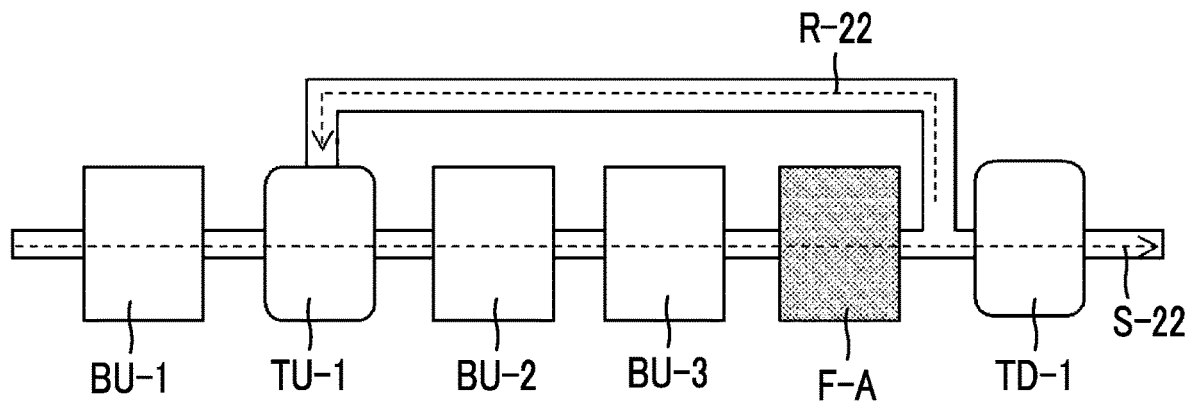
FIG. 22 is a schematic view illustrating a filtering device according to an embodiment of the present invention.
Figure 23:
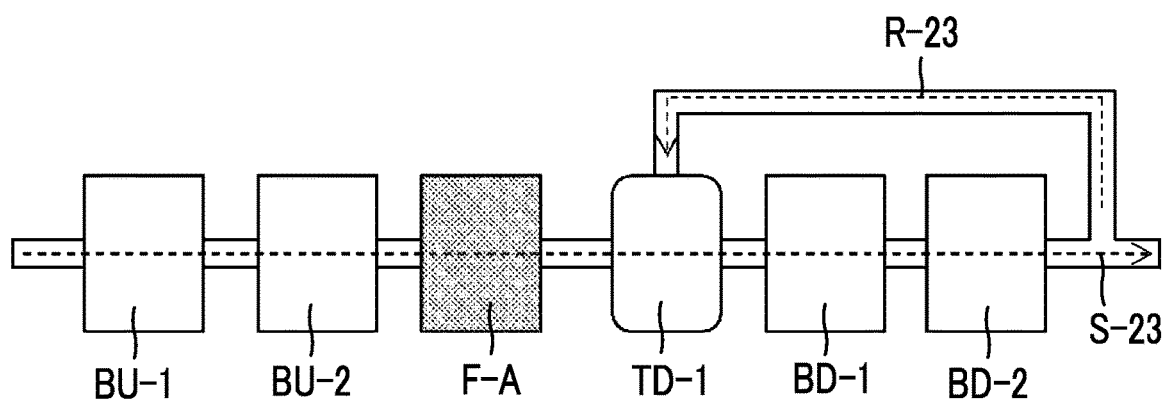
FIG. 23 is a schematic view illustrating a filtering device according to an embodiment of the present invention.
Figure 24:
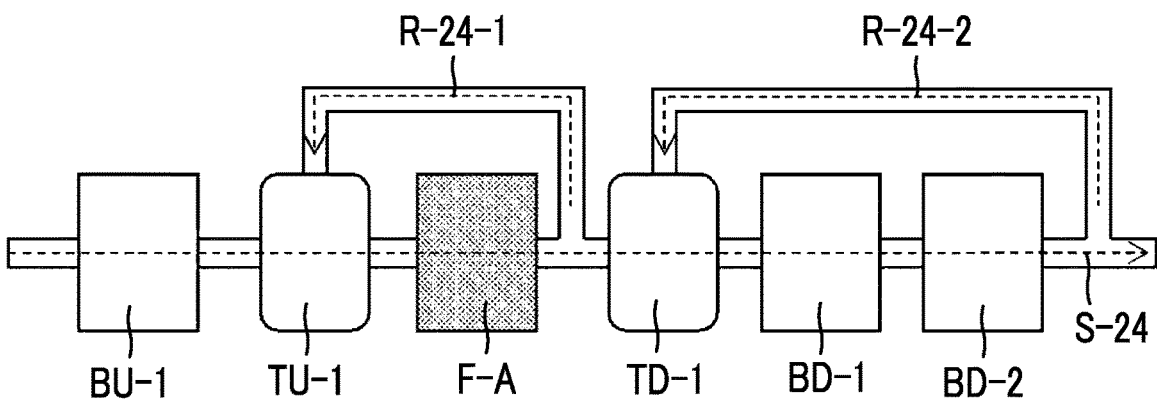
FIG. 24 is a schematic view illustrating a filtering device according to an embodiment of the present invention.
Figure 25:
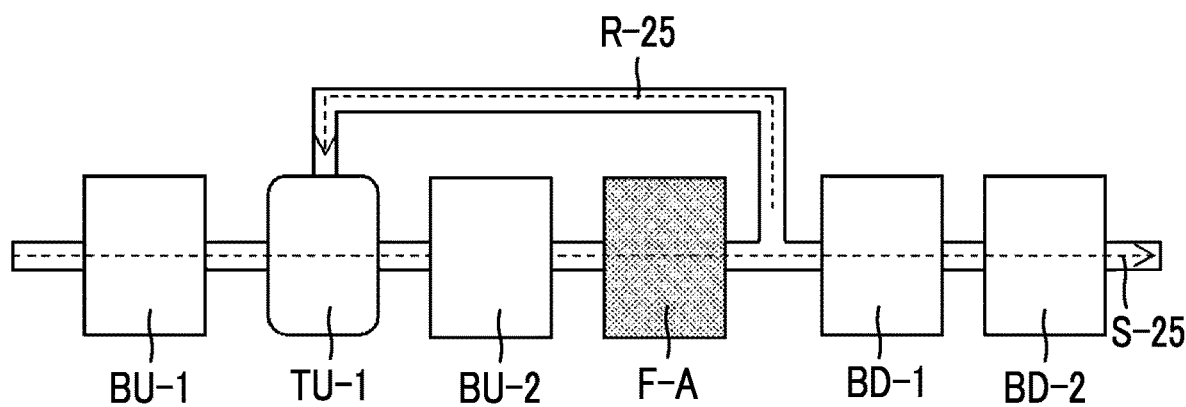
FIG. 25 is a schematic view illustrating a filtering device according to an embodiment of the present invention.

|  | Purification device (or filtering device) | Liquid to be purified | Pre-washing of filter | Distiller |
|---|---|---|---|---|
| Chemical liquid 1 | FIG. 14 | CHN | PGMEA 1 day immersion | Duplex |
| Chemical liquid 2 | FIG. 15 | CHN | PGMEA 1 day immersion | Duplex |
| Chemical liquid 3 | FIG. 16 | CHN | PGMEA 1 day immersion | Duplex |
| Chemical liquid 4 | FIG. 14 | CHN | PGMEA 1 day immersion | Duplex |
| Chemical liquid 5 | FIG. 17 | CHN | PGMEA 1 day immersion | Duplex |
| Chemical liquid 6 | FIG. 14 | CHN | PGMEA 1 day immersion | Duplex |
| Chemical liquid 7 | FIG. 14 | CHN | PGMEA 1 day immersion | Duplex |
| Chemical liquid 8 | FIG. 14 | CHN | PGMEA 1 day immersion | Duplex |
| Chemical liquid 9 | FIG. 14 | CHN | PGMEA 1 day immersion | Duplex |
| Chemical liquid 10 | FIG. 14 | CHN | PGMEA 1 day immersion | Duplex |
| Chemical liquid 11 | FIG. 14 | CHN | PGMEA 1 day immersion | Duplex |
| Chemical liquid 12 | FIG. 18 | CHN | PGMEA 1 day immersion | Duplex |
| Chemical liquid 13 | FIG. 14 | CHN | PGMEA 1 day immersion | Duplex |
| Chemical liquid 14 | FIG. 19 | CHN | PGMEA 1 day immersion | Duplex |
| Chemical liquid 15 | FIG. 14 | CHN | — | Duplex |
| Chemical liquid 16 | FIG. 20 | CHN | PGMEA 1 day immersion | — |
| Chemical liquid 17 | FIG. 21 | CHN | PGMEA 1 day immersion | — |
| Chemical liquid 18 | FIG. 22 | CHN | PGMEA 1 day immersion | — |
| Chemical liquid 19 | FIG. 20 | CHN | PGMEA 1 day immersion | — |
| Chemical liquid 20 | FIG. 23 | CHN | PGMEA 1 day immersion | — |
| Chemical liquid 21 | FIG. 20 | CHN | PGMEA 1 day immersion | — |
| Chemical liquid 22 | FIG. 20 | CHN | PGMEA 1 day immersion | — |
| Chemical liquid 23 | FIG. 20 | CHN | PGMEA 1 day immersion | — |
| Chemical liquid 24 | FIG. 20 | CHN | PGMEA 1 day immersion | — |
| Chemical liquid 25 | FIG. 20 | CHN | PGMEA 1 day immersion | — |
| Chemical liquid 26 | FIG. 20 | CHN | PGMEA 1 day immersion | — |
| Chemical liquid 27 | FIG. 24 | CHN | PGMEA 1 day immersion | — |
| Chemical liquid 28 | FIG. 20 | CHN | PGMEA 1 day immersion | — |
| Chemical liquid 29 | FIG. 25 | CHN | PGMEA 1 day immersion | — |
| Chemical liquid 30 | FIG. 20 | CHN | — | — |

TABLE 1 (1-2)

|  | BU-1 | | BU-2 | | BU-3 | | Tank TU-1 |
|---|---|---|---|---|---|---|---|
|  | Material component | Pore size (nm) | Material component | Pore size (nm) | Material component | Pore size (nm) | |
| Chemical liquid 1 | PP | 200 | IEX | 15 | — | — | Present |
| Chemical liquid 2 | IEX | 15 | — | — | — | — | Present |
| Chemical liquid 3 | PP | 200 | IEX | 15 | Nylon | 10 | Present |
| Chemical liquid 4 | PP | 200 | IEX | 200 | — | — | Present |
| Chemical liquid 5 | PP | 200 | IEX | 15 | — | — | — |
| Chemical liquid 6 | PTFE | 10 | IEX | 15 | — | — | Present |
| Chemical liquid 7 | PP | 200 | IEX | 15 | — | — | Present |
| Chemical liquid 8 | PP | 200 | IEX | 15 | — | — | Present |
| Chemical liquid 9 | PP | 200 | IEX | 15 | — | — | Present |
| Chemical liquid 10 | PP | 200 | IEX | 15 | — | — | Present |
| Chemical liquid 11 | PP | 200 | IEX | 15 | — | — | Present |
| Chemical liquid 12 | PP | 200 | PP | 20 | — | — | Present |
| Chemical liquid 13 | PP | 200 | IEX | 15 | — | — | Present |
| Chemical liquid 14 | PP | 200 | IEX | 15 | — | — | Present |
| Chemical liquid 15 | PP | 200 | IEX | 15 | — | — | Present |
| Chemical liquid 16 | PP | 200 | IEX | 15 | — | — | Present |
| Chemical liquid 17 | IEX | 15 | — | — | — | — | Present |
| Chemical liquid 18 | PP | 200 | IEX | 15 | Nylon | 10 | Present |
| Chemical liquid 19 | PP | 200 | IEX | 200 | — | — | Present |
| Chemical liquid 20 | PP | 200 | IEX | 15 | — | — | — |
| Chemical liquid 21 | PTFE | 10 | IEX | 15 | — | — | Present |
| Chemical liquid 22 | PP | 200 | IEX | 15 | — | — | Present |
| Chemical liquid 23 | PP | 200 | IEX | 15 | — | — | Present |
| Chemical liquid 24 | PP | 200 | IEX | 15 | — | — | Present |
| Chemical liquid 25 | PP | 200 | IEX | 15 | — | — | Present |
| Chemical liquid 26 | PP | 200 | IEX | 15 | — | — | Present |
| Chemical liquid 27 | PP | 200 | — | — | — | — | Present |
| Chemical liquid 28 | PP | 200 | IEX | 15 | — | — | Present |
| Chemical liquid 29 | PP | 200 | IEX | 15 | — | — | Present |
| Chemical liquid 30 | PP | 200 | IEX | 15 | — | — | Present |

TABLE 1 (1-3)

| | F-A | | | BD-1 | | BD-2 | |
|---|---|---|---|---|---|---|---|
| | Material component | Pore size (nm) | CWST ($10^{-5}$ N/cm) | Material component | Pore size (nm) | Material component | Pore size (nm) |
| Chemical liquid 1 | PFSA/PTFE | 20 | 35 | Nylon | 10 | UPE | 3 |
| Chemical liquid 2 | PFSA/PTFE | 20 | 35 | Nylon | 10 | UPE | 3 |
| Chemical liquid 3 | PFSA/PTFE | 20 | 35 | — | — | — | — |
| Chemical liquid 4 | PFSA/PTFE | 20 | 35 | Nylon | 10 | UPE | 3 |
| Chemical liquid 5 | PFSA/PTFE | 20 | 35 | Nylon | 10 | UPE | 3 |
| Chemical liquid 6 | PFSA/PTFE | 20 | 35 | Nylon | 10 | UPE | 3 |
| Chemical liquid 7 | PFSA/PTFE | 20 | 35 | Nylon | 10 | PTFE | 20 |
| Chemical liquid 8 | PFSA/PTFE | 20 | 35 | Nylon | 10 | PTFE | 7 |
| Chemical liquid 9 | PFSA/PTFE | 20 | 35 | Nylon | 10 | Nylon | 5 |
| Chemical liquid 10 | PFSA/PTFE | 20 | 35 | Nylon | 10 | UPE | 7 |
| Chemical liquid 11 | PFSA/PTFE | 20 | 35 | Nylon | 10 | UPE | 1 |
| Chemical liquid 12 | PFSA/PTFE | 20 | 35 | Nylon | 10 | UPE | 3 |
| Chemical liquid 13 | PFSA/PTFE | 20 | 35 | PTFE | 10 | UPE | 3 |
| Chemical liquid 14 | PFSA/PTFE | 20 | 35 | Nylon | 10 | UPE | 3 |
| Chemical liquid 15 | PFSA/PTFE | 20 | 35 | Nylon | 10 | UPE | 3 |
| Chemical liquid 16 | PFSA/PTFE | 20 | 35 | Nylon | 10 | UPE | 3 |
| Chemical liquid 17 | PFSA/PTFE | 20 | 35 | Nylon | 10 | UPE | 3 |
| Chemical liquid 18 | PFSA/PTFE | 20 | 35 | — | — | — | — |
| Chemical liquid 19 | PFSA/PTFE | 20 | 35 | Nylon | 10 | UPE | 3 |
| Chemical liquid 20 | PFSA/PTFE | 20 | 35 | Nylon | 10 | UPE | 3 |
| Chemical liquid 21 | PFSA/PTFE | 20 | 35 | Nylon | 10 | UPE | 3 |
| Chemical liquid 22 | PFSA/PTFE | 20 | 35 | Nylon | 10 | PTFE | 20 |
| Chemical liquid 23 | PFSA/PTFE | 20 | 35 | Nylon | 10 | PTFE | 7 |
| Chemical liquid 24 | PFSA/PTFE | 20 | 35 | Nylon | 10 | Nylon | 5 |
| Chemical liquid 25 | PFSA/PTFE | 20 | 35 | Nylon | 10 | UPE | 7 |
| Chemical liquid 26 | PFSA/PTFE | 20 | 35 | Nylon | 10 | UPE | 1 |
| Chemical liquid 27 | PFSA/PTFE | 20 | 35 | Nylon | 10 | UPE | 3 |
| Chemical liquid 28 | PFSA/PTFE | 20 | 35 | PTFE | 10 | UPE | 3 |
| Chemical liquid 29 | PFSA/PTFE | 20 | 35 | Nylon | 10 | UPE | 3 |
| Chemical liquid 30 | PFSA/PTFE | 20 | 35 | Nylon | 10 | UPE | 3 |

TABLE 1 (1-4)

| | | Evaluation 1 | | Evaluation 2 | | | |
|---|---|---|---|---|---|---|---|
| | Tank TD-1 | Residue defect inhibition performance | Stain-like defect inhibition performance | Bridge defect inhibition performance | Evaluation 3 Pattern width uniformity | Evaluation 4 Pot life | Evaluation 5 Production cost |
| Chemical liquid 1 | Present | AA | AA | AA | AA | AA | A |
| Chemical liquid 2 | Present | A | AA | AA | A | B | C |
| Chemical liquid 3 | Present | C | AA | A | A | AA | A |
| Chemical liquid 4 | Present | A | AA | AA | B | B | B |
| Chemical liquid 5 | Present | A | AA | A | A | A | A |
| Chemical liquid 6 | Present | AA | AA | AA | AA | AA | C |
| Chemical liquid 7 | Present | B | AA | B | A | AA | A |
| Chemical liquid 8 | Present | A | AA | A | A | AA | A |
| Chemical liquid 9 | Present | A | AA | AA | A | AA | A |
| Chemical liquid 10 | Present | A | AA | AA | AA | AA | A |
| Chemical liquid 11 | Present | AA | AA | AA | AA | AA | A |
| Chemical liquid 12 | Present | B | AA | A | C | B | B |
| Chemical liquid 13 | Present | B | AA | A | A | AA | A |
| Chemical liquid 14 | — | B | AA | B | A | AA | A |
| Chemical liquid 15 | Present | C | B | AA | A | AA | A |
| Chemical liquid 16 | Present | A | B | AA | AA | A | A |

TABLE 1 (1-4)-continued

|  | Tank TD-1 | Evaluation 1 Residue defect inhibition performance | Evaluation 1 Stain-like defect inhibition performance | Evaluation 2 Bridge defect inhibition performance | Evaluation 3 Pattern width uniformity | Evaluation 4 Pot life | Evaluation 5 Production cost |
|---|---|---|---|---|---|---|---|
| Chemical liquid 17 | Present | B | B | AA | A | B | C |
| Chemical liquid 18 | Present | C | B | A | A | A | A |
| Chemical liquid 19 | Present | B | B | AA | B | B | B |
| Chemical liquid 20 | Present | B | B | A | A | A | A |
| Chemical liquid 21 | Present | B | B | AA | AA | A | C |
| Chemical liquid 22 | Present | C | B | B | A | A | A |
| Chemical liquid 23 | Present | B | B | A | A | A | A |
| Chemical liquid 24 | Present | B | B | AA | A | A | A |
| Chemical liquid 25 | Present | B | B | AA | AA | A | A |
| Chemical liquid 26 | Present | A | B | AA | AA | A | A |
| Chemical liquid 27 | Present | B | B | A | C | B | B |
| Chemical liquid 28 | Present | B | B | A | A | A | A |
| Chemical liquid 29 | — | C | B | B | A | A | A |
| Chemical liquid 30 | Present | C | D | AA | A | A | A |

TABLE 1 (2-1)

Figure 27:
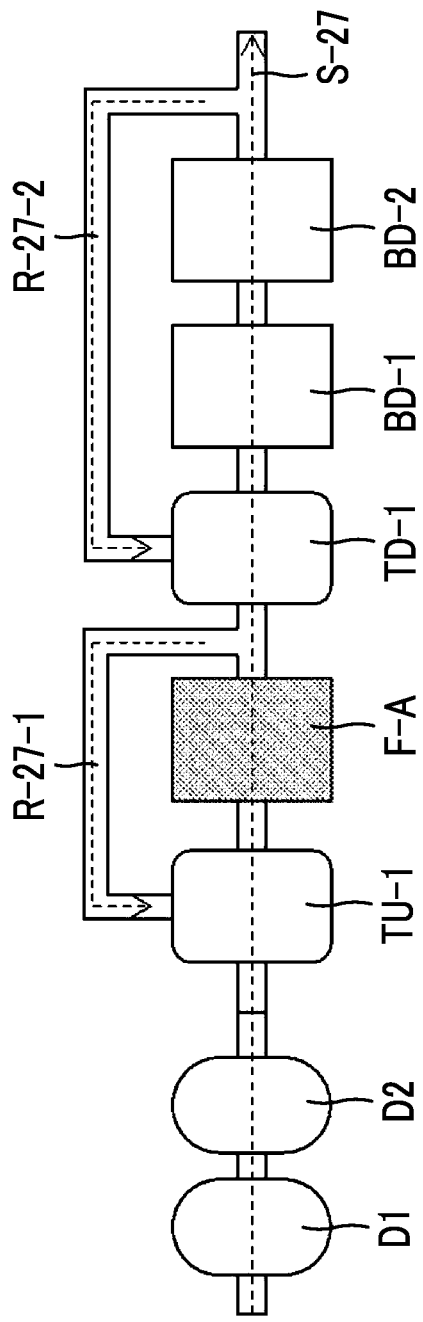
FIG. 27 is a schematic view illustrating a purification device according to an embodiment of the present invention.

|  | Purification device (or filtering device) | Liquid to be purified | Pre-washing of filter | Distiller |
|---|---|---|---|---|
| Chemical liquid 31 | FIG. 14 | PGMEA/PGME (7:3) | PGMEA 1 day immersion | Duplex |
| Chemical liquid 32 | FIG. 14 | PC/PGMEA (1:9) | PGMEA 1 day immersion | Duplex |
| Chemical liquid 33 | FIG. 14 | PGMEA | PGMEA 1 day immersion | Duplex |
| Chemical liquid 34 | FIG. 14 | nBA | PGMEA 1 day immersion | Duplex |
| Chemical liquid 35 | FIG. 14 | EL | PGMEA 1 day immersion | Duplex |
| Chemical liquid 36 | FIG. 14 | MIBC | PGMEA 1 day immersion | Duplex |
| Chemical liquid 37 | FIG. 14 | IPA | PGMEA 1 day immersion | Duplex |
| Chemical liquid 38 | FIG. 26 | CHN | PGMEA 1 day immersion | Duplex |
| Chemical liquid 39 | FIG. 14 | CHN | PGMEA 1 day immersion | Duplex |
| Chemical liquid 40 | FIG. 14 | CHN | PGMEA 1 day immersion | Duplex |
| Chemical liquid 41 | FIG. 14 | CHN | PGMEA 1 day immersion | Duplex |
| Chemical liquid 42 | FIG. 14 | CHN | PGMEA 1 day immersion | Duplex |
| Chemical liquid 43 | FIG. 14 | CHN | PGMEA 1 day immersion | Duplex |
| Chemical liquid 44 | FIG. 14 | CHN | PGMEA 1 day immersion | Duplex |
| Chemical liquid 45 | FIG. 14 | CHN | PGMEA 1 day immersion | Duplex |
| Chemical liquid 46 | FIG. 14 | CHN | PGMEA 1 day immersion | Duplex |
| Chemical liquid 47 | FIG. 27 | CHN | PGMEA 1 day immersion | Duplex |
| Chemical liquid 48 | FIG. 14 | CHN | PGMEA 1 day immersion | Duplex |

TABLE 1 (2-2)

|  | BU-1 | | BU-2 | | BU-3 | | Tank TU-1 |
|---|---|---|---|---|---|---|---|
|  | Material component | Pore size (nm) | Material component | Pore size (nm) | Material component | Pore size (nm) |  |
| Chemical liquid 31 | PP | 200 | IEX | 15 | — | — | Present |
| Chemical liquid 32 | PP | 200 | IEX | 15 | — | — | Present |
| Chemical liquid 33 | PP | 200 | IEX | 15 | — | — | Present |

TABLE 1 (2-2)-continued

|  | BU-1 | | BU-2 | | BU-3 | | |
|---|---|---|---|---|---|---|---|
|  | Material component | Pore size (nm) | Material component | Pore size (nm) | Material component | Pore size (nm) | Tank TU-1 |
| Chemical liquid 34 | PP | 200 | IEX | 15 | — | — | Present |
| Chemical liquid 35 | PP | 200 | IEX | 15 | — | — | Present |
| Chemical liquid 36 | PP | 200 | IEX | 15 | — | — | Present |
| Chemical liquid 37 | PP | 200 | IEX | 15 | — | — | Present |
| Chemical liquid 38 | — | — | — | — | — | — | — |
| Chemical liquid 39 | PP | 200 | IEX | 15 | — | — | Present |
| Chemical liquid 40 | PP | 20 | PFSA/PTFE | 200 | — | — | Present |
| Chemical liquid 41 | PP | 20 | PFSA/PTFE | 200 | — | — | Present |
| Chemical liquid 42 | PP | 20 | PFSA/PTFE blend | 200 | — | — | Present |
| Chemical liquid 43 | PP | 200 | IEX | 15 | — | — | Present |
| Chemical liquid 44 | PP | 200 | IEX | 15 | — | — | Present |
| Chemical liquid 45 | PP | 200 | IEX | 15 | — | — | Present |
| Chemical liquid 46 | PP | 200 | IEX | 15 | — | — | Present |
| Chemical liquid 47 | — | — | — | — | — | — | Present |
| Chemical liquid 48 | PTFE | 7 | UPE | 5 | — | — | Present |

TABLE 1 (2-3)

|  | F-A | | | BD-1 | | BD-2 | |
|---|---|---|---|---|---|---|---|
|  | Material component | Pore size (nm) | CWST ($10^{-5}$ N/cm) | Material component | Pore size (nm) | Material component | Pore size (nm) |
| Chemical liquid 31 | PFSA/PTFE | 20 | 35 | Nylon | 10 | UPE | 3 |
| Chemical liquid 32 | PFSA/PTFE | 20 | 35 | Nylon | 10 | UPE | 3 |
| Chemical liquid 33 | PFSA/PTFE | 20 | 35 | Nylon | 10 | UPE | 3 |
| Chemical liquid 34 | PFSA/PTFE | 20 | 35 | Nylon | 10 | UPE | 3 |
| Chemical liquid 35 | PFSA/PTFE | 20 | 35 | Nylon | 10 | UPE | 3 |
| Chemical liquid 36 | PFSA/PTFE | 20 | 35 | Nylon | 10 | UPE | 3 |
| Chemical liquid 37 | PFSA/PTFE | 20 | 35 | Nylon | 10 | UPE | 3 |
| Chemical liquid 38 | PFSA/PTFE | 20 | 35 | — | — | — | — |
| Chemical liquid 39 | PFSA/PTFE blend | 20 | 33 | Nylon | 10 | UPE | 3 |
| Chemical liquid 40 | PFSA/PTFE | 20 | 35 | Nylon | 10 | UPE | 3 |
| Chemical liquid 41 | PFSA/PTFE blend | 20 | 33 | Nylon | 10 | UPE | 3 |
| Chemical liquid 42 | PFSA/PTFE blend | 20 | 35 | Nylon | 10 | UPE | 3 |
| Chemical liquid 43 | PFSA/PTFE | 20 | 29 | Nylon | 10 | UPE | 3 |
| Chemical liquid 44 | PFSA/PTFE | 20 | 35 | Nylon | 150 | UPE | 200 |
| Chemical liquid 45 | PFSA/PTFE | 20 | 35 | Nylon | 150 | UPE | 3 |
| Chemical liquid 46 | PFSA/PTFE | 20 | 35 | Nylon | 10 | UPE | 200 |
| Chemical liquid 47 | PFSA/PTFE | 20 | 35 | Nylon | 10 | UPE | 3 |

TABLE 1 (2-3)-continued

|  | F-A | | | BD-1 | | BD-2 | |
| --- | --- | --- | --- | --- | --- | --- | --- |
|  | Material component | Pore size (nm) | CWST ($10^{-5}$ N/cm) | Material component | Pore size (nm) | Material component | Pore size (nm) |
| Chemical liquid 48 | PFSA/PTFE | 20 | 35 | Nylon | 10 | UPE | 3 |

TABLE 1 (2-4)

|  |  | Evaluation 1 | | Evaluation 2 | | | | |
| --- | --- | --- | --- | --- | --- | --- | --- | --- |
|  | Tank TD-1 | Residue defect inhibition performance | Stain-like defect inhibition performance | Bridge defect inhibition performance | Evaluation 3 Pattern width uniformity | Evaluation 4 Pot life | Evaluation 5 Production cost |
| Chemical liquid 31 | Present | AA | AA | AA | AA | AA | A |
| Chemical liquid 32 | Present | AA | AA | AA | AA | A | A |
| Chemical liquid 33 | Present | AA | AA | AA | AA | AA | A |
| Chemical liquid 34 | Present | AA | AA | AA | AA | AA | A |
| Chemical liquid 35 | Present | AA | AA | AA | AA | AA | A |
| Chemical liquid 36 | Present | AA | AA | AA | AA | AA | A |
| Chemical liquid 37 | Present | AA | AA | AA | AA | AA | A |
| Chemical liquid 38 | — | E | E | E | E | Standard | C |
| Chemical liquid 39 | Present | AA | AA | AA | AA | AA | A |
| Chemical liquid 40 | Present | A | AA | AA | AA | A | C |
| Chemical liquid 41 | Present | A | AA | AA | AA | A | C |
| Chemical liquid 42 | Present | A | AA | AA | AA | A | C |
| Chemical liquid 43 | Present | AA | AA | AA | A | AA | A |
| Chemical liquid 44 | Present | C | A | A | A | AA | A |
| Chemical liquid 45 | Present | A | A | AA | A | AA | A |
| Chemical liquid 46 | Present | B | A | B | A | AA | A |
| Chemical liquid 47 | Present | C | A | A | A | C | C |
| Chemical liquid 48 | Present | A | AA | AA | AA | AA | C |

Table 1 is divided into a first group: Table 1 (1-1) to Table 1 (1-4) and a second group: Table 1 (2-1) to Table 1 (2-4).

In the corresponding lines of four tables of each group subdivided from Table 1, the filters included in the filtering device (or the purification device) used for the purifying each chemical liquid and the evaluation results of the obtained chemical liquid are described.

For example, in the first line in Table 1 (1-1) to Table 1 (1-4) as a first group of Table 1, the chemical liquid 1 is described.

The first line shows that the chemical liquid 1 was manufactured by the purification device described in FIG. 14, and the liquid to be purified used for manufacturing the chemical liquid 1 contained CHN (cyclohexanone). In addition, the first line shows that the filter of the purification device used for manufacturing the chemical liquid 1 was washed in advance under the condition of "PGMEA 1 day immersion". Furthermore, the first line shows that the purification device has a duplex distiller, BU-1 (PP-containing filter having a pore size of 200 nm disposed on the uppermost stream side of the flow path), BU-2 (IEX filter having a pore size of 15 nm disposed on the downstream side of BU-1), a tank TU-1 disposed on the upstream side of the filter A (F-A), a PFSA/PTFE filter having a pore size of 20 nm as F-A (filter A), CWST thereof is $35 \times 10^{-5}$ N/cm, BD-1 (nylon-containing filter having a pore size of 10 nm) and BD-2 (UPE-containing filter having a pore size of 3 nm) arranged on the downstream side of the filter F-A, and a tank TD-1 disposed on the downstream side of the filter F-A.

The first line also shows that for the chemical liquid 1, the residue defect inhibition performance was AA, the stain-like defect inhibition performance was AA, the bridge defect inhibition performance was AA, the pattern width uniformity was AA, the pot life of the filter of the purification device was AA, and the production cost was A.

Likewise, for the chemical liquids 2 to 30, the results are described in the tables of the first group, and for the chemical liquids 31 to 48, the results are described in the tables of the second group.

TABLE 2 (1-1)

| | Purification device (or filtering device) | Liquid to be purified | | Pre-washing of filter | Distiller |
|---|---|---|---|---|---|
| | | Type | pH | | |
| Chemical liquid 50 | FIG. 28 | SPM (4:1) | Equal to or lower than 1.0 | PGMEA 1 day immersion | Absent |
| Chemical liquid 51 | FIG. 28 | 85% Phosphoric acid | Equal to or lower than 1.0 | PGMEA 1 day immersion | Absent |
| Chemical liquid 52 | FIG. 29 | SPM (4:1) | Equal to or lower than 1.0 | PGMEA 1 day immersion | Absent |
| Chemical liquid 53 | FIG. 29 | 85% Phosphoric acid | Equal to or lower than 1.0 | PGMEA 1 day immersion | Absent |
| Chemical liquid 54 | FIG. 28 | TMAH | 11.5 | PGMEA 1 day immersion | Absent |

TABLE 2 (1-2)

| | BU-1 | | BU-2 | | F-A | | | BD-1 | |
|---|---|---|---|---|---|---|---|---|---|
| | Material component | Pore size (nm) | Material component | Pore size (nm) | Material component | Pore size (nm) | CWST ($10^{-5}$ N/cm) | Material component | Pore size (nm) |
| Chemical liquid 50 | PTFE | 200 | PTFE | 20 | PFSA/PTFE | 20 | 35 | PTFE | 10 |
| Chemical liquid 51 | PTFE | 200 | PTFE | 20 | PFSA/PTFE | 20 | 35 | PTFE | 10 |
| Chemical liquid 52 | — | — | — | — | PFSA/PTFE | 20 | 35 | — | — |
| Chemical liquid 53 | — | — | — | — | PFSA/PTFE | 20 | 35 | — | — |
| Chemical liquid 54 | PTFE | 200 | PTFE | 20 | PFSA/PTFE | 20 | 35 | PTFE | 10 |

TABLE 2 (1-3)

| | BD-2 | | Evaluation 1 | | | |
|---|---|---|---|---|---|---|
| | Material component | Pore size (nm) | Number of residue defects (number/wafer) | Number of metal residue defects (number/wafer) | Ratio | Result |
| Chemical liquid 50 | PTFE | 10 | 2,932 | 36 | 1.2% | A |
| Chemical liquid 51 | PTFE | 10 | 5,129 | 103 | 2.0% | B |
| Chemical liquid 52 | — | — | 3,658 | 329 | 9.0% | E |
| Chemical liquid 53 | — | — | 8,064 | 518 | 6.4% | E |
| Chemical liquid 54 | PTFE | 10 | 3,822 | 116 | 3.0% | C |

Table 2 is divided into Table 2 (1-1) to Table 2 (1-3). In the corresponding lines of the tables subdivided from Table 2, the filtering devices used for purifying the chemical liquids and the obtained evaluation results of chemical liquids are described.

For example, in the first line of each of the subdivision tables, the chemical liquid 50 is described.

The first line shows that the chemical liquid 50 was manufactured by the filtering device illustrated in FIG. 28, and the liquid to be purified used for manufacturing the chemical liquid 50 was SPM (4:1). The first line also shows that the pH of SPM (4:1) was equal to or lower than 1.0. In addition, the first line shows that the filter of the filtering device used for manufacturing the chemical liquid 50 was washed in advance under the condition of "PGMEA 1 day immersion". Furthermore, the first line shows that the filtering device has BU-1 (a PTFE-containing filter having a pore size of 200 nm), BU-2 (a PTFE-containing filter having a pore size of 20 nm), a PFSA/PTFE filter (CWST: $35 \times 10^{-5}$ N/cm) having a pore size of 20 nm as F-A (filter A), and has BD-1 (a PTFE-containing filter having a pore size of 10 nm) and BD-2 (a PTFE-containing filter having a pore size of 10 nm) on the downstream side of F-A.

For the chemical liquid 50, the column of "Evaluation" shows that the number of residue defects was 2,932/wafer, of which the number of metal residue defects was 36/wafer, the ratio was 1.2%, and the chemical liquid 50 was evaluated as A.

Similarly, for the chemical liquids 51 to 54, the results are described in each of the tables of Table 2.

TABLE 3 (1-1)

| | Purification device (or filtering device) | Liquid to be purified | Pre-washing of filter | Distiller |
|---|---|---|---|---|
| Chemical liquid 60 | FIG. 30 | Resist resin composition 2 | PGMEA 1 day immersion | — |
| Chemical liquid 61 | FIG. 30 | Resist resin composition 2 | PGMEA 1 day immersion | — |
| Chemical liquid 62 | FIG. 30 | Resist resin composition 2 | PGMEA 1 day immersion | — |
| Chemical liquid 63 | FIG. 29 | Resist resin composition 2 | PGMEA 1 day immersion | — |

TABLE 3 (1-2)

| | BU-1 | | BU-2 | | BU-3 | | F-A | | |
|---|---|---|---|---|---|---|---|---|---|
| | Material component | Pore size (nm) | Material component | Pore size (nm) | Material component | Pore size (nm) | Material component | Pore size (nm) | CWST ($10^{-5}$ N/cm) |
| Chemical liquid 60 | PTFE | 20 | UPE | 2 | Nylon | 10 | PFSA/PTFE | 20 | 35 |
| Chemical liquid 61 | PTFE | 20 | Nylon | 10 | UPE | 2 | PFSA/PTFE | 20 | 35 |
| Chemical liquid 62 | PTFE | 20 | UPE | 2 | Nylon | 10 | PFSA/PTFE | 20 | 35 |
| Chemical liquid 63 | — | — | — | — | — | — | PFSA/PTFE | 20 | 35 |

TABLE 3 (1-3)

| | BD-1 Material component | Pore size (nm) | Content of metal components (ppb by mass) | | | | | | Evaluation 1 |
|---|---|---|---|---|---|---|---|---|---|
| | | | Mg | Ca | Cr | Fe | Ni | Total amount of metal components | Scum defect inhibition performance |
| Chemical liquid 60 | UPE | 2 | 0.09 | 0.37 | <0.01 | 0.15 | <0.01 | 0.61 | AA |
| Chemical liquid 61 | UPE | 2 | 0.12 | 0.49 | 0.04 | 0.19 | 0.03 | 0.87 | AA |
| Chemical liquid 62 | PTFE | 10 | 0.23 | 0.64 | 0.05 | 0.25 | 0.04 | 1.21 | B |
| Chemical liquid 63 | — | — | 0.29 | 0.86 | <0.01 | 0.38 | <0.01 | 1.53 | E |

Table 3 is divided into Table 3 (1-1) to Table 3 (1-3). In the corresponding lines of the tables subdivided from Table 3, the filtering devices used for purifying the chemical liquids and the obtained evaluation results of chemical liquids are described.

For example, in the first line of each of the subdivision tables, the chemical liquid 60 is described.

The first line shows that the chemical liquid 60 was manufactured by the filtering device illustrated in FIG. 30, and the liquid to be purified used for manufacturing the chemical liquid 60 was the resist resin composition 2. In addition, the first line shows that the filter of the filtering device used for manufacturing the chemical liquid 60 was washed in advance under the condition of "PGMEA 1 day immersion". Furthermore, the first line shows that the filtering device has BU-1 (a PTFE-containing filter having a pore size of 20 nm), BU-2 (a UPE-containing filter having a pore size of 2 nm), BU-3 (a Nylon-containing filter having a pore size of 10 nm), and a PFSA/PTFE filter (CWST: $35 \times 10^{-5}$ N/cm) having a pore size of 20 nm as F-A (filter A), and has BD-1 (a UPE-containing filter having a pore size of 2 nm) on the downstream side of F-A.

The first line shows that the content of Mg in the chemical liquid 60 was 0.09 ppb by mass with respect to the total mass of the chemical liquid, the content of Ca in the chemical liquid 60 was 0.37 ppb by mass with respect to the total mass of the chemical liquid, the content of Cr in the chemical liquid 60 was less than the detection limit, the content of Fe in the chemical liquid 60 was 0.15 ppb by mass with respect to the total mass of the chemical liquid, the content of Ni in the chemical liquid 60 was less than the detection limit, and the total content of metal components in the chemical liquid 60 was 0.61 ppb by mass with respect to the total mass of the chemical liquid.

Furthermore, the first line shows that the scum defect inhibition performance of the chemical liquid 60 was AA.

As is evident from the results described in Tables 1 to 3, the chemical liquids 1 to 37, the chemical liquids 39 to 48, the chemical liquids 50 and 51, the chemical liquid 54, and the chemical liquids 60 to 62 manufactured using the filtering device (or purification device) according to an embodiment of the present invention had excellent defect inhibition performance required according to the type of the chemical liquids (a prewet solution, a developer, a rinsing solution, a peeling solution, a resist resin composition, and the like). In contrast, the chemical liquid 38, the chemical liquids 52 and 53, the chemical liquid 104, and the chemical liquid 63 manufactured using the filtering device (or purification device) according to the conventional technique did not have the desired defect inhibition performance.

Moreover, compared to the chemical liquid 3, the chemical liquid 1, which was manufactured using the filtering device (purification device including the filtering device) having the filter B including the filter BD disposed on the downstream side of the filter A, had better residue defect inhibition performance and better bridge defect inhibition performance and resulted in better pattern width uniformity.

Compared to the chemical liquid 44, the chemical liquid 45, which was manufactured using the filtering device (purification device including the filtering device) with the filter BD including a filter having a pore size equal to or smaller than 20 nm, had better residue defect inhibition performance and better bridge defect inhibition performance.

Compared to the chemical liquid 7, the chemical liquid 1, which was manufactured using the filtering device (purification device including the filtering device) having the filter BD that was disposed on the downmost stream side and had a pore size equal to or smaller than 10 nm, had better defect inhibition performance and better bridge defect inhibition performance and resulted in better pattern width uniformity. Compared to the chemical liquid 46, the chemical liquid 1 had better residue defect inhibition performance, better stain-like defect inhibition performance, and better bridge defect inhibition performance and resulted in better pattern width uniformity.

Compared to the chemical liquid 14, the chemical liquid 1, which was manufactured using the filtering device (purification device including the filtering device) having a return flow path capable of returning the liquid to be purified to the upstream side of a reference filter consisting of any of the filters BD each described as "at least one filter BD" from the downstream side of the reference filter, had better residue defect inhibition performance and better bridge defect inhibition performance and resulted in better pattern width uniformity.

In addition, compared to the chemical liquid 47, the chemical liquid 1, which was manufactured using the filtering device (purification device including the filtering device) having the filter B including the filter BU disposed on the upstream side of the filter A on the flow path, had better residue defect inhibition performance, better stain-like defect inhibition performance, and better bridge defect inhibition performance and resulted in better pattern width uniformity.

Compared to the chemical liquid 48, the chemical liquid 1 manufactured using the filtering device (purification device including the filtering device), in which at least one of the filters BU had a pore size equal to or greater than 10 nm, had better residue defect inhibition performance. The filtering device (purification device including the filtering device) used for manufacturing the chemical liquid 1 incurred lower production cost (had better productivity) compared to the filtering device (purification device including the filtering device) used for manufacturing the chemical liquid 48.

The filtering device (purification device including the filtering device) used for manufacturing the chemical liquid 1, in which at least one filter BU had a pore size equal to or greater than 20 nm, incurred lower production cost (had better productivity) compared to the filtering device used for manufacturing the chemical liquid 2 and the chemical liquid 6.

Compared to the chemical liquid 12, the chemical liquid 1, which was manufactured using the filtering device (purification device including the filtering device) having the filter BU containing a resin having an ion exchange group, had better residue defect inhibition performance and better bridge defect inhibition performance and resulted in better pattern width uniformity. Compared to the filtering device (purification device including the filtering device) used for manufacturing the chemical liquid 12, the filtering device (purification device including the filtering device) used for manufacturing the chemical liquid 1 had a longer pot life of filters and incurred lower production cost (had better productivity).

Compared to the chemical liquid 48, the chemical liquid 1 manufactured using the filtering device (purification device including the filtering device) having a filter, which was arranged in series with a tank on the upstream side of the flow path relative to the tank and had a pore size equal to or greater than 10 nm, had better residue defect inhibition performance. Compared to the filtering device (purification device including the filtering device) used for manufacturing the chemical liquid 48, the filtering device (purification device including the filtering device) used for manufacturing the chemical liquid 1 incurred lower production cost (had better productivity).

Compared to the chemical liquid 54, the chemical liquid 50, which was obtained by purifying the liquid to be purified having a pH in a range of 0 to 9, had better defect inhibition performance. This shows that the filtering device according to an embodiment of the present invention is more effective for purifying the liquid to be purified having a pH in a range of 0 to 9.

EXPLANATION OF REFERENCES 100, 200, 300, 400, 500, 600, 700, 800, 900, 1000: filtering device
101: inlet portion
102: outlet portion
103, 104, 201, 601, 104-1, 104-2: filter
105, 202, 301, 302, 402, 501, 502, 602, 701, 801, 802, 803, 804, 901, 1001, 1002, 1104, 1105, 1305: piping
401, 401(a), 401(b): tank
1100: manufacturing plant
1101: distillation device
1102, 1203, 1303, 1304: distiller
1103: portable tank
1106: transporting unit
1200, 1300: purification device
1201, 1301: second inlet portion
1202, 1302: second outlet portion

What is claimed is:
1. A filtering device for obtaining a chemical liquid by purifying a liquid to be purified, the device comprising:
an inlet portion;
an outlet portion;
a filter A;
at least one filter B different from the filter A;
a flow path which includes the filter A and the filter B arranged in series between the inlet portion and the outlet portion and extends from the inlet portion to the outlet portion, and
a tank arranged in series between the filter A and the filter B on the flow path,
wherein the filter A includes at least one selected from the group consisting of a first porous membrane having a porous base material made of polytetrafluoroethylene and a non-crosslinked coating which is formed to cover the porous base material and contains a perfluorosulfonic acid polymer and a second porous membrane containing polytetrafluoroethylene blended with a perfluorosulfonic acid polymer,
the filter B includes at least one filter BU disposed on an upstream side of the filter A on the flow path, and
the filter BU contains a resin having an anion exchange group.
2. The filtering device according to claim 1,
wherein the filter B includes at least one filter BD disposed on a downstream side of the filter A on the flow path.
3. The filtering device according to claim 2,
wherein the at least one filter BD has a pore size equal to or smaller than 20 nm.
4. The filtering device according to claim 1, further comprising:
a filter C having a pore size equal to or greater than 10 nm that is arranged in series with the tank on an upstream side of the tank in the flow path.

5. The filtering device according to claim 1, further comprising:
- a filter C which is arranged in series with the tank on the upstream side of the tank in the flow path and has a pore size equal to or greater than 20 nm.

6. A filtering device for obtaining a chemical liquid by purifying a liquid to be purified, the device comprising:
- an inlet portion;
- an outlet portion;
- a filter A;
- at least one filter B different from the filter A;
- a flow path which includes the filter A and the filter B arranged in series between the inlet portion and the outlet portion and extends from the inlet portion to the outlet portion, and
- a tank arranged in series between the filter A and the filter B on the flow path,
- wherein the filter A includes at least one selected from the group consisting of a first porous membrane having a porous base material made of polytetrafluoroethylene and a non-crosslinked coating which is formed to cover the porous base material and contains a perfluorosulfonic acid polymer and a second porous membrane containing polytetrafluoroethylene blended with a perfluorosulfonic acid polymer, and
- a pH of the liquid to be purified is 0 to 9.

\* \* \* \* \*